(12) United States Patent
Tsuji et al.

(10) Patent No.: US 11,340,350 B2
(45) Date of Patent: *May 24, 2022

(54) CONTROL CIRCUIT OF LIGHT EMITTING AND RECEIVING DEVICE

(71) Applicant: ROHM CO., LTD., Kyoto (JP)

(72) Inventors: Yuji Tsuji, Kyoto (JP); Okimoto Kondo, Kyoto (JP); Tatsuro Shimizu, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/145,784

(22) Filed: Jan. 11, 2021

(65) Prior Publication Data
US 2021/0132224 A1 May 6, 2021

Related U.S. Application Data

(63) Continuation of application No. 16/258,981, filed on Jan. 28, 2019, now Pat. No. 10,921,447.

(30) Foreign Application Priority Data

Jan. 29, 2018 (JP) .............................. JP2018-012701
Dec. 26, 2018 (JP) .............................. JP2018-242728
Jan. 25, 2019 (JP) .............................. JP2019-011562

(51) Int. Cl.
G01S 17/02 (2020.01)
G01S 17/06 (2006.01)
(Continued)

(52) U.S. Cl.
CPC ............. *G01S 17/04* (2020.01); *G01S 7/4811* (2013.01); *G01S 17/06* (2013.01);
(Continued)

(58) Field of Classification Search
CPC .......... G01S 17/04; G01S 17/06; G01S 17/46; G01S 17/48; G01S 7/4811; G01S 7/4813;
(Continued)

(56) References Cited

U.S. PATENT DOCUMENTS 4,789,777 A 12/1988 Takami et al.
6,625,398 B1 9/2003 Nonaka
(Continued)

FOREIGN PATENT DOCUMENTS

JP 2010045108 A 2/2010

OTHER PUBLICATIONS

USPTO Non-Final Office Action in U.S. Appl. No. 16/258,981; dated Jun. 24, 2020.

*Primary Examiner* — John R Lee
(74) *Attorney, Agent, or Firm* — Cantor Colburn LLP

(57) ABSTRACT

A light emitting and receiving device includes: a light emitting element, a first light receiving element, and a second light receiving element. A reference signal generator generates a reference signal including a component of a predetermined reference frequency. A drive circuit supplies a drive signal to the light emitting element so that a feedback signal corresponding to an output of the first light receiving element matches a reference signal. A correlation detector detects an output of the second light receiving element by correlating with the component of the reference frequency.

17 Claims, 39 Drawing Sheets

(51) Int. Cl.
   *G01S 7/481*   (2006.01)
   *H01L 27/146*  (2006.01)
   *H04N 5/3745*  (2011.01)
   *G01S 17/04*   (2020.01)

(52) U.S. Cl.
   CPC .. *H01L 27/14623* (2013.01); *H01L 27/14629* (2013.01); *H01L 27/14634* (2013.01); *H01L 27/14636* (2013.01); *H04N 5/37455* (2013.01)

(58) Field of Classification Search
   CPC ............ H01L 27/146; H01L 27/14623; H01L 27/14601; H01L 27/14629; H01L 27/14625; H01L 27/14634; H01L 27/14636; H04N 5/37455; H04N 5/374
   See application file for complete search history.

(56) References Cited

U.S. PATENT DOCUMENTS

| | | |
|---|---|---|
| 10,921,447 B2* | 2/2021 | Tsuji ................. H01L 27/14629 |
| 2006/0139206 A1 | 6/2006 | Nagasaku et al. |
| 2009/0001253 A1 | 1/2009 | Blaut et al. |
| 2013/0308134 A1 | 11/2013 | Hirokubo |
| 2018/0031676 A1 | 2/2018 | Sadhu |
| 2018/0033818 A1 | 2/2018 | Lin et al. |
| 2018/0074272 A1 | 3/2018 | Sherrer |
| 2018/0088217 A1 | 3/2018 | Kawasaki et al. |
| 2018/0203562 A1 | 7/2018 | An et al. |
| 2019/0182415 A1 | 6/2019 | Sivan |
| 2019/0235078 A1 | 8/2019 | Tsuji et al. |
| 2019/0259917 A1 | 8/2019 | Yamanaka et al. |
| 2021/0132224 A1* | 5/2021 | Tsuji ....................... G01S 7/497 |

* cited by examiner

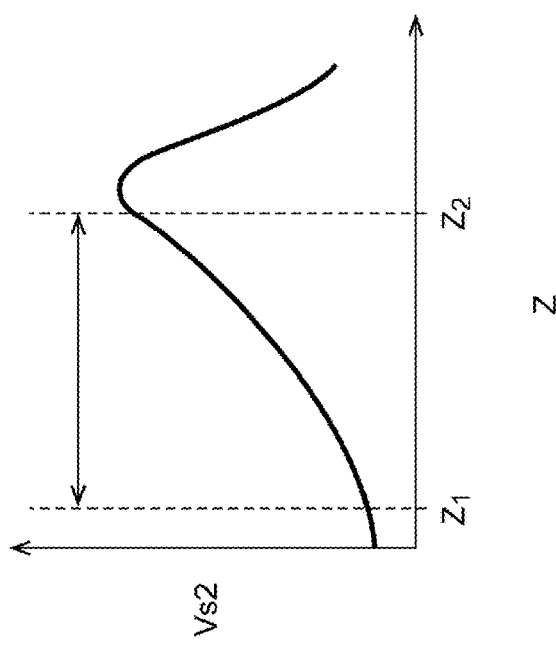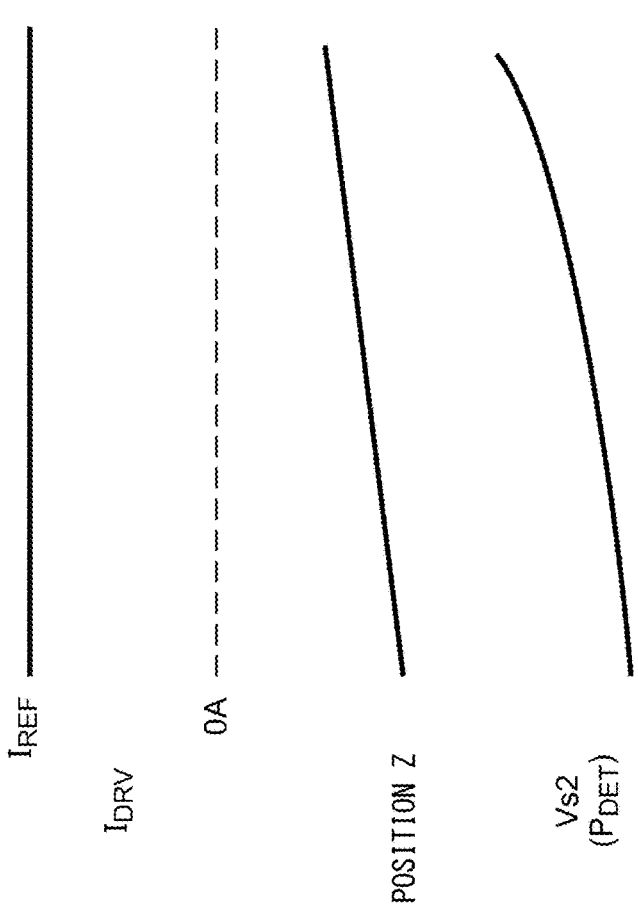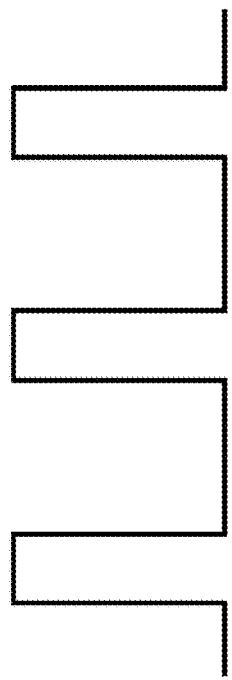
FIG. 42A
FIG. 42B
FIG. 42C

CONTROL CIRCUIT OF LIGHT EMITTING AND RECEIVING DEVICE

CROSS-REFERENCE TO RELATED APPLICATION

This application is a continuation of U.S. patent application Ser. No. 16/258,981 filed Jan. 28, 2019, the entire contents of which are incorporated herein by reference and priority to which is hereby claimed. The Ser. No. 16/258,981 application claimed benefit to the date of the earlier filed Japanese Patents: Application No. JP2018-012701, filed on Jan. 29, 2018, Application No. JP2018-242728, filed on Dec. 26, 2018 and Application No. JP2019-011562, filed on Jan. 25, 2019, the entire content of which are also incorporated herein by reference.

BACKGROUND OF THE INVENTION

1. Field of the Invention

The present disclosure relates to a light emitting and receiving device and a control thereof.

2. Description of the Related Art

For example, a light emitting and receiving device called a photo reflector is used in order to detect an object approaching an electronic device or the like. Patent Document 1 (Japanese Patent Application (Laid Open) No. 2010-45108) discloses an example of a conventional light emitting and receiving device. The light emitting and receiving device disclosed in the same document includes a substrate, a light emitting element and a light receiving element which are mounted on the substrate, and a sealing resin which covers the light emitting element and the light receiving element. Light emitted from the light emitting element is transmitted through the sealing resin. When the light emitted from the light emitting element is reflected by an object, the reflected light is received by the light receiving element. Accordingly, it is possible to detect whether an object approaches.

It is desirable that the light emitting and receiving device have a more accurate detection function by preventing, for example, an influence of external light.

SUMMARY OF THE INVENTION

The present disclosure has been made in view of the above-described circumstances and a general purpose thereof is to provide a light emitting and receiving device capable of realizing a more accurate detection function.

An embodiment of the invention relates to a control circuit of a light emitting and receiving device including a light emitting element, a first light receiving element, and a second light receiving element. The control circuit includes a reference signal generator structured to generate a reference signal including a component of a predetermined reference frequency, a drive circuit structured to supply a drive signal to the light emitting element so that a feedback signal corresponding to an output of the first light receiving element matches the reference signal, and a detection circuit structured to detect an output of the second light receiving element by correlating with a component of the reference frequency.

The light emitting and receiving device which is provided by the present disclosure includes a base material, a conductive portion formed on the base material, a first element mounted on the base material and structured to emit light, a second element mounted on the base material and structured to receive light emitted from the first element, and a sealing resin structured to cover the first element and the second element, light emitted from the first element being transmitted through the sealing resin, in which the first element and the second element are disposed to be separated from each other in a first direction perpendicular to a thickness direction of the base material, and in which the light emitting and receiving device includes a third element disposed at the side opposite to the second element with the first element interposed therebetween in the first direction and structured to receive light from the first element and a light shielding layer formed in a coated portion overlapping the third element when viewed from the thickness direction in the sealing resin and formed of a material with transmittance for light lower than that of the sealing resin.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 42A is a diagram describing an operation of the position detection system of FIG. 41, FIG. 42B is a diagram illustrating a relationship between a position z and a second detection signal Vs2, and FIG. 42C is a diagram describing another operation of the position detection system of FIG. 41;

DETAILED DESCRIPTION OF THE INVENTION

Figure 1:
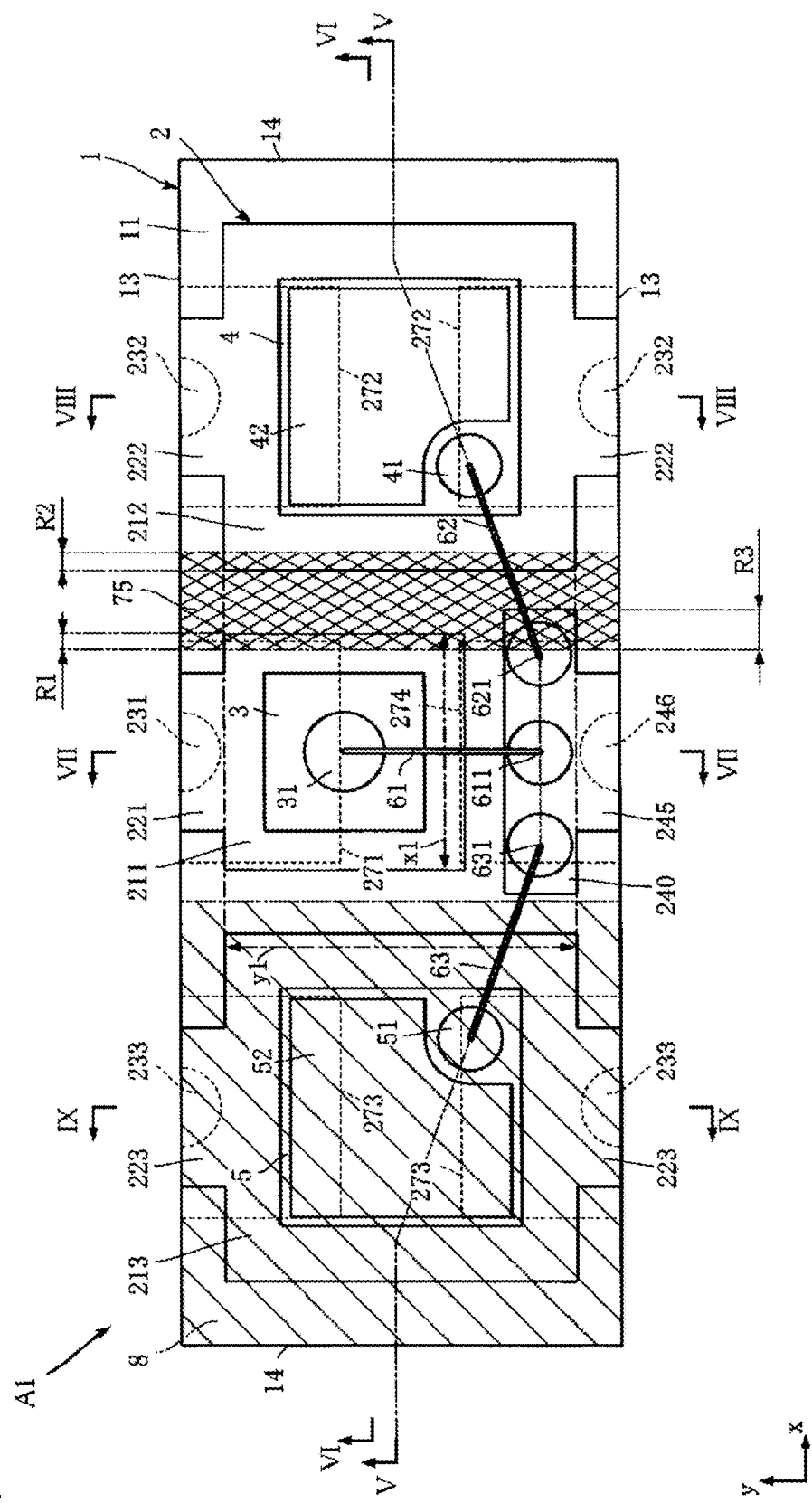
FIG. 1 is a main plan view illustrating a light emitting and receiving device according to a first embodiment of the present disclosure.

The invention will now be described based on preferred embodiments which do not intend to limit the scope of the present invention but exemplify the invention. All of the features and the combinations thereof described in the embodiment are not necessarily essential to the invention.

Hereinafter, preferred embodiments of the present disclosure will be described in detail with reference to the drawings.

In the present disclosure, the terms of "first", "second", "third", and the like are merely used as labels and are not intended to permutate those objects.

First Embodiment

FIG. 1 to FIG. 15 illustrate a light emitting and receiving device according to a first embodiment of the present disclosure. A light emitting and receiving device A1 of the embodiment includes a base material 1, a conductive portion 2, a first element 3, a second element 4, a third element 5, a first wire 61, a second wire 62, a third wire 63, a sealing resin 7, and a light shielding layer 8.

Figure 2:
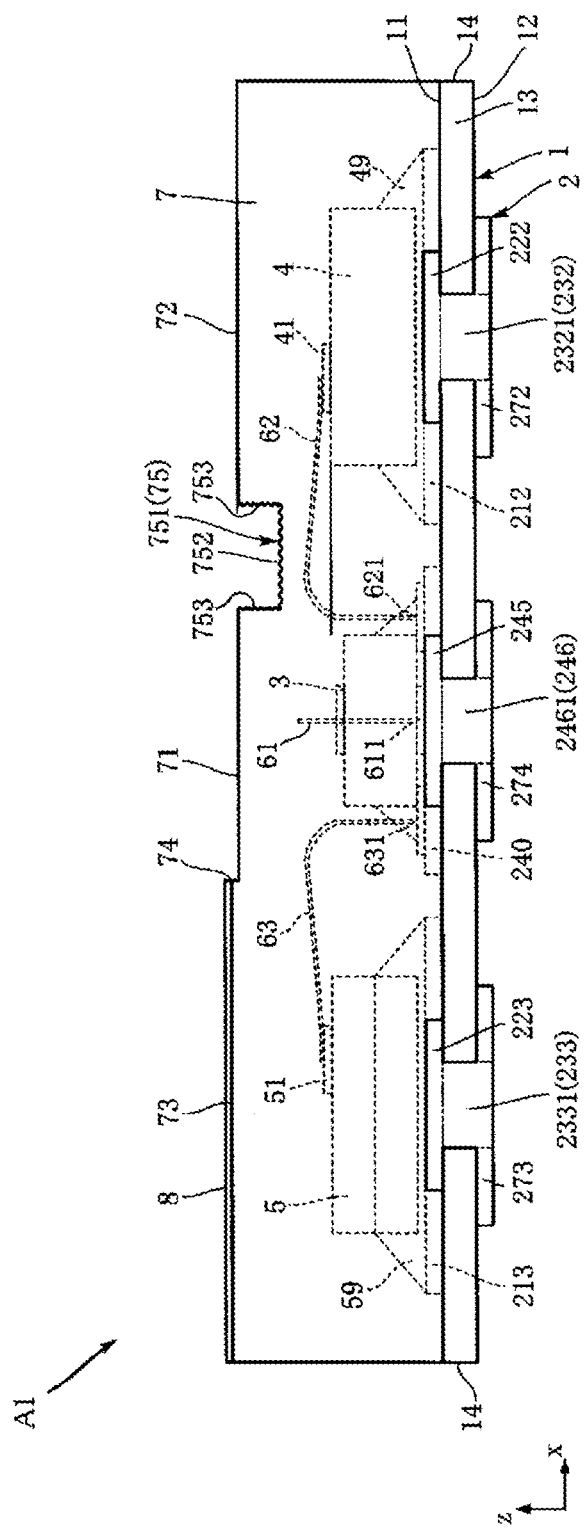
FIG. 2 is a front view illustrating the light emitting and receiving device according to the first embodiment of the present disclosure.
Figure 3:
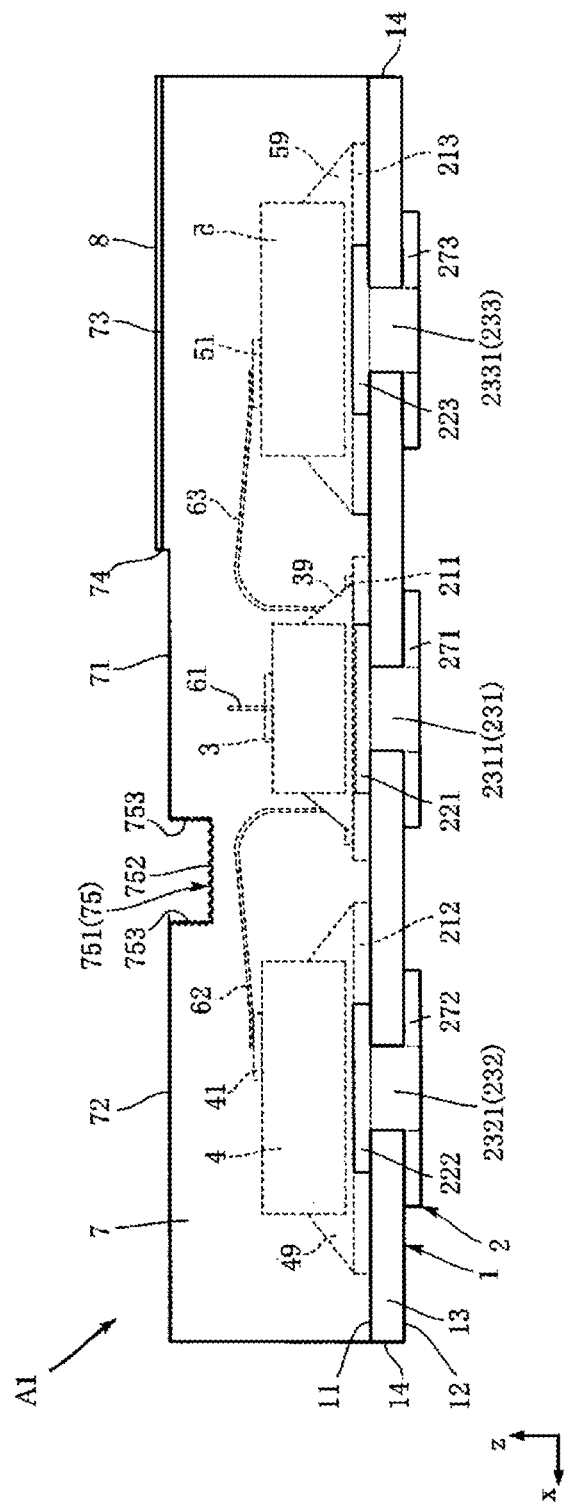
FIG. 3 is a rear view illustrating the light emitting and receiving device according to the first embodiment of the present disclosure.
Figure 4:
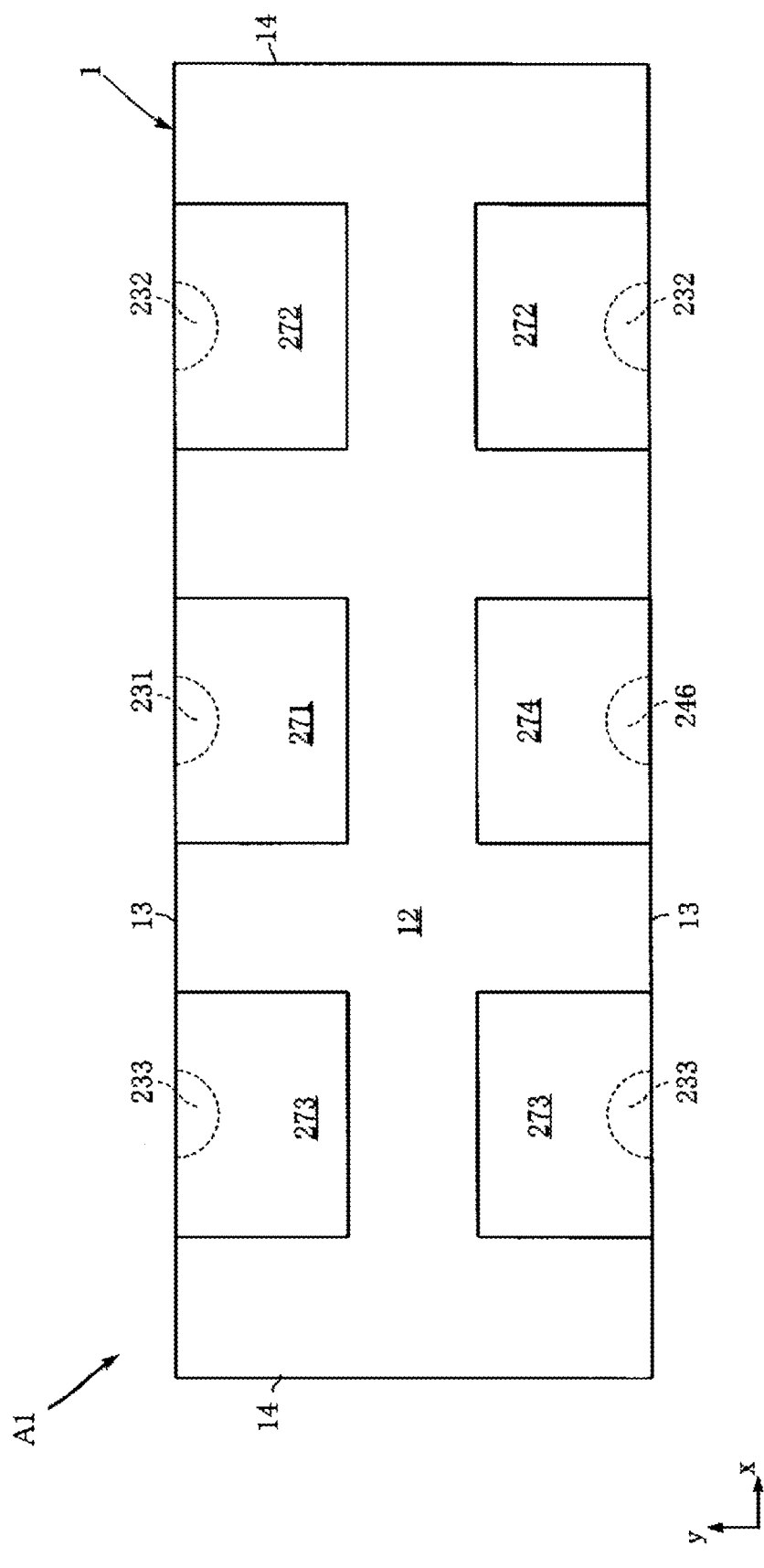
FIG. 4 is a bottom view and a circuit diagram illustrating the light emitting and receiving device according to the first embodiment of the present disclosure.
Figure 5:
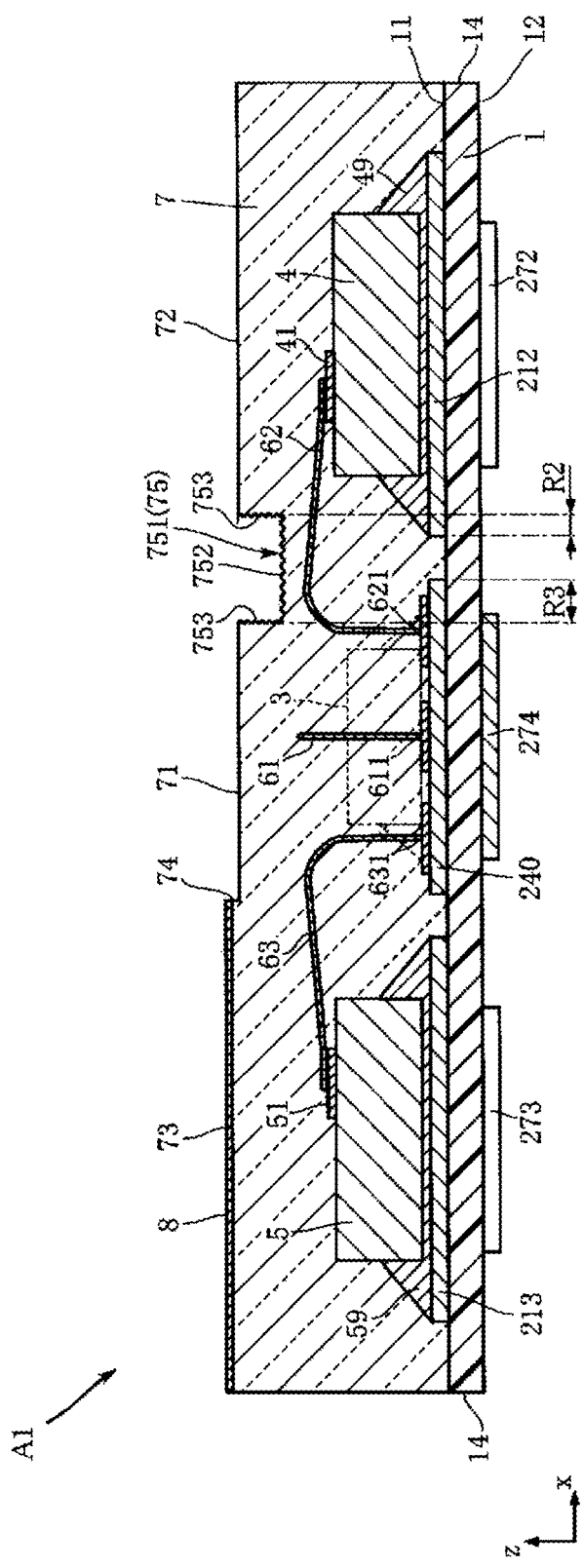
FIG. 5 is a cross-sectional view taken along a line V-V of FIG. 1.
Figure 6:
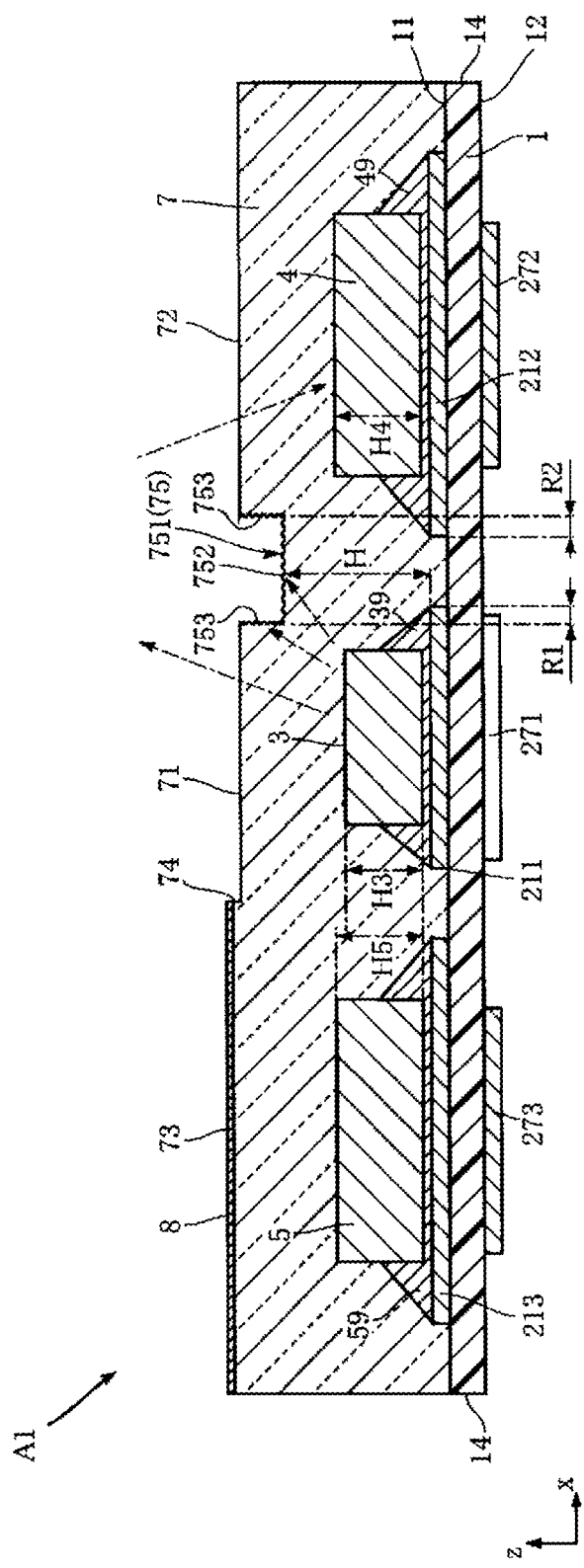
FIG. 6 is a cross-sectional view taken along a line VI-VI of FIG. 1.
Figure 7:
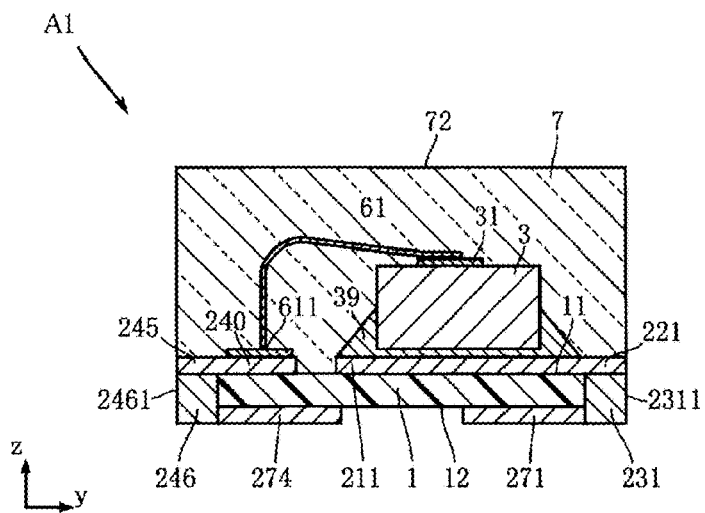
FIG. 7 is a cross-sectional view taken along a line VII-VII of FIG. 1.
Figure 8:
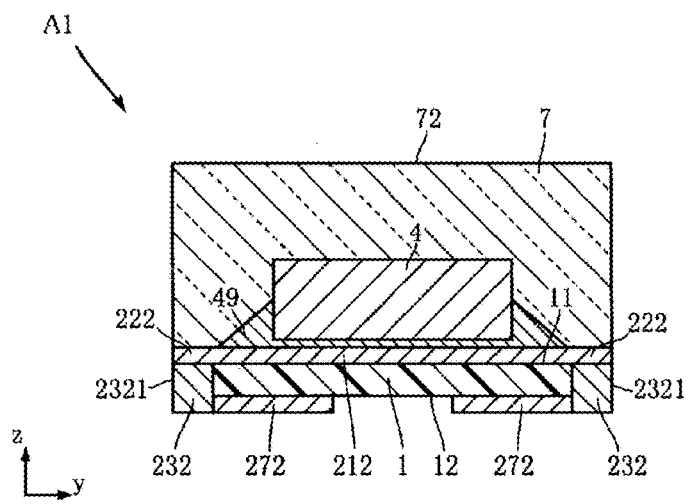
FIG. 8 is a cross-sectional view taken along a line VIII-VIII of FIG. 1.
Figure 9:
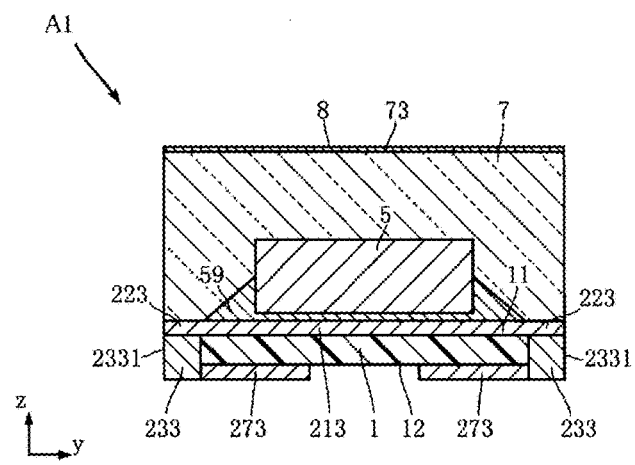
FIG. 9 is a cross-sectional view taken along a line IX-IX of FIG. 1.
Figure 10:
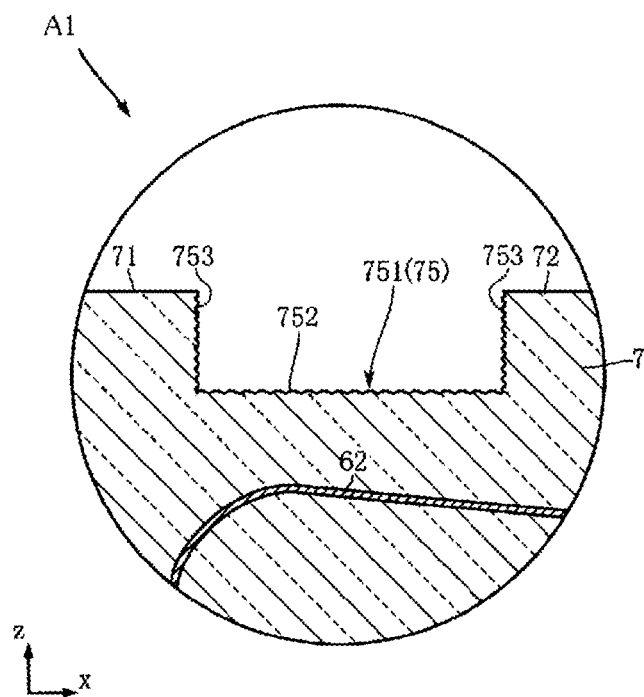
FIG. 10 is a main enlarged cross-sectional view illustrating the light emitting and receiving device according to the first embodiment of the present disclosure.
Figure 11:
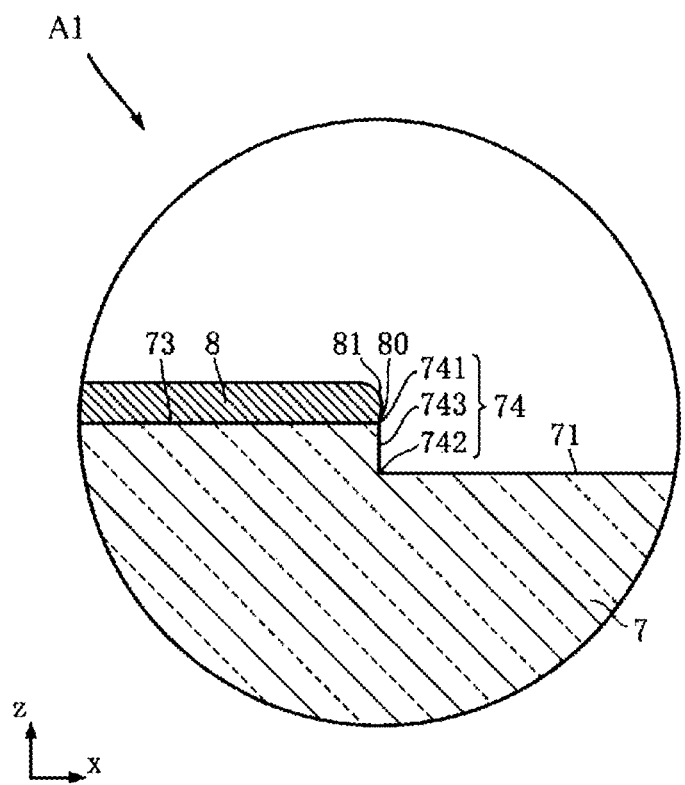
FIG. 11 is a main enlarged cross-sectional view illustrating the light emitting and receiving device according to the first embodiment of the present disclosure.
Figure 12:
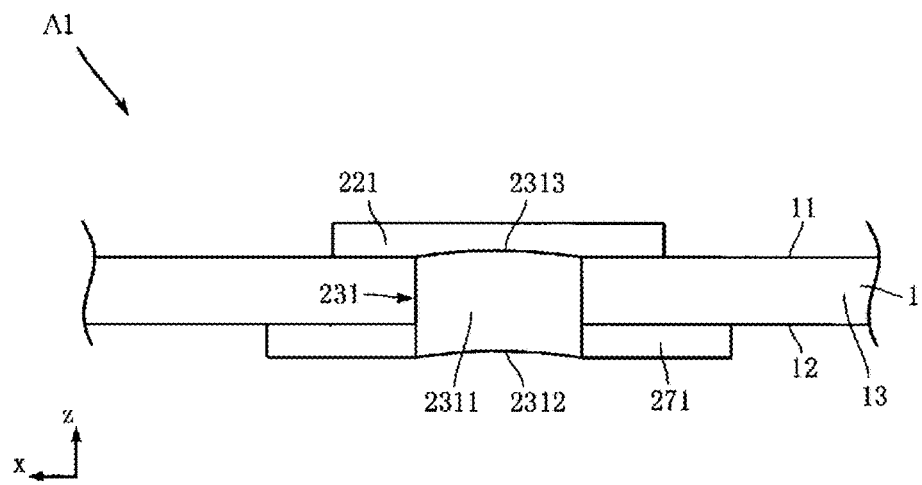
FIG. 12 is a main enlarged rear view illustrating the light emitting and receiving device according to the first embodiment of the present disclosure.
Figure 14:
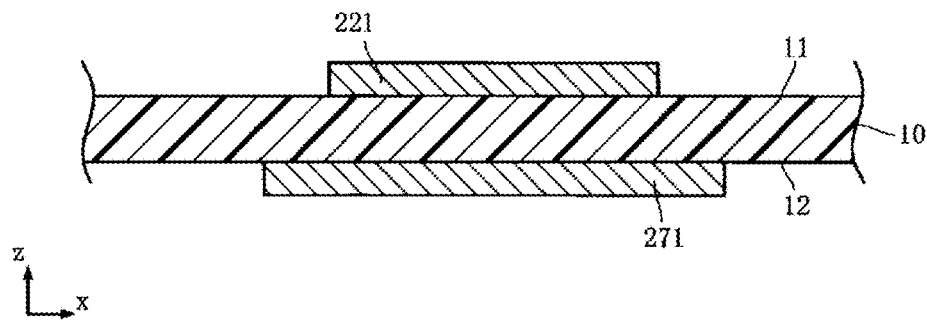
FIG. 14 is a main enlarged cross-sectional view illustrating an example of a method of manufacturing the light emitting and receiving device according to the first embodiment of the present disclosure.
Figure 15:
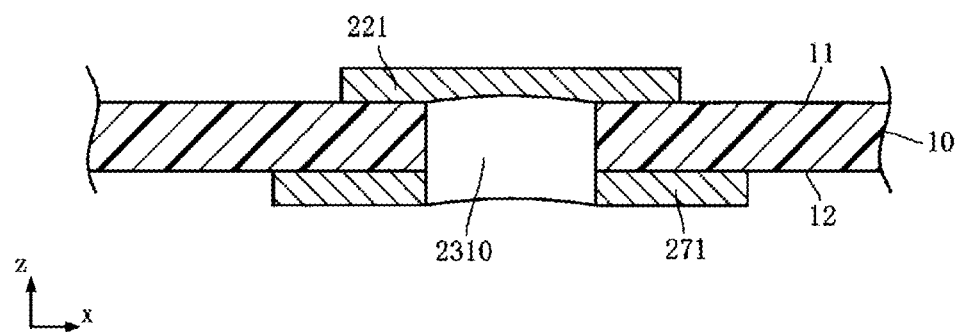
FIG. 15 is a main enlarged cross-sectional view illustrating an example of a method of manufacturing the light emitting and receiving device according to the first embodiment of the present disclosure.

FIG. 1 is a main plan view illustrating the light emitting and receiving device A1. FIG. 2 is a front view of the light emitting and receiving device A1. FIG. 3 is a rear view illustrating the light emitting and receiving device A1. FIG. 4 is a bottom view and a circuit diagram illustrating the light emitting and receiving device A1. FIG. 5 is a cross-sectional view taken along a line V-V of FIG. 1. FIG. 6 is a cross-sectional view taken along a line VI-VI of FIG. 1. FIG. 7 is a cross-sectional view taken along a line VII-VII of FIG. 1. FIG. 8 is a cross-sectional view taken along a line VIII-VIII of FIG. 1. FIG. 9 is a cross-sectional view taken along a line IX-IX of FIG. 1. FIG. 10 is a main enlarged cross-sectional view illustrating the light emitting and receiving device A1. FIG. 11 is a main enlarged cross-sectional view illustrating the light emitting and receiving device A1. FIG. 12 is a main enlarged rear view illustrating the light emitting and receiving device A1. FIG. 14 is a main enlarged cross-sectional view illustrating an example of a method of manufacturing the light emitting and receiving device A1. FIG. 15 is a main enlarged cross-sectional view illustrating an example of a method of manufacturing the light emitting and receiving device A1. In these drawings, the z direction is the thickness direction of the base material 1. The x direction is the first direction of the present disclosure. The y direction is a direction perpendicular to the x direction and the z direction. Further, in FIG. 1, the sealing resin 7 is omitted for convenience of comprehension and a second portion 75 to be described later is indicated by imaginary lines and hatching. Further, the light shielding layer 8 is indicated by hatching.

The size of the light emitting and receiving device A1 is not particularly limited. When the size of the light emitting and receiving device A1 is exemplified, the x-direction dimension is 1.3 mm to 3.5 mm, the y-direction dimension is 0.4 mm to 2.0 mm, and the z-direction dimension is 0.2 mm to 0.8 mm. In the example illustrated in the drawing, for example, the x-direction dimension is 1.5 mm, the y-direction dimension is 0.55 mm, and the z-direction dimension is 0.3 mm.

The base material 1 supports the first element 3, the second element 4, and the third element 5. The material of the base material 1 is not particularly limited and, for example, an insulation material such as glass epoxy resin may be used. In the embodiment, the base material 1 is an elongated rectangular shape of which the x direction is set as the longitudinal direction and the y direction is set as the transverse direction when viewed from the z direction. The thickness of the base material 1 is, for example, 40 μm to 50 μm.

The base material 1 includes a main surface 11, a rear surface 12, a pair of side surfaces 13, and a pair of end surfaces 14. The main surface 11 is a surface which faces the z direction and on which the first element 3, the second element 4, and the third element 5 are mounted. The rear surface 12 faces the opposite side to the main surface 11 in the z direction. In the embodiment, the rear surface 12 is used as a mounting surface when the light emitting and receiving device A1 is mounted on a circuit board or the like. The pair of side surfaces 13 respectively faces both sides in the y direction and is respectively connected to the main surface 11 and the rear surface 12. The pair of end surfaces 14 respectively faces both sides in the x direction and is respectively connected to the main surface 11 and the rear surface 12.

The conductive portion 2 is formed on the base material 1 and forms a conductive path to the first element 3, the second element 4, and the third element 5. The material of the conductive portion 2 is not particularly limited, metal having a satisfactory conductive property is used, and detailed examples thereof include Cu, Ni, Ti, Ag, Au, and the like. The conductive portion 2 is formed by, for example, plating. The thickness of the conductive portion 2 is, for example, about 30 μm and has, for example, a configuration in which an Au layer of about 10 μm is laminated on a Cu layer of about 20 μm.

The conductive portion 2 of the embodiment includes a first die bonding portion 211, a first extension portion 221, a first penetration portion 231, a second bonding portion 212, a pair of second extension portions 222, a pair of second penetration portions 232, a third die bonding portion 213, a pair of third extension portions 223, a pair of third penetration portions 233, a common wire bonding portion 240, a common penetration portion 246, a first mounting electrode 271, a pair of second mounting electrodes 272, a pair of third mounting electrodes 273, and a fourth mounting electrode 274.

The first die bonding portion 211 is formed on the main surface 11 of the base material 1. The first die bonding portion 211 is a portion to which the first element 3 is die-bonded. In the embodiment, the first die bonding portion 211 is disposed at the substantially center of the main surface 11 in the x direction. The shape of the first die bonding portion 211 is not particularly limited and is a rectangular shape when viewed from the z direction in the example illustrated in the drawing. The first die bonding portion 211 is separated from the pair of side surfaces 13. The first die bonding portion 211 is disposed near the upper side of FIG. 1 in the y direction.

The second bonding portion 212 is formed on the main surface 11 of the base material 1. The second bonding portion 212 is a portion to which the second element 4 is die-bonded. In the embodiment, the second bonding portion 212 is disposed at the right side of the first die bonding portion 211 in the x direction of FIG. 1. The shape of the second bonding portion 212 is not particularly limited and is a rectangular shape when viewed from the z direction in the example illustrated in the drawing. The second bonding portion 212 is separated from the pair of side surfaces 13 and the end surface 14. The second bonding portion 212 is disposed at the substantially center of the main surface 11 in the y direction.

The third die bonding portion 213 is formed on the main surface 11 of the base material 1. The third die bonding portion 213 is a portion to which the third element 5 is die-bonded. In the embodiment, the third die bonding portion 213 is disposed at the left side of the first die bonding portion 211 in the x direction of FIG. 1. In other words, the third die bonding portion 213 is disposed at the side opposite to the second bonding portion 212 with the first die bonding portion 211 interposed therebetween in the x direction. The shape of the third die bonding portion 213 is not particularly limited and is a rectangular shape when viewed from the z direction in the example illustrated in the drawing. The third die bonding portion 213 is separated from the pair of side surfaces 13 and the end surface 14. The third die bonding portion 213 is disposed at the substantially center of the main surface 11 in the y direction.

The common wire bonding portion 240 is a portion to which the first wire 61, the second wire 62, and the third wire 63 are bonded. In the embodiment, the common wire bonding portion 240 is located between the second bonding portion 212 and the third die bonding portion 213 in the x direction and overlaps the first die bonding portion 211 in the y direction. In the example illustrated in the drawing, the first die bonding portion 211 and the common wire bonding portion 240 have the same x-direction position. The common wire bonding portion 240 is disposed to be separated from the first die bonding portion 211 in the y direction. The shape of the common wire bonding portion 240 is not particularly limited and is a rectangular shape of which the x direction is set as the longitudinal direction when viewed from the z direction in the example illustrated in the drawing.

In the example illustrated in the drawing, each of the y-direction dimensions of the second bonding portion 212 and the third die bonding portion 213 is the same as a dimension y1. The y-direction dimension of the first die bonding portion 211 is smaller than the dimension y1. Further, in FIG. 1, the upper edges of the first die bonding portion 211, the second bonding portion 212, and the third die bonding portion 213 in the y direction are located at the same position in the y direction. The x-direction dimension of the common wire bonding portion 240 is larger than a dimension xl which is the x-direction dimension of the first die bonding portion 211. In FIG. 1, the lower edges of the second bonding portion 212, the third die bonding portion 213, and the common wire bonding portion 240 in the y direction are located at the same position in the y direction.

The first extension portion 221 is connected to the first die bonding portion 211 and extends toward one side surface 13 in the y direction. In the example illustrated in the drawing, the first extension portion 221 reaches one side surface 13. The shape of the first extension portion 221 is not particularly limited and is a rectangular shape of which the x-direction dimension is smaller than that of the first die bonding portion 211 in the example illustrated in the drawing.

The pair of second extension portions 222 is connected to the second bonding portion 212 and extends toward the pair of side surfaces 13 at both sides in the y direction. In the example illustrated in the drawing, the pair of second extension portions 222 individually reaches the pair of side surfaces 13. The shape of the second extension portion 222 is not particularly limited and is a rectangular shape of which the x-direction dimension is smaller than that of the second bonding portion 212 in the example illustrated in the drawing.

The pair of third extension portions 223 is connected to the third die bonding portion 213 and extends toward the pair of side surfaces 13 at both sides in the y direction. In the example illustrated in the drawing, the pair of third extension portions 223 individually reaches the pair of side surfaces 13. The shape of the third extension portion 223 is not particularly limited and is a rectangular shape of which the x-direction dimension is smaller than that of the third die bonding portion 213 in the example illustrated in the drawing.

The common extension portion 245 is connected to the common wire bonding portion 240 and extends toward the other side surface 13 in the y direction. In the example illustrated in the drawing, the first extension portion 221 reaches the other side surface 13. The shape of the common extension portion 245 is not particularly limited and is a rectangular shape of which the x-direction dimension is smaller than that of the common wire bonding portion 240 in the example illustrated in the drawing.

The first mounting electrode 271 is formed on the rear surface 12 of the base material 1. In the example illustrated in the drawing, the first mounting electrode 271 reaches one side surface 13. Further, the first mounting electrode 271 is disposed at the substantially center of the rear surface 12 in the x direction. The shape of the first mounting electrode 271 is not particularly limited and is a rectangular shape in the example illustrated in the drawing. As illustrated in FIG. 1, the first mounting electrode 271 overlaps the first extension portion 221 and the first die bonding portion 211 when viewed from the z direction. More specifically, the first mounting electrode 271 overlaps all of the first extension portion 221 and a part of the first die bonding portion 211 when viewed from the z direction.

The pair of second mounting electrodes 272 is formed on the rear surface 12 of the base material 1. In the example illustrated in the drawing, the pair of second mounting electrodes 272 individually reaches the pair of side surfaces 13. Further, the pair of second mounting electrodes 272 is disposed at the right side of FIG. 4 with respect to the first mounting electrode 271 in the x direction. The shape of the second mounting electrode 272 is not particularly limited and is a rectangular shape in the example illustrated in the drawing. As illustrated in FIG. 1, the pair of second mounting electrodes 272 overlaps the pair of second extension portions 222 and the second bonding portion 212 when viewed from the z direction. More specifically, the pair of second mounting electrodes 272 overlaps all of the pair of second extension portions 222 and a part of the second bonding portion 212 when viewed from the z direction.

The pair of third mounting electrodes 273 is formed on the rear surface 12 of the base material 1. In the example illustrated in the drawing, the pair of third mounting electrodes 273 individually reaches the pair of side surfaces 13. Further, the pair of third mounting electrodes 273 is disposed at the left side of FIG. 4 with respect to the first mounting electrode 271 in the x direction. The shape of the third mounting electrode 273 is not particularly limited and is a rectangular shape in the example illustrated in the drawing. As illustrated in FIG. 1, the pair of third mounting electrodes 273 overlaps the pair of third extension portions 223 and the third die bonding portion 213 when viewed from the z direction. More specifically, the pair of third mounting electrodes 273 overlaps all of the pair of third extension portions 223 and a part of the third die bonding portion 213 when viewed from the z direction.

The fourth mounting electrode 274 is formed on the rear surface 12 of the base material 1. In the example illustrated in the drawing, the fourth mounting electrode 274 reaches the other side surface 13. Further, the fourth mounting electrode 274 is disposed at the substantially center of the rear surface 12 in the x direction. The fourth mounting electrode 274 is arranged side by side in the y direction with respect to the first mounting electrode 271. The shape of the fourth mounting electrode 274 is not particularly limited and is a rectangular shape in the example illustrated in the drawing. As illustrated in FIG. 1, the fourth mounting electrode 274 overlaps the common extension portion 245 and the common wire bonding portion 240 when viewed from the z direction. More specifically, the fourth mounting electrode 274 overlaps all of the common extension portion 245 and a part of the common wire bonding portion 240 when viewed from the z direction.

The first penetration portion 231 penetrates the base material 1. The first penetration portion 231 is connected to the first extension portion 221 and the first mounting electrode 271 and overlaps the first extension portion 221 and the first mounting electrode 271 when viewed from the z direction. As illustrated in FIG. 1, FIG. 3, and FIG. 12, in the embodiment, the first penetration portion 231 includes a first exposed surface 2311. The first exposed surface 2311 is a surface exposed in the y direction from the side surface 13 of the base material 1. The first exposed surface 2311 is substantially flush with the side surface 13. The first penetration portion 231 of the embodiment has a semi-circular shape when viewed from the z direction.

In the example illustrated in the drawing, the first penetration portion 231 includes a bottom surface 2312 and a ceiling surface 2313. The bottom surface 2312 is exposed downward in the z direction from the first mounting electrode 271. The ceiling surface 2313 is a boundary surface with the first extension portion 221. The bottom surface 2312 is a curved surface which is slightly recessed upward in the z direction. The ceiling surface 2313 is a curved surface which is slightly swollen upward in the z direction.

An example of a method of manufacturing the first penetration portion 231 with such a configuration will be described. First, as illustrated in FIG. 14, the substrate material 10 is prepared. Next, the first extension portion 221 and the first mounting electrode 271 are formed in the substrate material 10. The substrate material 10 has a size and a shape capable of forming the base materials 1 and FIG. 14 is a cross-sectional view in a surface corresponding to the side surface 13.

Next, a through-hole 2310 is formed by irradiating, for example, a laser beam from the first mounting electrode 271. By the irradiation of the laser beam, a through-hole is first formed in the first mounting electrode 271 and a through-hole is continuously formed in the substrate material 10. Then, the irradiation of the laser beam is stopped at a time point in which a part of the first extension portion 221 is slightly removed. Accordingly, the through-hole 2310 having a shape illustrated in the drawing can be obtained. At this time, a slight curved surface is formed in the first extension portion 221.

Next, the through-hole 2310 is filled with metal by a method such as plating. By the plating, a metal portion to be the first penetration portion 231 is formed. It is desirable that the lower surface of the metal portion in the z direction be a curved surface which is slightly recessed upward in the z direction. Then, the base material 1, the first extension portion 221, the first mounting electrode 271, and the first penetration portion 231 are formed by cutting the substrate material 10, the first mounting electrode 271, the first extension portion 221, and the metal portion together. Then, the base material 1 is provided with the side surface 13 and the first penetration portion 231 is provided with the first exposed surface 2311.

An embodiment of the first penetration portion 231 is an example of a detailed shape of the first penetration portion 231. The pair of second penetration portions 232, the pair of third penetration portions 233, and the common penetration portion 246 can be formed in the same detail shape by the same manufacturing method as that of the first penetration portion 231, but may be formed different detail shapes.

The pair of second penetration portions 232 penetrates the base material 1. The pair of second penetration portions 232 is individually connected to the pair of second extension portions 222 and the pair of second mounting electrodes 272 and overlaps the pair of second extension portions 222 and the pair of second mounting electrodes 272 when viewed from the z direction. As illustrated in FIG. 1 to FIG. 3, in the embodiment, the second penetration portion 232 includes a second exposed surface 2321. The second exposed surface 2321 is a surface exposed in the y direction from the side surface 13 of the base material 1. The second exposed surface 2321 is substantially flush with the side surface 13. The second penetration portion 232 of the embodiment has a semi-circular shape when viewed from the z direction.

The pair of third penetration portions 233 penetrates the base material 1. The pair of third penetration portions 233 is individually connected to the pair of third extension portions 223 and the pair of third mounting electrodes 273 and overlaps the pair of third extension portions 223 and the pair of third mounting electrodes 273 when viewed from the z direction. As illustrated in FIG. 1 to FIG. 3, in the embodiment, the third penetration portion 233 includes a third exposed surface 2331. The third exposed surface 2331 is a surface exposed in the y direction from the side surface 13 of the base material 1. The third exposed surface 2331 is substantially flush with the side surface 13. The third penetration portion 233 of the embodiment has a semi-circular shape when viewed from the z direction.

The common penetration portion 246 penetrates the base material 1. The common penetration portion 246 is connected to the common extension portion 245 and the fourth mounting electrode 274 and overlaps the common extension portion 245 and the fourth mounting electrode 274 when viewed from the z direction. As illustrated in FIGS. 1 and 2, in the embodiment, the common penetration portion 246 includes a common exposed surface 2461. The common exposed surface 2461 is a surface exposed in the y direction from the side surface 13 of the base material 1. The common exposed surface 2461 is substantially flush with the side surface 13. The common penetration portion 246 of the embodiment has a semi-circular shape when viewed from the z direction.

The first element 3 is a light source of the light emitting and receiving device A1 and emits light of a predetermined wavelength band. The first element 3 is die-bonded to the first die bonding portion 211 and is mounted on the main surface 11 of the base material 1. The first element 3 is, for example, an LED chip. The light emitted from the first element 3 is not particularly limited and infrared light is exemplified as an example thereof. The first element 3 of the embodiment includes a first electrode 31. The first electrode 31 is formed on the upper surface of the first element 3 in the z direction. The first element 3 includes an electrode (not illustrated) which is formed on the lower surface in the z direction. The first element 3 is bonded to the first die bonding portion 211 by a first conductive bonding material 39. The first conductive bonding material 39 is Ag paste or solder and electrically connects the electrode of the first element 3 to the first die bonding portion 211.

Figure 13:
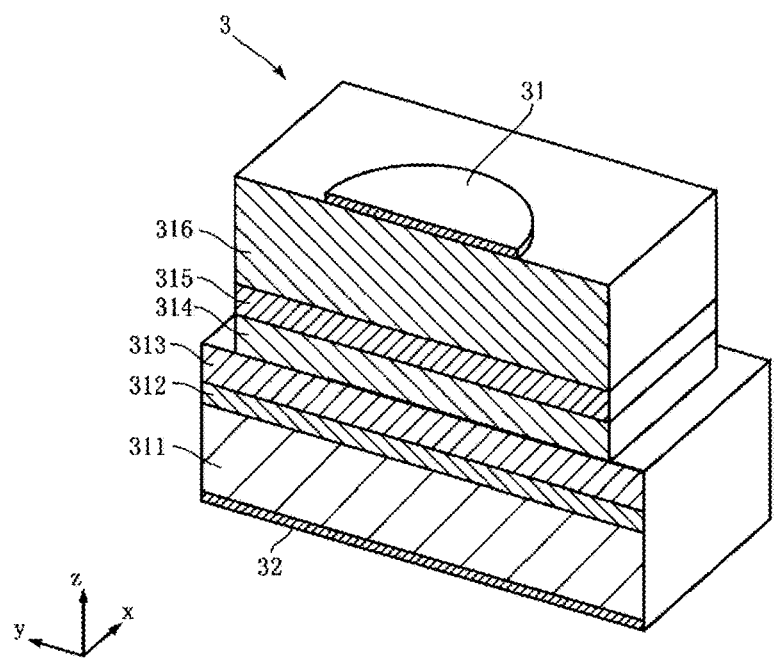
FIG. 13 is an enlarged cross-sectional perspective view illustrating a first element of the light emitting and receiving device according to the first embodiment of the present disclosure.

FIG. 13 illustrates an example of an LED chip which is the first element 3. The first element 3 illustrated in the example includes a first electrode 31, a fourth electrode 32, a first substrate 311, a first metal layer 312, a first semiconductor layer 313, a second semiconductor layer 314, a light emitting layer 315, and a third semiconductor layer 316. Furthermore, in this example, a case in which the first electrode 31 is an n-type electrode and the fourth electrode is a p-type electrode will be described, but these may be reversed.

The first substrate 311 is formed as, for example, a silicone substrate. Of course, the first substrate 311 may be formed as, for example, a semiconductor substrate formed of GaAs (gallium arsenide), GaP (gallium phosphide), or the like. The first substrate 311 is formed in a substantially square shape in the plan view in this example, but the shape of the first substrate 311 in the plan view is not particularly limited and may be, for example, a rectangular shape in the plan view. The thickness of the first substrate 311 is, for example, about 150 μm.

The first metal layer 312 is formed to cover the first substrate 311. The first metal layer 312 is formed of, for example, Au or alloy including Au. The first metal layer 312 may be a single layer of each of an Au layer and an Au alloy layer or may be a layer formed by laminating these layers and other metal layers. In a case in which the first metal layer 312 has a plurality of lamination structures, for example, a lamination structure of Au/AuBeNi/Au/Mo/Au/Mo/Au/Ti may be used. The thickness of the first metal layer 312 is, for example, about 0.5 μm.

In this example, the first semiconductor layer 313 is a p-type semiconductor layer and includes, for example, a p-type contact layer and a p-type window layer. The thickness of the first semiconductor layer 313 is, for example, about 1.5 μm.

In this example, the second semiconductor layer 314 is a p-type semiconductor layer and includes, for example, a p-type cladding layer. The thickness of the first electrode of the second semiconductor layer 314 is, for example, about 0.8 μm.

The light emitting layer 315 is, for example, a layer which has a multiple-quantum well (MQW) structure and is used to generate light by recombination of electrons and holes and to amplify the generated light.

In this example, the third semiconductor layer 316 is an n-type semiconductor layer and includes, for example, an n-type cladding layer, an n-type window layer, and an n-type contact layer. The thickness of the first electrode of the third semiconductor layer 316 is, for example, about 3.0 m.

The first electrode 31 is an n-type electrode and is formed on the third semiconductor layer 316. The first electrode 31 is formed of, for example Au or alloy including Au. Specifically, a lamination structure of Au/Ge/Ni/Au may be used.

The fourth electrode 32 is a p-type electrode and is formed on the rear surface of the first substrate 311. The fourth electrode 32 is formed of, for example, Au or alloy including Au. Specifically, a lamination structure of Ti/Au/Mo/Au may be used.

The second element 4 is an element which performs a photoelectric conversion function of generating an electric signal by receiving light in a wavelength band emitted from the first element 3. The second element 4 is used to detect the reflected light when the light emitted from the first element 3 is reflected by an external object. The second element 4 is die-bonded to the second bonding portion 212 and is mounted on the main surface 11 of the base material 1. The second element 4 is, for example, a photodiode or a phototransistor and the second element 4 illustrated in the drawing is a photodiode. The second element 4 of the embodiment includes a second electrode 41 and a light receiving portion 42. The second electrode 41 is formed on the upper surface of the second element 4 in the z direction. In the example illustrated in the drawing, the second electrode 41 is disposed near the first element 3 in the x direction and is disposed near the common wire bonding portion 240 in the y direction. The light receiving portion 42 is a portion which is provided in a region separated from the second electrode 41 and receives light in the photoelectric conversion function. The second element 4 includes an electrode (not illustrated) formed on the lower surface in the z direction. The second element 4 is bonded to the second bonding portion 212 by a second conductive bonding material 49. The second conductive bonding material 49 is Ag paste or solder and electrically connects the electrode of the second element 4 to the second bonding portion 212.

The third element 5 is an element which performs a photoelectric conversion function of generating an electric signal by receiving light in a wavelength band emitted from the first element 3. The third element 5 is used to detect light which is not emitted to the outside and traveling inside the light emitting and receiving device A1 (inside the sealing resin 7) among the light emitted from the first element 3. The third element 5 is die-bonded to the third die bonding portion 213 and is mounted on the main surface 11 of the base material 1. The third element 5 is, for example, a photodiode or a phototransistor and the third element 5 illustrated in the drawing is a photodiode. The third element 5 of the embodiment includes a third electrode 51 and a light receiving portion 52. The third electrode 51 is formed on the upper surface of the third element 5 in the z direction. In the example illustrated in the drawing, the third electrode 51 is disposed near the first element 3 in the x direction and is disposed near the common wire bonding portion 240 in the y direction. The light receiving portion 52 is a portion which is provided in a region separated from the third electrode 51 and receives light in the photoelectric conversion function. The third element 5 includes an electrode (not illustrated) formed on the lower surface of the z direction. The third element 5 is bonded to the third die bonding portion 213 by a third conductive bonding material 59. The third conductive bonding material 59 is Ag paste or solder and electrically connects the electrode of the third element 5 to the third die bonding portion 213.

A height H3 of the first element 3 in the z direction, a height H4 of the second element 4 in the z direction, and a height H5 of the third element 5 in the z direction illustrated in FIG. 6 can be set variously and all of the heights H3 to H5 may be the same or different. Then, any two of them may be the same. In the example illustrated in the drawing, the height H3 is lower than the heights H4 and H5. Further, the height H4 and the height H5 have the same height. The height H3 is, for example, about 0.10 mm and the height H4 and the height H5 are, for example, about 0.13 mm.

The first wire 61 is used to electrically connect the first element 3 and the conductive portion 2 to each other. The first wire 61 is formed of, for example, Au. The first wire 61 is bonded to the first electrode 31 of the first element 3 and the common wire bonding portion 240 of the conductive portion 2. A bonding portion 611 is a portion which is bonded to the common wire bonding portion 240 in the first wire 61.

The second wire 62 is used to electrically connect the second element 4 and the conductive portion 2 to each other. The second wire 62 is formed of, for example, Au. The second wire 62 is bonded to the second electrode 41 of the second element 4 and the common wire bonding portion 240 of the conductive portion 2. A bonding portion 621 is a portion which is bonded to the common wire bonding portion 240 in the second wire 62.

The third wire 63 is used to electrically connect the third element 5 and the conductive portion 2 to each other. The third wire 63 is formed of, for example, Au. The third wire 63 is bonded to the third electrode 51 of the third element 5 and the common wire bonding portion 240 of the conductive portion 2. A bonding portion 631 is a portion which is bonded to the common wire bonding portion 240 in the third wire 63.

As illustrated in FIG. 1, in the embodiment, all of the bonding portion 611, the bonding portion 621, and the bonding portion 631 exist in a region (a region of the dimension y1) in which the second bonding portion 212 and the third die bonding portion 213 exist in the y direction. Further, all of the bonding portion 611, the bonding portion 621, and the bonding portion 631 exist in a region (a region of the dimension x1) in which the first die bonding portion 211 exists in the x direction.

As illustrated in the circuit diagram of FIG. 4, in the embodiment, the first electrode 31 of the first element 3 is a cathode electrode of the first element 3 and a back electrode not illustrated in the drawing is an anode electrode. Further, the second electrode 41 of the second element 4 and the third electrode 51 of the third element 5 are anode electrodes and the back electrodes not illustrated in the drawing of the second element 4 and the third element 5 are cathode electrodes. Accordingly, the first mounting electrode 271 is electrically connected to the anode electrode of the first element 3, the second mounting electrode 272 is electrically connected to the cathode electrode of the second element 4, and the third mounting electrode 273 is electrically connected to the cathode electrode of the third element 5. Further, the fourth mounting electrode 274 is electrically connected to the cathode electrode of the first element 3 and the anode electrodes of the second element 4 and the third element 5 in such a manner that the first wire 61, the second wire 62, and the third wire 63 are bonded to the common wire bonding portion 240. That is, the first element 3, the second element 4, and the third element 5 are connected in a relationship of opposite polarity.

The sealing resin 7 covers the first element 3, the second element 4, and the third element 5 and is formed on the main surface 11 of the base material 1. The sealing resin 7 is formed of a material that transmits light in a wavelength band emitted from the first element 3 and is formed of, for example, an epoxy resin or a silicone resin having a light transmitting property. The sealing resin 7 of the embodiment includes a light emitting portion 71, a light incident portion 72, a coated portion 73, a first portion 74, and a second portion 75.

The light emitting portion 71 is a surface through which light is emitted from the first element 3 and overlaps the first element 3 when viewed from the z direction. In the example illustrated in the drawing, the light emitting portion 71 is a flat surface.

The light incident portion 72 is a surface which causes light reflected by an external object to be incident to the third element 5. The light incident portion 72 overlaps the second element 4 when viewed from the z direction. In the embodiment, the light incident portion 72 is arranged side by side in the x direction with respect to the light emitting portion 71. In the example illustrated in the drawing, the light incident portion 72 is a flat surface.

The coated portion 73 is a surface which is located at the side opposite to the light incident portion 72 with respect to the light emitting portion 71 in the x direction. The coated portion 73 overlaps the third element 5 when viewed from the z direction. In the example illustrated in the drawing, the coated portion 73 is a flat surface.

The first portion 74 is located at the boundary near the light emitting portion 71 in the coated portion 73 and is a curved portion. In the example illustrated in the drawing, as illustrated in FIG. 11, the first portion 74 includes a first corner portion 741, a second corner portion 742, and a side surface 743. The side surface 743 is a surface which is located between the light emitting portion 71 and the coated portion 73. In the example illustrated in the drawing, the coated portion 73 is separated from the main surface 11 of the base material 1 in the z direction in relation to the light emitting portion 71. The side surface 743 is, for example, a surface which is parallel to the z direction. The first corner portion 741 is formed by the boundary between the coated portion 73 and the side surface 743. An angle formed between the coated portion 73 and the side surface 743 exceeds 180° and is about 270° in the example illustrated in the drawing. The second corner portion 742 is formed by the boundary between the side surface 743 and the light emitting portion 71. An angle formed by the side surface 743 and the light emitting portion 71 is about 90°.

The second portion 75 is located between the light emitting portion 71 and the light incident portion 72 and is a portion of which the reflectivity of the light from the sealing resin 7 is lower than that of the light emitting portion 71. In the example illustrated in the drawing, the second portion 75 has a groove shape which is recessed in the z direction from the light emitting portion 71 and the light incident portion 72. As illustrated in FIG. 10, the second portion 75 is formed as a groove portion 751 which includes a bottom surface 752 and a pair of side surfaces 753. The bottom surface 752 is a surface which is located at the inside of the z direction. The pair of side surfaces 753 connects the light emitting portion 71 and the light incident portion 72 to the bottom surface 752. In the example illustrated in the drawing, the bottom surface 752 and the pair of side surfaces 753 are surfaces of which the surface roughness is rougher than those of the light emitting portion 71 and the light incident portion 72. For example, the second portion 75 is formed in such a manner that the sealing resin 7 is formed by curing a resin material and a part of the sealing resin 7 is cut by a blade or the like. Furthermore, in a case in which the second portion 75 is formed by a mold, only the bottom surface 752 may be formed as a surface of which surface roughness is rough and the side surface 753 may be formed as a flat surface which is the same as the light emitting portion 71 or the light incident portion 72.

As illustrated in FIG. 1, in the example illustrated in the drawing, the second portion 75 overlaps the first die bonding portion 211 in the region R1 when viewed from the z direction. Further, the second portion 75 overlaps the second bonding portion 212 in the region R2 of the z direction. Further, the second portion 75 overlaps the first portion 74 in the region R3 when viewed from the z direction. In the region R1, the region R2, and the region R3, a height H which is a distance from the bottom surface 752 to the first die bonding portion 211, the second bonding portion 212, and the common wire bonding portion 240 is smaller than a distance between the bottom surface 752 and the main surface 11. Further, the second portion 75 overlaps the second wire 62 when viewed from the z direction.

The light shielding layer 8 is formed of a material of which transmittance for light is lower than that of the sealing resin 7 and is formed of, for example, black or dark paint. The light shielding layer 8 covers the coated portion 73 of the sealing resin 7 and overlaps at least a part of the third element 5 when viewed from the z direction. In the example illustrated in the drawing, the light shielding layer 8 overlaps all of the third element 5 in the z direction. Furthermore, as the material of the light shielding layer 8, for example, resist ink or epoxy resin is exemplified as a material that can be coated. Further, as a different material of the light shielding layer 8, an optical filter or an optical film which can be formed by a method such as adhering is exemplified.

As illustrated in FIG. 11, the light shielding layer 8 includes an edge 80. The edge 80 matches the first portion 74 and matches the first corner portion 741 of the first portion 74 in the example illustrated in the drawing. Further, the light shielding layer 8 includes a curved surface 81. The curved surface 81 is a curved surface which is connected to the edge 80 and has a convex shape. The curved surface 81 is formed at the time of applying a paint for forming the light shielding layer 8 onto the coated portion 73 of the sealing resin 7. When a contact angle in the first corner portion 741 increases, a paint to spread out from the coated portion 73 is cured while being kept by a surface tension so that the curved surface 81 is formed. Furthermore, the light shielding layer 8 may not include the curved surface 81. Further, the edge 80 of the light shielding layer 8 may not match the first portion 74.

Next, the operation of the light emitting and receiving device A1 will be described.

According to the embodiment, since the light shielding layer 8 is provided, it is possible to prevent a problem in which light traveling from the outside of the light emitting and receiving device A1 is received by the third element 5. Accordingly, it is possible to more accurately monitor the state of the first element 3 by the third element 5. Thus, the light emitting and receiving device A1 can exhibit the more accurate detection function.

Further, the third element 5 is provided in addition to the first element 3 and the second element 4. The third element 5 receives light traveling inside the sealing resin 7 in the light emitted from the first element 3. For this reason, a detection signal of the third element 5 is hardly influenced by the situation outside the light emitting and receiving device A1 and a state of the first element 3 such as a change with time is reflected. Accordingly, it is possible to continuously monitor the light emitting state of the first element 3. Thus, it is possible to appropriately operate the light emitting and receiving device A1 for a longer period by reflecting the detection result of the third element 5 in the process of the detection signal of the second element 4.

Since the sealing resin 7 is provided with the light incident portion 72, it is possible to more accurately form the light shielding layer 8 in a desired region. Further, since the curved surface 81 of the light shielding layer 8 is provided, a portion of the light shielding layer 8 is apt to increase in thickness. An increase in thickness of the portion is advantageous for increasing the light shielding effect by the light shielding layer 8. Further, a configuration in which the light shielding layer 8 overlaps the entire third element 5 when viewed from the z direction is desirable to increase the light shielding effect by the light shielding layer 8.

The surface roughness of the second portion 75 is rougher than that of the light emitting portion 71 or the light incident portion 72. Since such a second portion 75 is provided, it is possible to prevent a problem in which light emitted from the first element 3 is reflected from the surface of the sealing resin 7 and is unintentionally received by the second element 4. Accordingly, it is possible to prevent an error detection due to the second element 4.

Since the second portion 75 has a groove shape, it is possible to promote reflection suppression by the second portion 75. Further, in the example illustrated in the drawing, the second portion 75 overlaps the first die bonding portion 211, the second bonding portion 212, and the common wire bonding portion 240 in the region R1, the region R2, and the region R3. In these regions, as illustrated in FIG. 5 and FIG. 6, a height H which is a distance from the bottom surface 752 to the first die bonding portion 211, the second bonding portion 212, and the common wire bonding portion 240 is smaller than a distance between the bottom surface 752 and the main surface 11. Since this means to narrow a path in which the light emitted from the first element 3 travels inside the sealing resin 7, it is desirable to prevent the second element 4 from receiving unintended light.

As illustrated in FIG. 1, the second electrode 41 of the second element 4 is provided near the common wire bonding portion 240 in the x direction and the y direction. Accordingly, as illustrated in FIG. 5, it is possible to suppress an increase in the z-direction height of the second wire 62 from the base material 1 while avoiding the interference of the second wire 62 with the light receiving portion 42 or the like of the second element 4. This is desirable for a decrease in thickness of the light emitting and receiving device A1. Similarly, as illustrated in FIG. 1, the third electrode 51 is disposed near the common wire bonding portion 240 in the x direction and the y direction. Accordingly, it is possible to suppress an increase in the z-direction height of the third wire 63 from the base material 1. This is desirable for a decrease in thickness of the light emitting and receiving device A1.

FIG. 16 to FIG. 40 illustrate other embodiments of the present disclosure. Furthermore, in these drawings, the same reference numerals as those of the above-described embodiment are given to the same or similar components as or to those of the above-described embodiment.

First Modified Example of First Embodiment

Figure 16:
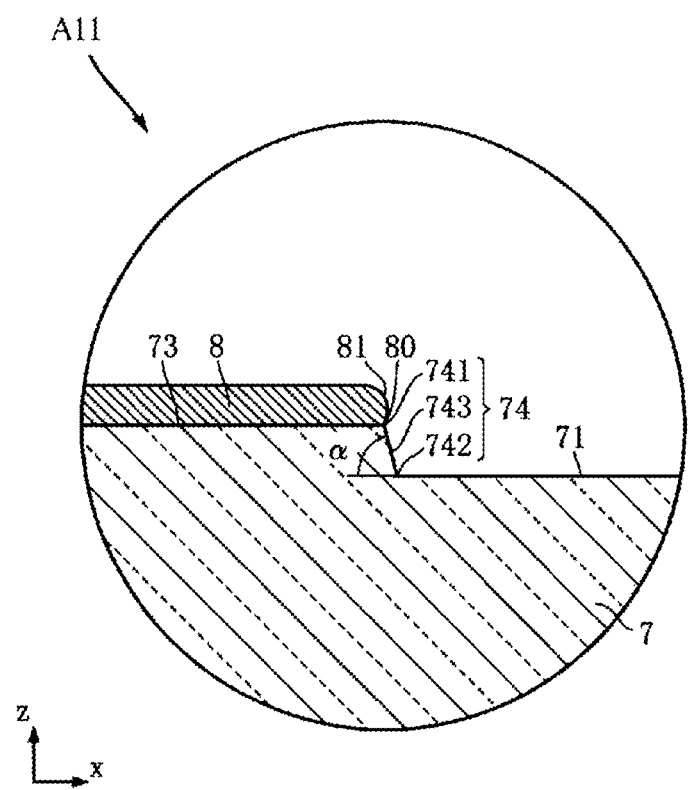
FIG. 16 is a main enlarged cross-sectional view illustrating a first modified example of the light emitting and receiving device according to the first embodiment of the present disclosure.

FIG. 16 is a main enlarged cross-sectional view illustrating a first modified example of the light emitting and receiving device A1. In a light emitting and receiving device A11 of the modified example, an angle α formed between the side surface 743 and the light emitting portion 71 is larger than 90°. For example, this configuration is advantageous to smoothly separate a mold for forming the sealing resin 7 from the sealing resin 7.

Second Modified Example of First Embodiment

Figure 17:
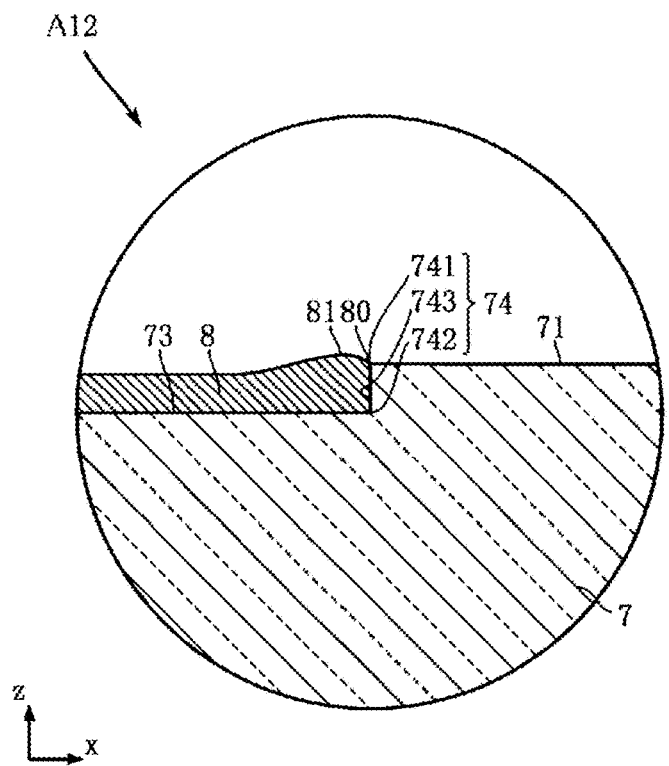
FIG. 17 is a main enlarged cross-sectional view illustrating a second modified example of the light emitting and receiving device according to the first embodiment of the present disclosure.

FIG. 17 is a main enlarged cross-sectional view illustrating a second modified example of the light emitting and receiving device A1. In a light emitting and receiving device A12 of the modified example, the light emitting portion 71 is separated from the main surface 11 of the base material 1 in the z direction in relation to the coated portion 73. Then, the first portion 74 includes the second corner portion 742, the side surface 743, and the first corner portion 741 from the coated portion 73. That is, the first corner portion 741 of the modified example is formed by the boundary between the side surface 743 and the light emitting portion 71. An angle formed between the side surface 743 and the light emitting portion 71 exceeds 180° and is, for example, about 270°. Also by the modified example, it is possible to keep a paint for forming the light shielding layer 8 in the first corner portion 741 of the first portion 74 and to more accurately form the light shielding layer 8 in a desired region.

Furthermore, the light emitting portion 71 and the coated portion 73 may be formed at the same time at the time of forming the sealing resin 7 by a mold, but the present disclosure is not limited thereto. At the molding stage using a mold, the coated portion 73 is not formed, a surface which is flat with respect to the light emitting portion 71 is formed, and then a region to be coated with the light shielding layer 8 by the irradiation of laser may be dug to form the coated portion 73.

Third Modified Example of First Embodiment

Figure 18:
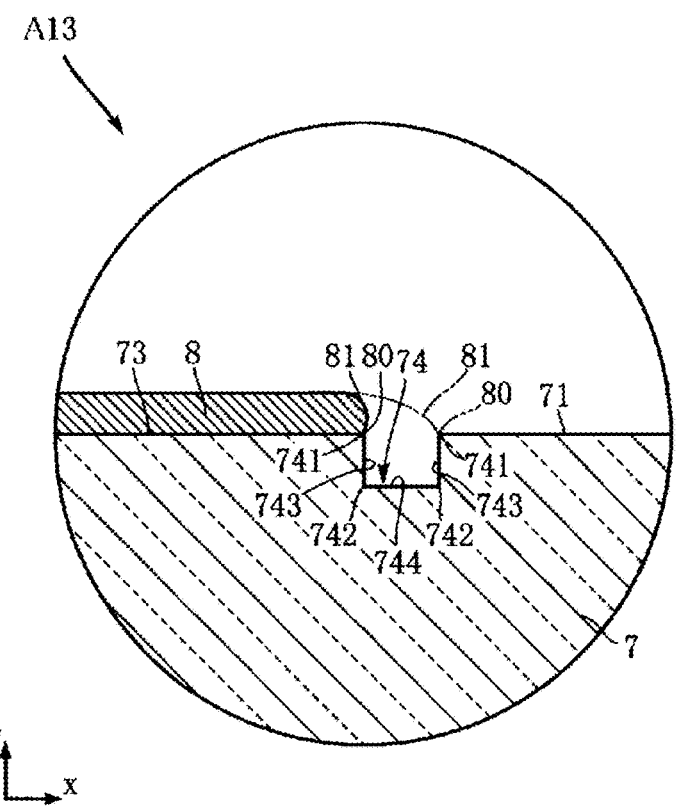
FIG. 18 is a main enlarged cross-sectional view illustrating a third modified example of the light emitting and receiving device according to the first embodiment of the present disclosure.

FIG. 18 is a main enlarged cross-sectional view illustrating a third modified example of the light emitting and receiving device A1. In a light emitting and receiving device A13 of the modified example, the light emitting portion 71 and the coated portion 73 are formed at the substantially same position in the z direction. Further, the first portion 74 has a groove shape including a bottom surface 744, a pair of side surfaces 743, a pair of first corner portions 741, and a pair of second corner portions 742. The bottom surface 744 is a surface which is located at the inside of the z direction. The pair of side surfaces 743 individually connects the bottom surface 744 to the light emitting portion 71 and the light incident portion 72. The pair of first corner portions 741 is formed by the boundary between one side surface 743 and the light emitting portion 71 and the boundary between the other side surface 743 and the coated portion 73.

Also by the modified example, it is possible to keep a paint for forming the light shielding layer 8 in the first corner portion 741 of the first portion 74 and to more accurately form the light shielding layer 8 in a desired region. Further, since the first portion 74 includes the pair of first corner portions 741, a paint can be kept by the first corner portion 741 at the right side of the drawing as indicated by the imaginary line of the drawing even when a paint for forming the light shielding layer 8 is not kept by the first corner portion 741 at the left side of the drawing.

Fourth Modified Example of First Embodiment

Figure 19:
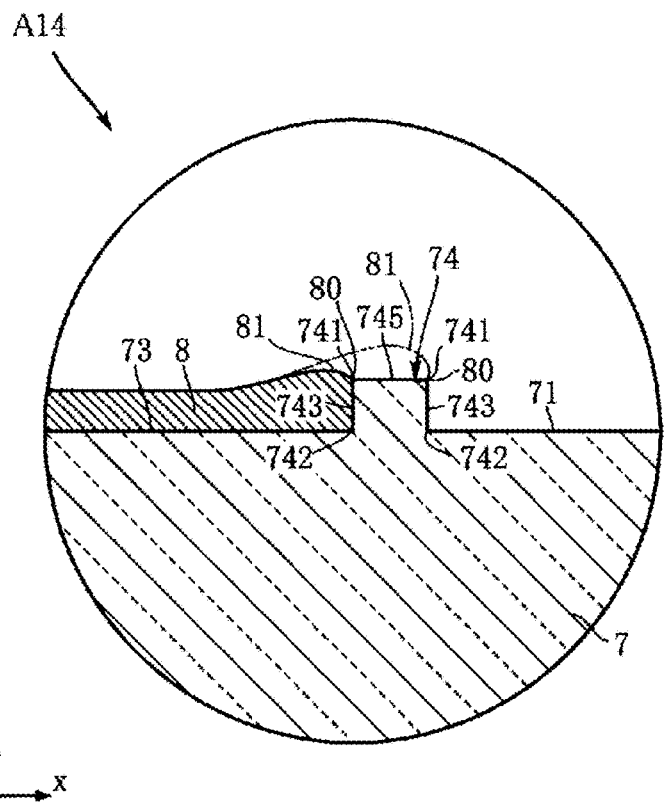
FIG. 19 is a main enlarged cross-sectional view illustrating a fourth modified example of the light emitting and receiving device according to the first embodiment of the present disclosure.

FIG. 19 is a main enlarged cross-sectional view illustrating a fourth modified example of the light emitting and receiving device A1. In a light emitting and receiving device A14 of the modified example, the light emitting portion 71 and the coated portion 73 are formed at the substantially same position in the z direction. Further, the first portion 74 has a convex shape including a top surface 745, a pair of side surfaces 743, a pair of first corner portions 741, and a pair of second corner portions 742. The top surface 745 is a surface located at the uppermost side in the z direction. The pair of side surfaces 743 individually connects the top surface 745 to the light emitting portion 71 and the light incident portion 72. The pair of first corner portions 741 is formed by the boundary between one side surface 743 and the top surface 745.

Also by the modified example, it is possible to keep a paint for forming the light shielding layer 8 in the first corner portion 741 of the first portion 74 and to more accurately form the light shielding layer 8 in a desired region. Further, since the first portion 74 includes the pair of first corner portions 741, a paint can be kept by the first corner portion 741 at the right side of the drawing as indicated by the imaginary line of the drawing even when a paint for forming the light shielding layer 8 is not kept by the first corner portion 741 at the left side of the drawing.

Fifth Modified Example of First Embodiment

Figure 20:
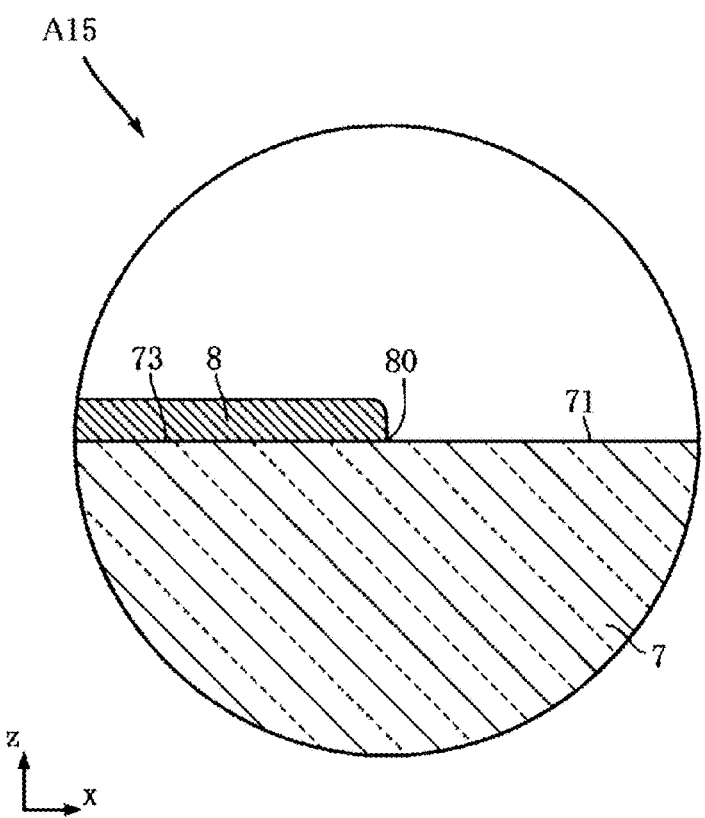
FIG. 20 is a main enlarged cross-sectional view illustrating a fifth modified example of the light emitting and receiving device according to the first embodiment of the present disclosure.

FIG. 20 is a main enlarged cross-sectional view illustrating a fifth modified example of the light emitting and receiving device A1. In a light emitting and receiving device A15 of the modified example, the light emitting portion 71 and the coated portion 73 are formed at the substantially same position in the z direction. Further, the first portion 74 is not formed between the light emitting portion 71 and the light incident portion 72. In the modified example, at the time of forming the light shielding layer 8, for example, in a state in which a region to be the light emitting portion 71 is masked, a material of the light shielding layer 8 is applied. Then, the light shielding layer 8 can be obtained by removing the mask.

As understood from such a modified example, it is possible to exhibit the more accurate function since the light shielding layer 8 is provided to expose the light emitting portion 71 and cover the coated portion 73 even in a configuration in which the sealing resin 7 does not include the first portion 74.

Modification of Light Shielding Layer

1. Although a material with transmittance lower than that of the sealing resin 7 is used as the light shielding layer 8, the present disclosure is not limited thereto. For example, a reflection film may be used as the light shielding layer 8. In this case, a metal material such as aluminum can be used as the reflection film and may be formed on the upper surface of the coated portion 73 by, for example, plating.

2. The light shielding layer 8 may be formed by modifying the sealing resin 7. This method will be described with reference to FIG. 17. First, the coated portion 73 is not provided and the sealing resin 7 is molded by a mold. Then, a laser is irradiated to a region to form the light shielding layer 8 on the surface of the sealing resin 7 to modify the transparent sealing resin 7 and to decrease transmittance. The modifying mechanism is not particularly limited, but a thermal reaction may be used or an optical reaction may be used. A UV laser is suitable for the laser.

Figure 51A:
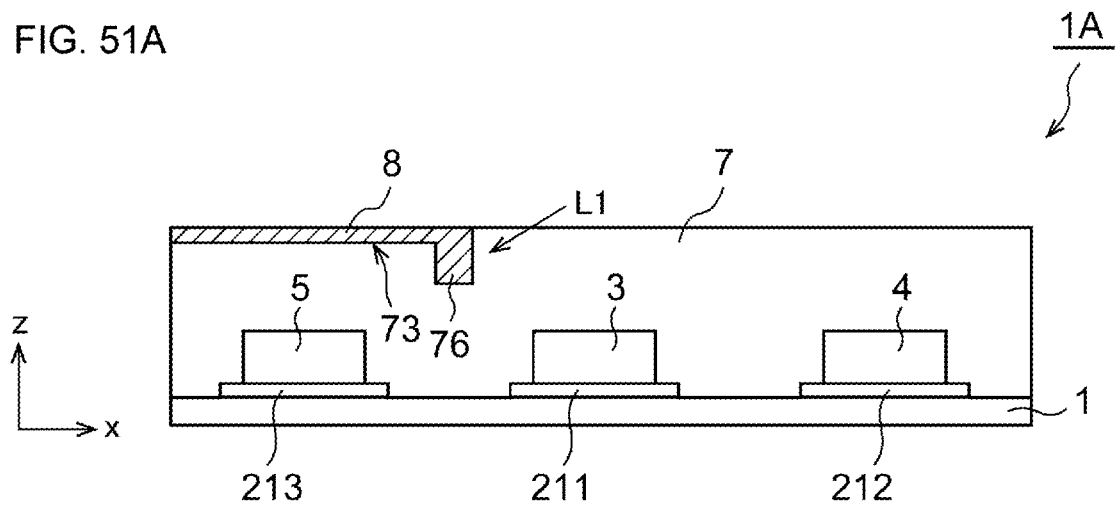
FIG. 51A and FIG. 51B is a cross-sectional view of a sealing resin on which a light shielding layer according to a modified example is formed.
Figure 51B:
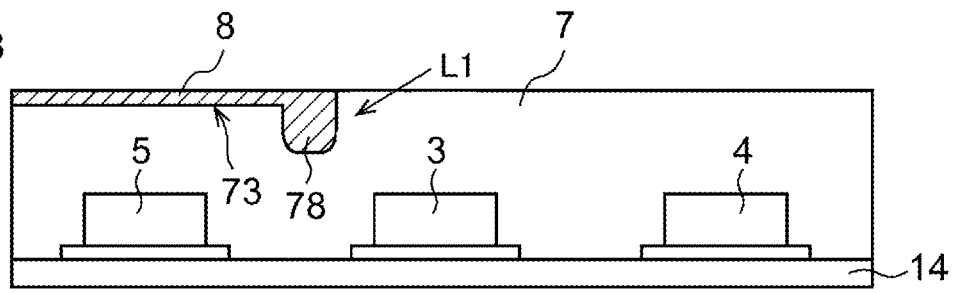

In FIG. 17 or 19, the coated portion 73 is flat, but the present disclosure is not limited thereto. FIG. 51A and FIG. 51B are cross-sectional views of the light emitting and receiving device A1 with the light shielding layer according to the modified example.

In FIG. 51A and FIG. 51B, the coated portion 73 includes a groove 76 which is formed in the first portion 74 close to the light emitting portion 71, in other words, the boundary portion between the first element 3 and the third element 5 and the groove 76 is filled with the light shielding layer 8. The groove 76 has a rectangular cross-section in FIG. 51A and the groove 78 has around cross-section in FIG. 51B. By using the groove 76 or 78, it is possible to prevent the third element 5 being exposed to an incident light L1.

Sixth Modified Example of First Embodiment

Figure 21:
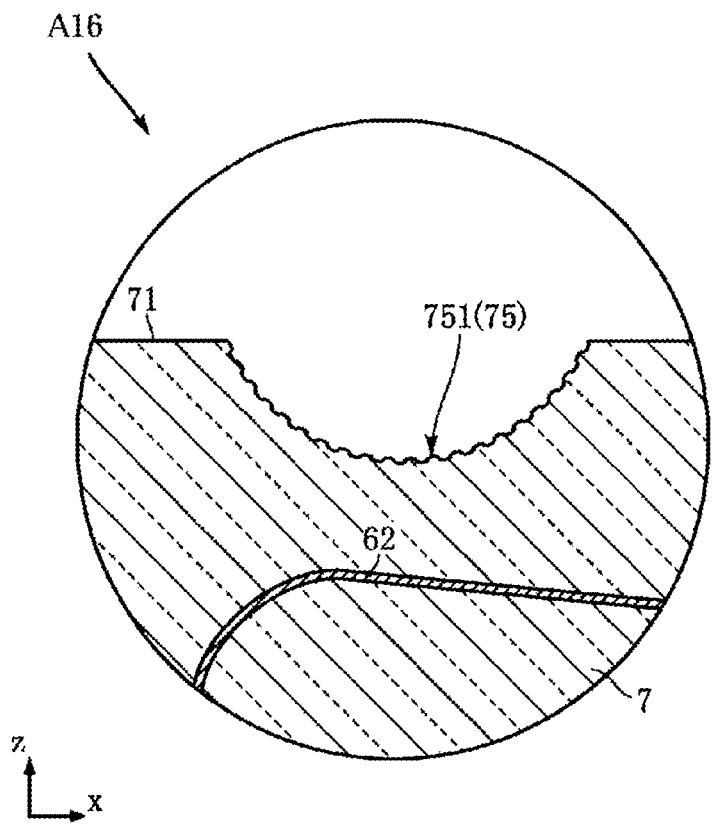
FIG. 21 is a main enlarged cross-sectional view illustrating a sixth modified example of the light emitting and receiving device according to the first embodiment of the present disclosure.

FIG. 21 illustrates a sixth modified example of the light emitting and receiving device A1. In a light emitting and receiving device A16 of the modified example, the second portion 75 is formed by a groove portion 751 formed as a curved surface. Also in this configuration, it is possible to prevent a problem in which light emitted from the first element 3 is reflected from the surface of the sealing resin 7 and is unintentionally received by the second element 4.

Seventh Modified Example of First Embodiment

Figure 22:
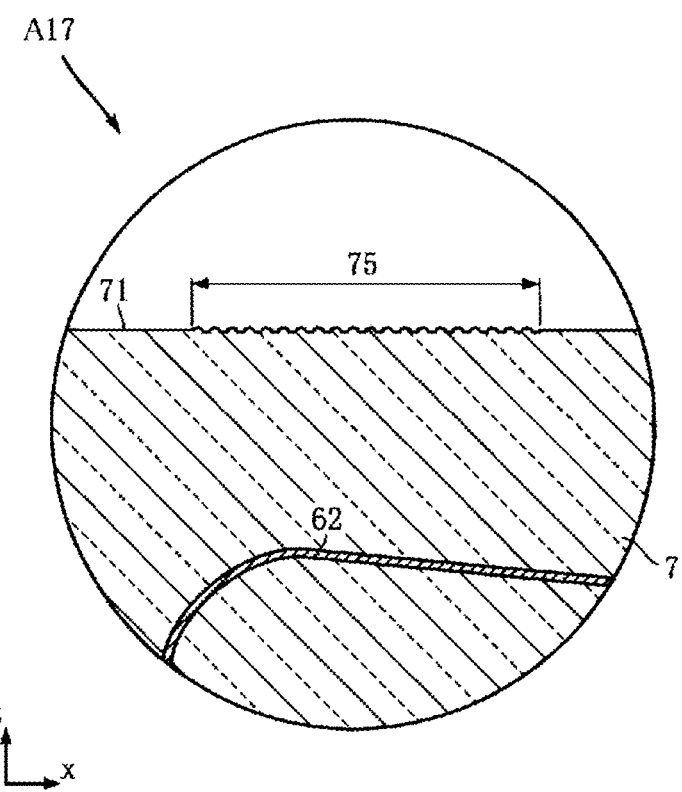
FIG. 22 is a main enlarged cross-sectional view illustrating a seventh modified example of the light emitting and receiving device according to the first embodiment of the present disclosure.

FIG. 22 illustrates a seventh modified example of the light emitting and receiving device A1. In a light emitting and receiving device A17 of the modified example, the second portion 75 is formed as a flat rough surface and does not have a groove shape or a convex shape. Also in the modified example, the surface roughness of the second portion 75 is rougher than those of the light emitting portion 71 and the light incident portion 72. Also in this configuration, it is possible to prevent a problem in which light emitted from the first element 3 is reflected from the surface of the sealing resin 7 and is unintentionally received by the second element 4. Further, an effect of alleviating stress concentration in the second portion 75 can be expected.

Eighth Modified Example of First Embodiment

Figure 23:
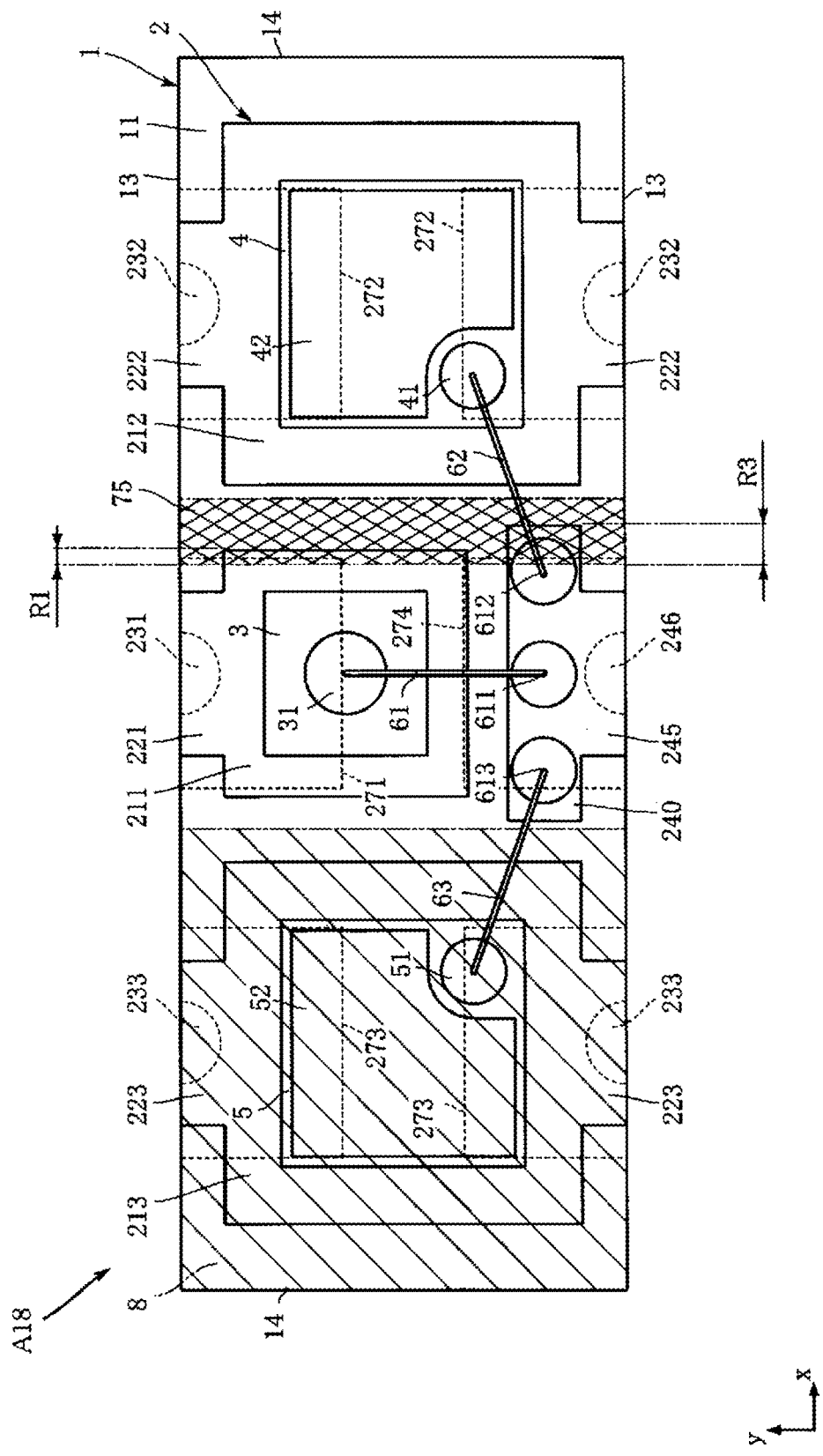
FIG. 23 is a main plan view illustrating an eighth modified example of the light emitting and receiving device according to the first embodiment of the present disclosure.

FIG. 23 illustrates an eighth modified example of the light emitting and receiving device A1. In a light emitting and receiving device A18 of the modified example, the second portion 75 is formed to overlap the first die bonding portion 211 in the region R1 and is formed to overlap the common wire bonding portion 240 and not to overlap the second bonding portion 212 in the region R3 when viewed from the z direction. Also by the modified example, since the region R1 and the region R3 are set, it is possible to improve an effect of preventing the third element 5 from receiving unintended light.

Ninth Modified Example of First Embodiment

Figure 24:
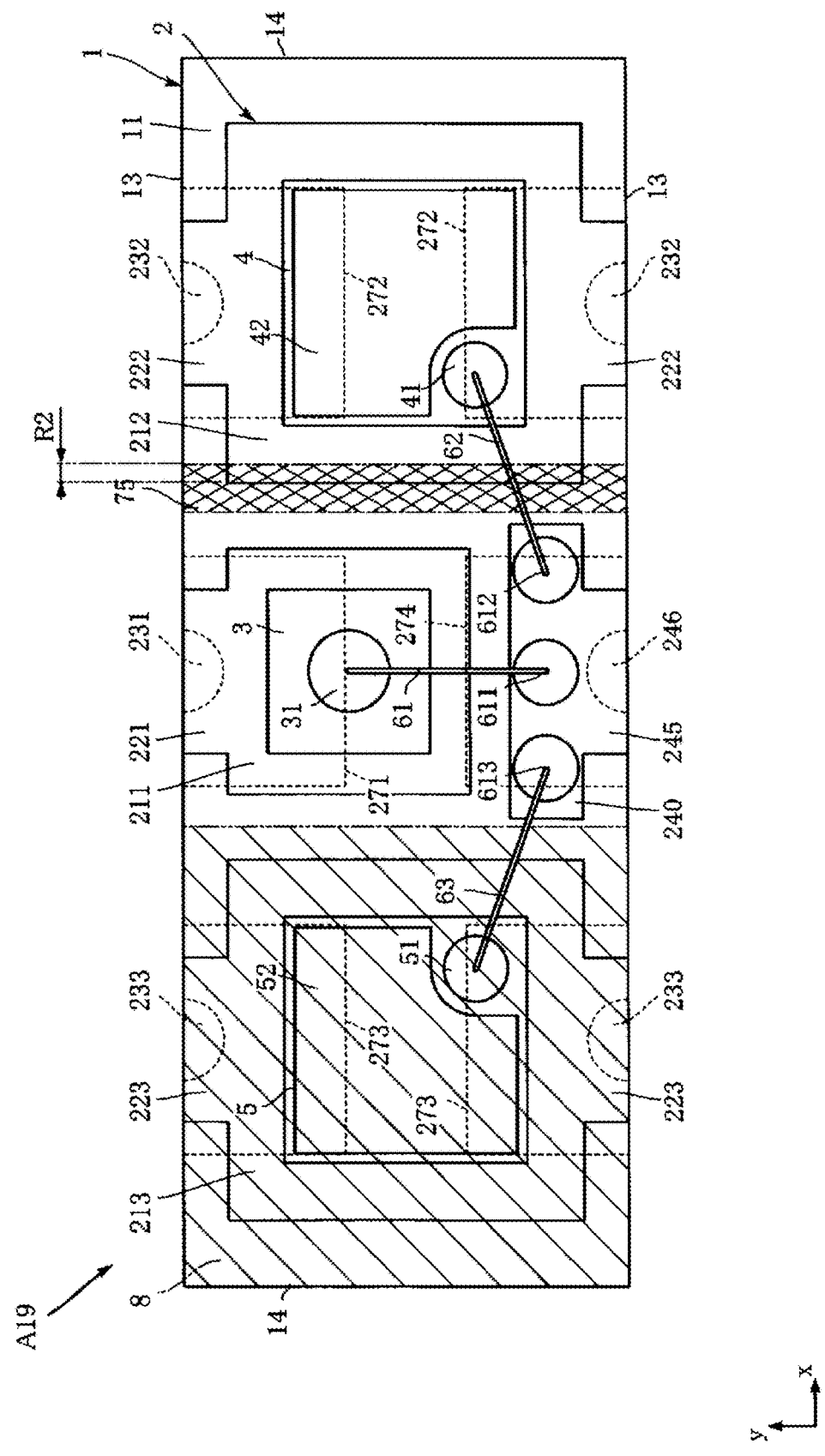
FIG. 24 is a main plan view illustrating a ninth modified example of the light emitting and receiving device according to the first embodiment of the present disclosure.

FIG. 24 illustrates a ninth modified example of the light emitting and receiving device A1. In a light emitting and receiving device A19 of the modified example, the second portion 75 overlaps the second bonding portion 212 and does not overlap the first die bonding portion 211 and the common wire bonding portion 240 in the region R2 when viewed from the z direction. Also by the modified example, since the region R2 is set, it is possible to improve an effect of preventing the third element 5 from receiving unintended light.

Tenth Modified Example of First Embodiment

Figure 25:
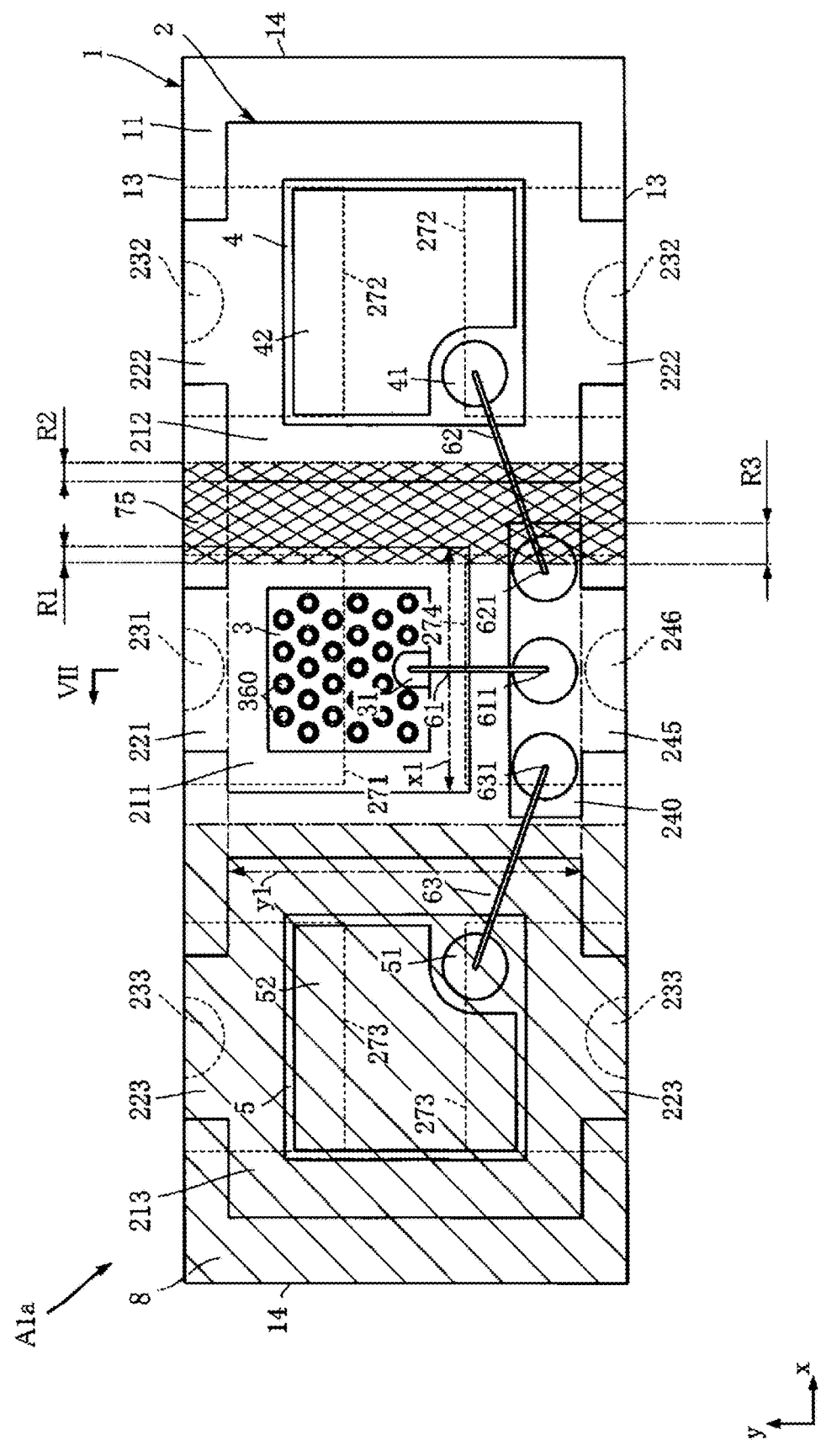
FIG. 25 is a main plan view illustrating a tenth modified example of the light emitting and receiving device according to the first embodiment of the present disclosure.
Figure 26:
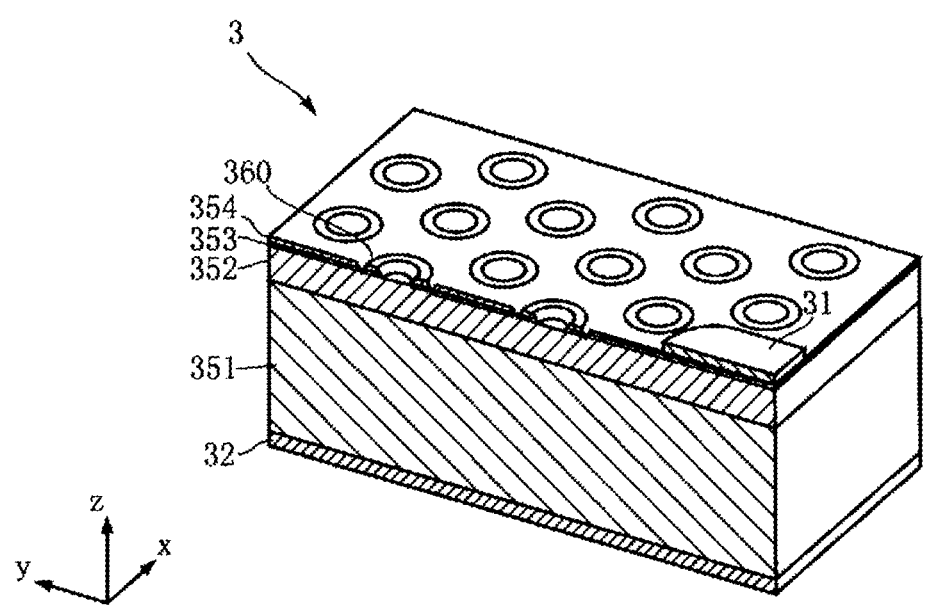
FIG. 26 is an enlarged cross-sectional perspective view illustrating a first element of the tenth modified example of the light emitting and receiving device according to the first embodiment of the present disclosure.
Figure 27:
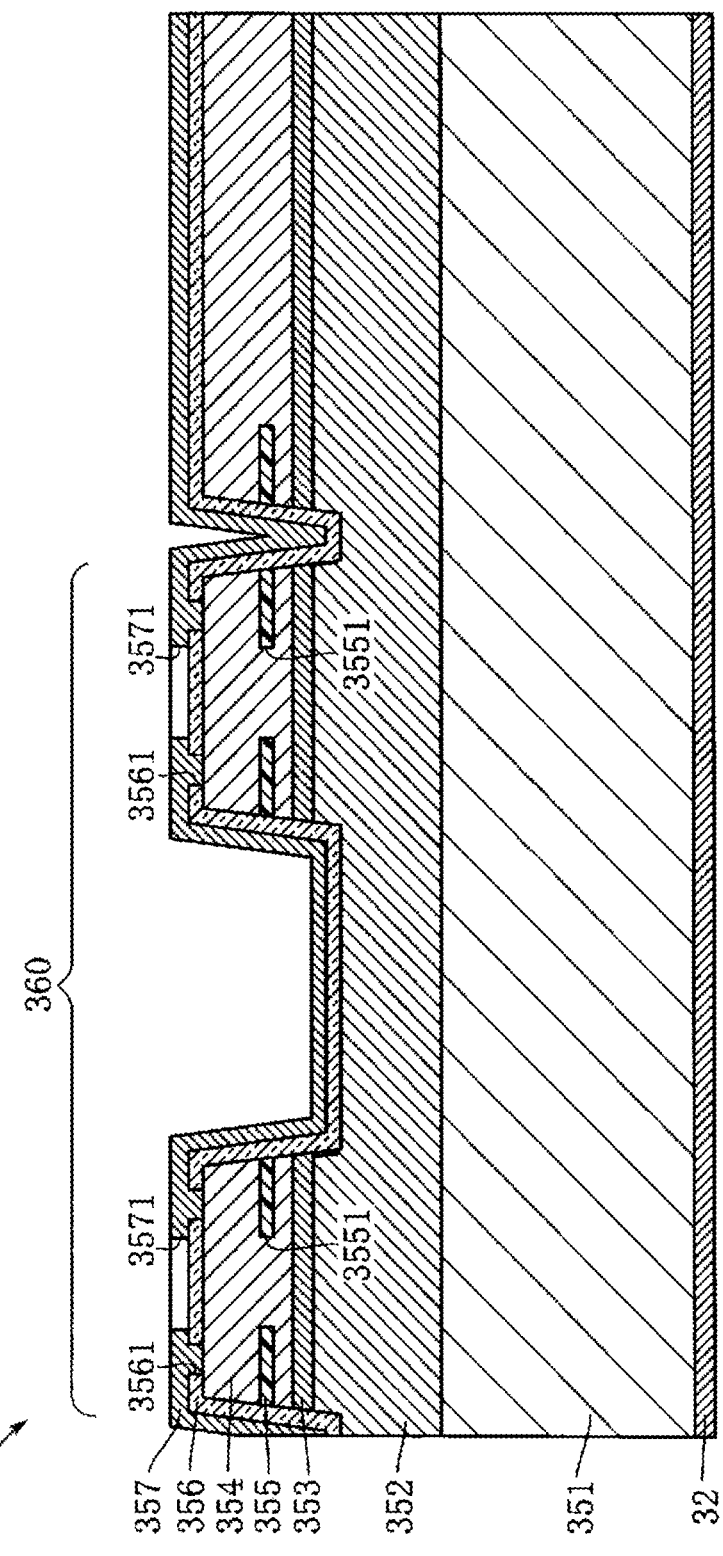
FIG. 27 is a main enlarged cross-sectional view illustrating the first element of the tenth modified example of the light emitting and receiving device according to the first embodiment of the present disclosure.

FIG. 25 to FIG. 27 illustrate a tenth modified example of the light emitting and receiving device A1. In a light emitting and receiving device A1a of the modified example, a VCSEL element is used as the first element 3.

As illustrated in FIG. 25, the first element 3 of this example is provided with the first electrode 31 and a plurality of light emitting regions 360 in the plan view. The first electrode 31 is disposed near the common wire bonding portion 240 in the y direction. The light emitting regions 360 are discretely arranged in a region excluding the first electrode 31 in the plan view of the first element 3.

As illustrated in FIG. 26 and FIG. 27, the first element 3 of this example includes a first electrode 31, a fourth electrode 32, a second substrate 351, a fourth semiconductor layer 352, an active layer 353, a fifth semiconductor layer 354, a current confinement layer 355, an insulation layer 356, and a conductive layer 357 and is provided with a plurality of light emitting regions 360. Furthermore, a configuration example illustrated in the same drawing illustrates an example of the VCSEL element which is the first element 3 and the present disclosure is not limited the configuration. FIG. 27 is an enlarged view illustrating a part including one light emitting region 360.

The second substrate 351 is formed of a semiconductor. The semiconductor forming the second substrate 351 is, for example, GaAs. The semiconductor forming the second substrate 351 may be other than GaAs.

The active layer 353 is formed of a compound semiconductor which emits light of a wavelength of, for example, a band of 980 nm (hereinafter, "$\lambda a$") by spontaneous emission and stimulated emission. The active layer 353 is located between the fourth semiconductor layer 352 and the fifth semiconductor layer 354.

The fourth semiconductor layer 352 is typically a Distributed Bragg Reflector (DBR) layer and is formed on the second substrate 351. The fourth semiconductor layer 352 is formed of a semiconductor of a first conductive type. In this example, the first conductive type is an n type. The fourth semiconductor layer 352 is formed as DBR for efficiently reflecting light emitted from the active layer 353. More specifically, the active layer 353 is an AlGaAs layer having a thickness $\lambda a/4$ and is formed by overlapping a plurality of pairs of two layers having different pieces of reflectivity.

The fifth semiconductor layer 354 is typically a DBR layer and is formed of a semiconductor of a second conductive type. In this example, the second conductive type is a p type. Differently from the embodiment, the first conductive type may be a p type and the second conductive type may be an n type. The fourth semiconductor layer 352 is located between the fifth semiconductor layer 354 and the second substrate 351. The fifth semiconductor layer 354 is formed of DBR for efficiently reflecting light emitted from the active layer 353. More specifically, the fifth semiconductor layer 354 is an AlGaAs layer having a thickness of $\lambda a/4$ and is formed by overlapping a plurality of pairs of two layers having different pieces of reflectivity.

The current confinement layer 355 is located inside the fifth semiconductor layer 354. The current confinement layer 355 includes, for example, a large amount of Al and is formed as a layer which is easily oxidized. The current confinement layer 355 is formed by the oxidization of the layer which is easily oxidized. The current confinement layer 355 may not be formed by oxidization and may be formed by the other methods (for example, ion implantation). An opening 3551 is formed in the current confinement layer 355. An electric current flows to the opening 3551.

The insulation layer 356 is formed on the fifth semiconductor layer 354. The insulation layer 356 is formed of, for example, $SiO_2$. An opening 3561 is formed in the insulation layer 356.

The conductive layer 357 is formed on the insulation layer 356. The conductive layer 357 is formed of a conductive material (for example, metal). The conductive layer 357 is electrically connected to the fifth semiconductor layer 354 through the opening 3561 of the insulation layer 356. The conductive layer 357 includes an opening 3571.

The light emitting region 360 is a region from which light from the active layer 353 is emitted directly or after reflection. In this example, the light emitting region 360 has an annular shape in the plan view, but the shape is not particularly limited. The light emitting region 360 is formed by laminating the fifth semiconductor layer 354, the current confinement layer 355, the insulation layer 356, and the conductive layer 357 and forming the opening 3551 of the current confinement layer 355, the opening 3561 of the insulation layer 356, and the opening 3571 of the conductive layer 357. In the light emitting region 600, light emitted from the active layer 353 is emitted through the opening 3571 of the conductive layer 357.

The first electrode 31 is formed of, for example, metal and is electrically connected to the fifth semiconductor layer 354. The fourth electrode 32 is formed on the rear surface of the second substrate 351 and is formed of, for example, metal.

According to the modified example, since a so-called surface emitting device VCSEL is used as the first element 3, it is possible to increase the luminance or the irradiation area. As understood from the modified example, when the first element 3 exhibits a light emitting function capable of realizing a detection, a detailed configuration thereof is not particularly limited.

Second Embodiment

Figure 28:
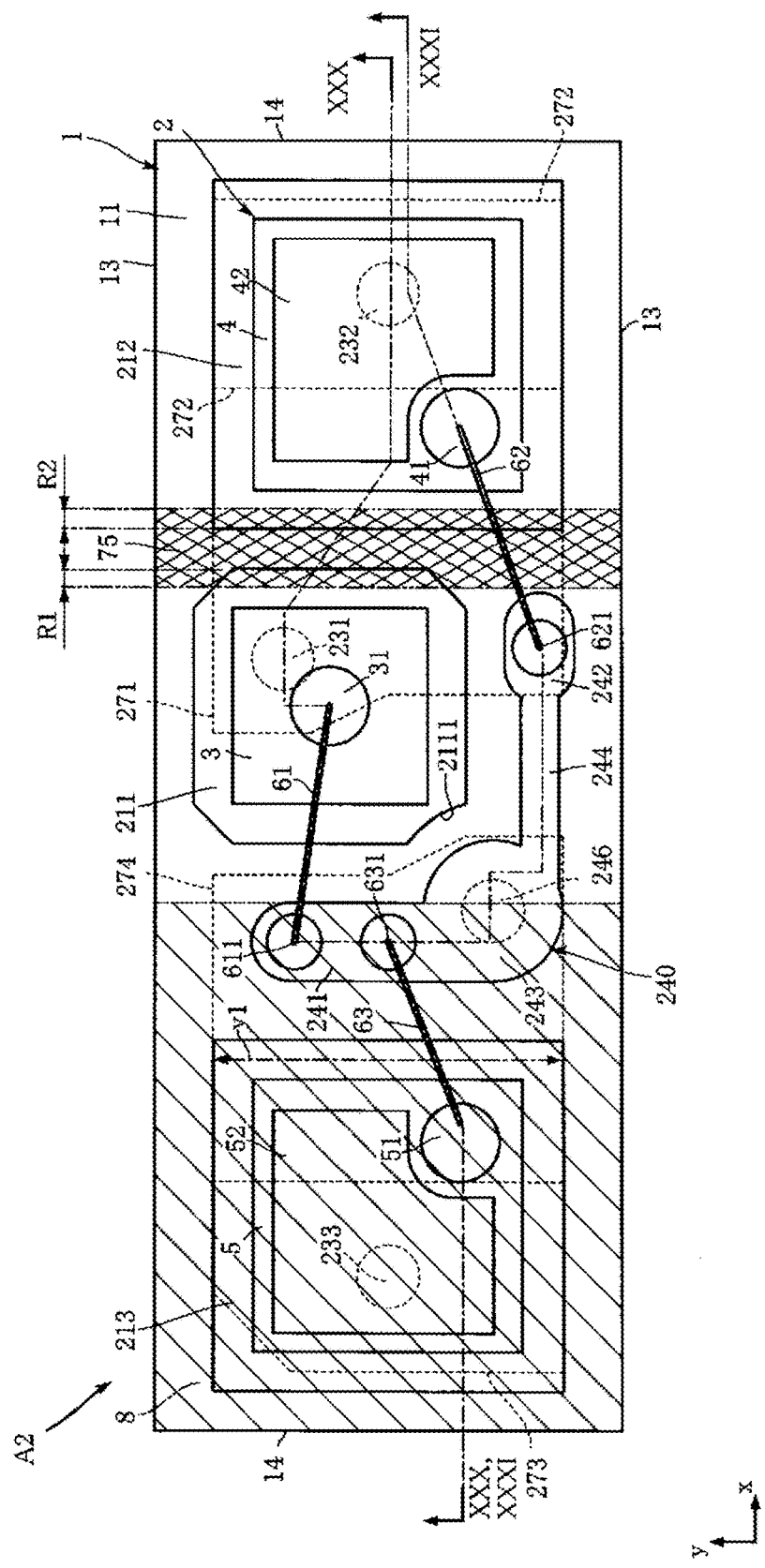
FIG. 28 is a main plan view illustrating a light emitting and receiving device according to a second embodiment of the present disclosure.
Figure 29:
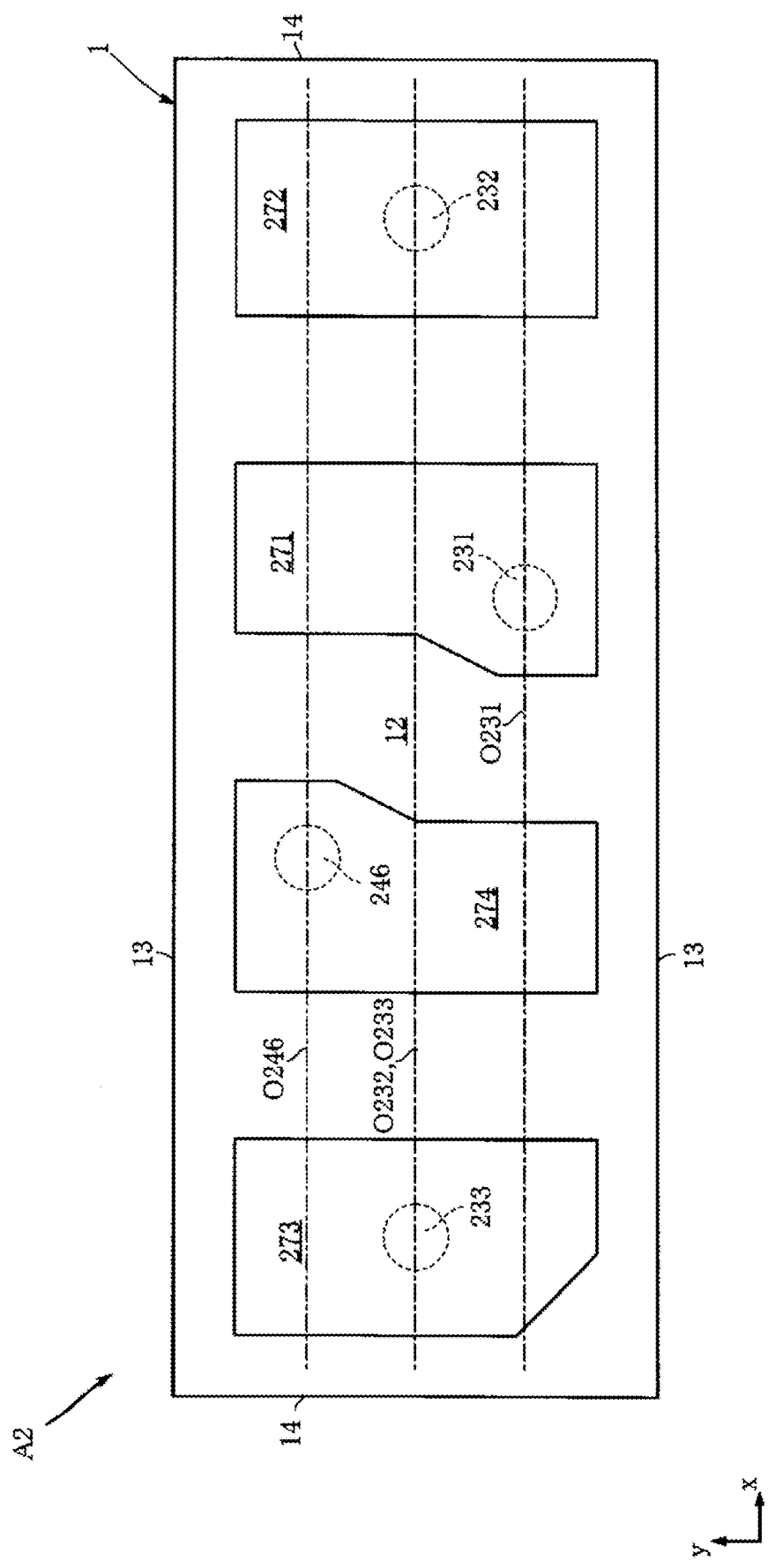
FIG. 29 is a bottom view illustrating the light emitting and receiving device according to the second embodiment of the present disclosure.
Figure 30:
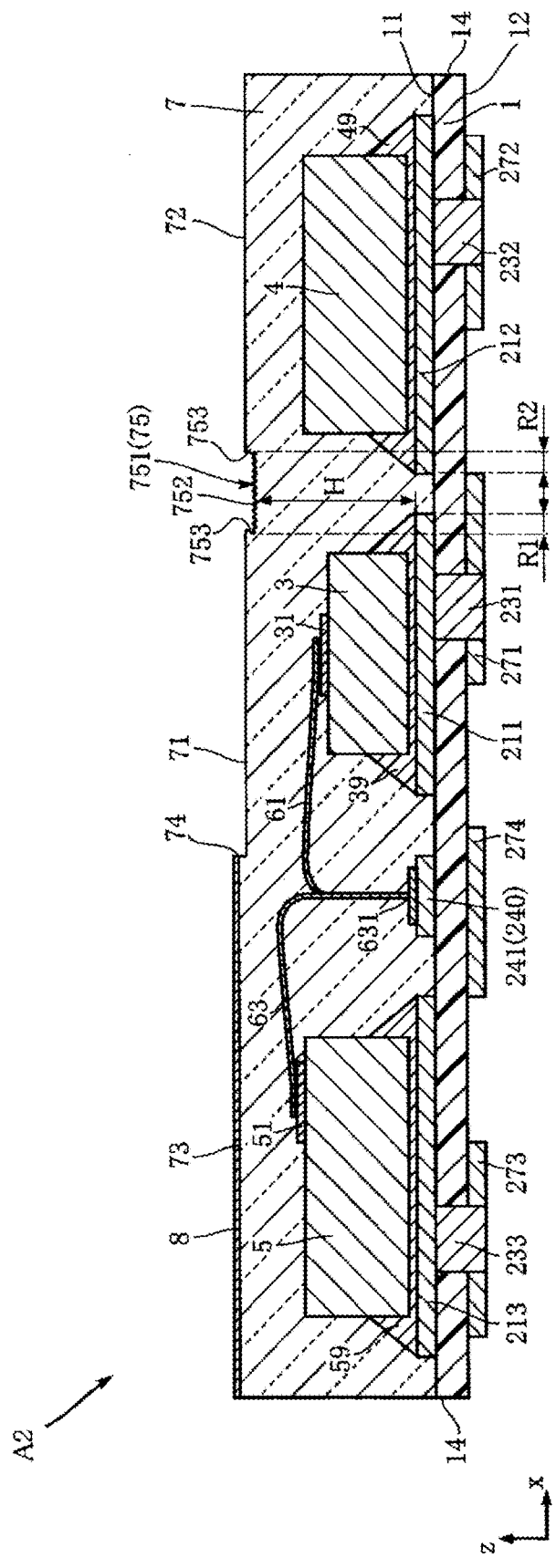
FIG. 30 is a cross-sectional view taken along a line XXX-XXX of FIG. 28.
Figure 31:
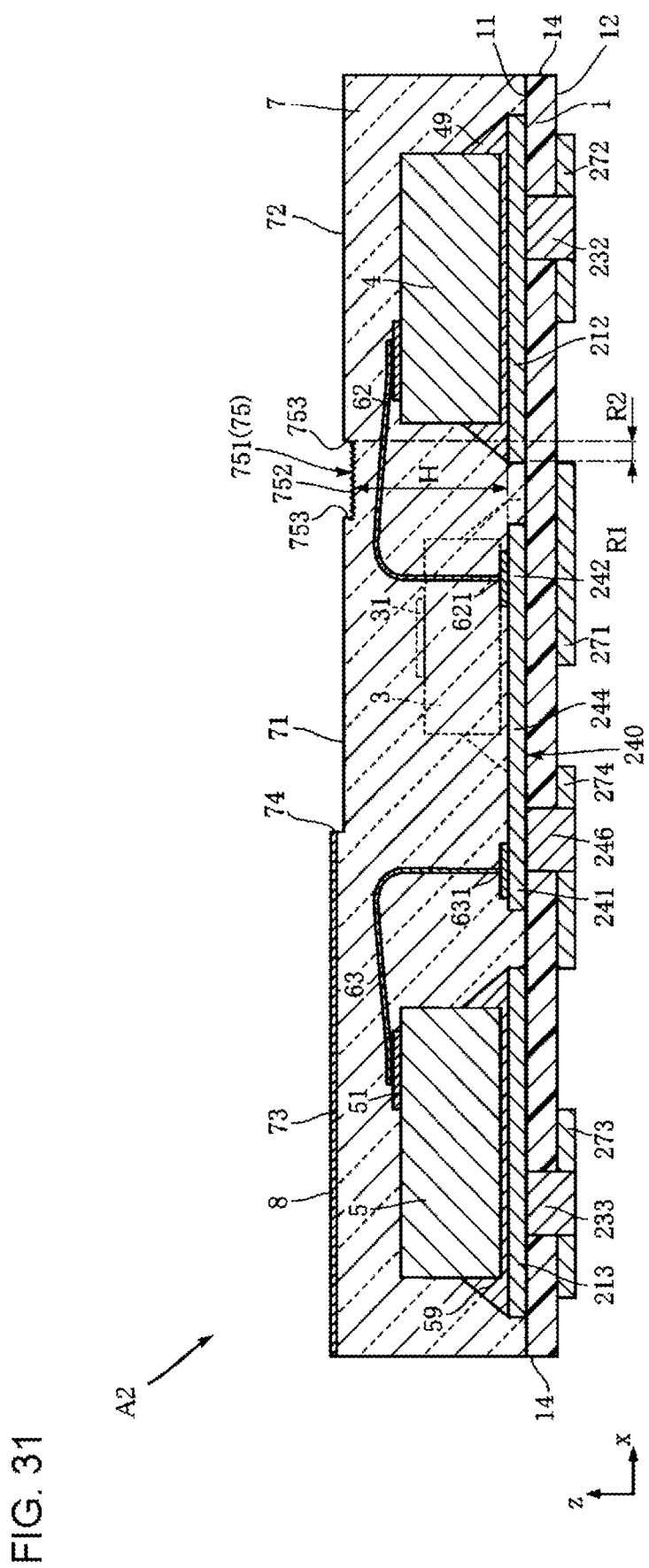
FIG. 31 is a cross-sectional view taken along a line XXXI-XXXI of FIG. 28.

FIG. 28 to FIG. 31 illustrate a light emitting and receiving device according to a second embodiment of the present disclosure. FIG. 28 is a main plan view illustrating a light emitting and receiving device A2 according to the embodiment. FIG. 29 is a bottom view illustrating the light emitting and receiving device A2. FIG. 30 is a cross-sectional view taken along a line XXX-XXX of FIG. 28. FIG. 31 is a cross-sectional view taken along a line XXXI-XXXI of FIG. 28.

In the embodiment, the common wire bonding portion 240 includes a common first portion 241, a common second portion 242, a common third portion 243, and a common fourth portion 244. The common first portion 241 is located between the first die bonding portion 211 and the third die bonding portion 213 in the x direction. In the example illustrated in the drawing, the common first portion 241 has a shape extending in the y direction. In the embodiment, the bonding portion 611 of the first wire 61 and the bonding portion 631 of the third wire 63 are formed on the common first portion 241.

The common second portion 242 is disposed at a position separated from the first die bonding portion 211 in the y direction. Further, the common second portion 242 is disposed near the second bonding portion 212 in relation to the center of the first die bonding portion 211 in the x direction. In the example illustrated in the drawing, the common second portion 242 has a substantially oval shape of which a major axis is the x direction. In the embodiment, the bonding portion 621 of the second wire 62 is formed on the common second portion 242.

The common third portion 243 is connected to one end of the common first portion 241 in the y direction. The common first portion 241 is a portion of which an area is larger than that of the common second portion 242 and has a circular shape in the example illustrated in the drawing. When viewed from the z direction, the common third portion 243 overlaps the common penetration portion 246. The common fourth portion 244 connects the common second portion 242 to the common third portion 243. In the example illustrated in the drawing, the common fourth portion 244 has a belt shape extending in the x direction.

In the embodiment, the common wire bonding portion 240 has an L shape when viewed from the z direction. The first die bonding portion 211 faces the common wire bonding portion 240 atone side in the x direction and one side in they direction. Further, a concave portion 2111 is formed in the first die bonding portion 211. The concave portion 2111 is a portion which faces the common third portion 243 of the common wire bonding portion 240 in the first die bonding portion 211 and is recessed when viewed from the z direction.

As illustrated in FIG. 29, in the embodiment, the conductive portion 2 includes a first mounting electrode 271, a second mounting electrode 272, a third mounting electrode 273, and a fourth mounting electrode 274. All of the first mounting electrode 271, the second mounting electrode 272, the third mounting electrode 273, and the fourth mounting electrode 274 are separated from the pair of side surfaces 13 and the pair of end surfaces 14 of the base material 1. In the embodiment, the first penetration portion 231, the second penetration portion 232, the third penetration portion 233, and the common penetration portion 246 are formed as a through-hole which penetrates the base material 1 and have a circular shape when viewed from the z direction. Further, in the example illustrated in the drawing, an axis O231 which is parallel to the x direction and passes through the center of the first penetration portion 231, an axis O232 which is parallel to the x direction and passes through the center of the second penetration portion 232, an axis O233 which is parallel to the x direction and passes through the center of the third penetration portion 233, and an axis O246 which is parallel to the x direction and passes through the center of the common penetration portion 246 are located at different positions in the y direction. Further, the axis O232 and the axis O233 are located at the same position in the y direction. However, the positional relationship of the axes is not limited to the relationship illustrated in the drawing.

In the example illustrated in the drawing, when viewed from the z direction, the second portion 75 overlaps the first die bonding portion 211 and the second bonding portion 212 and does not overlap the common wire bonding portion 240 in the region R1 and the region R2. However, the second portion 75 may overlap the common wire bonding portion 240. Further, the second portion 75 overlaps the second wire 62 when viewed from the z direction.

In the embodiment, the light shielding layer 8 overlaps the common wire bonding portion 240. Further, the light shielding layer 8 overlaps all of the common first portion 241 of the common wire bonding portion 240.

In the example illustrated in the drawing, the second element 4 includes a light receiving portion 42. The light receiving portion 42 is a portion which is provided in a region separated from the second electrode 41 and receives light in the photoelectric conversion function. Further, the third element 5 includes a light receiving portion 52. The light receiving portion 52 is a portion which is provided in a region separated from the third electrode 51 and receives light in the photoelectric conversion function. Furthermore, also in the above-described embodiment, portions corresponding to the light receiving portion 42 and the light receiving portion 52 are respectively provided in the second element 4 and the third element 5.

All of the bonding portion 611, the bonding portion 621, and the bonding portion 631 exist in a region of a dimension y1 in they direction. Further, the first die bonding portion 211 overlaps the bonding portion 621 and does not overlap the bonding portion 611 and the bonding portion 631 when viewed from they direction. The bonding portion 611 and the bonding portion 631 are located between the first element 3 and the third element 5 in the x direction.

Also by the embodiment, the more accurate detection function can be exhibited. Further, since the common first portion 241 of the common wire bonding portion 240 is disposed between the first element 3 and the third element 5, a distance between the first element 3 and the third element 5 is enlarged. Since the enlarged region is provided with the light shielding layer 8, it is possible to prevent a problem in which light traveling from the outside is unintentionally incident to the third element 5.

Third Embodiment

Figure 32:
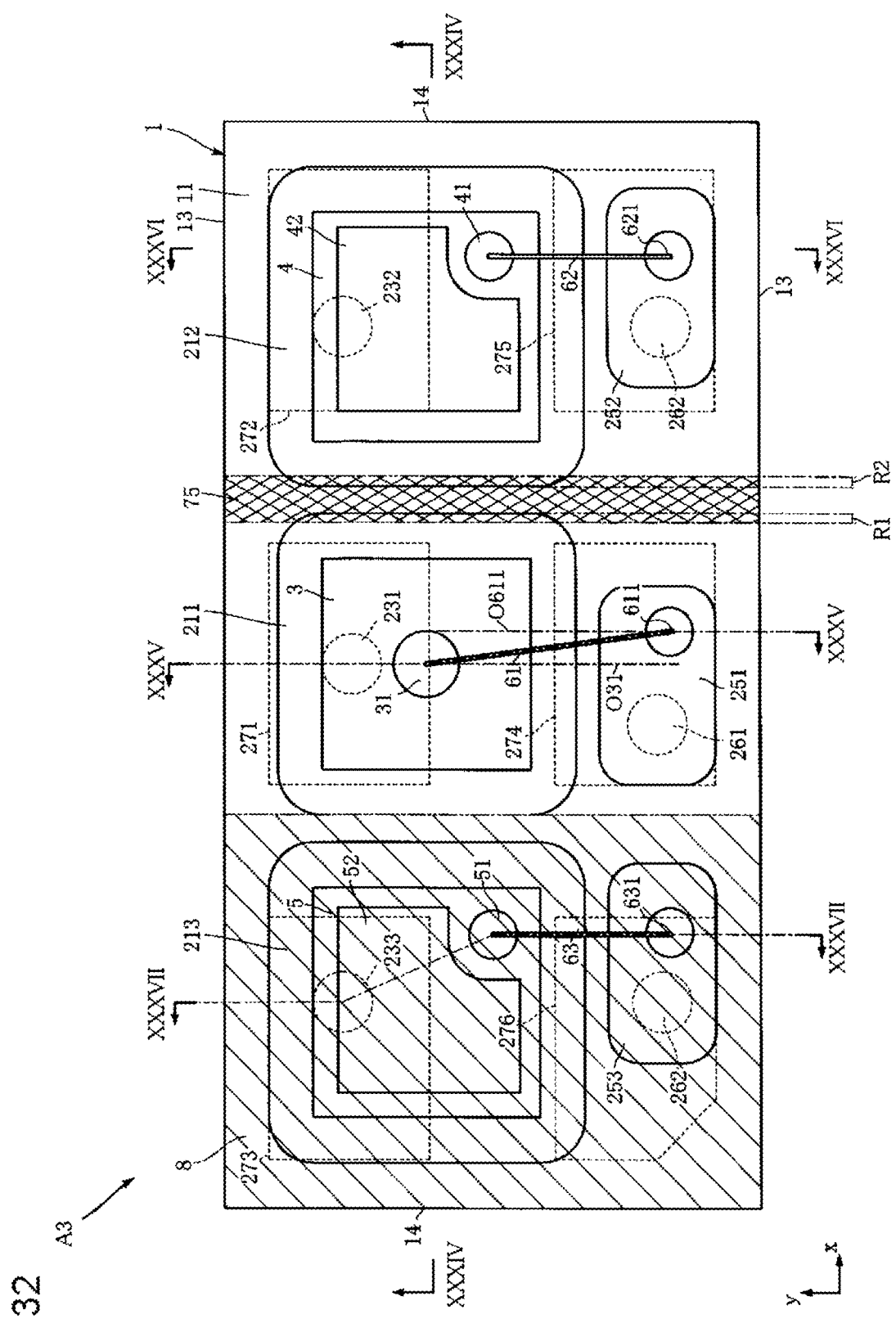
FIG. 32 is a main plan view illustrating a light emitting and receiving device according to a third embodiment of the present disclosure.
Figure 33:
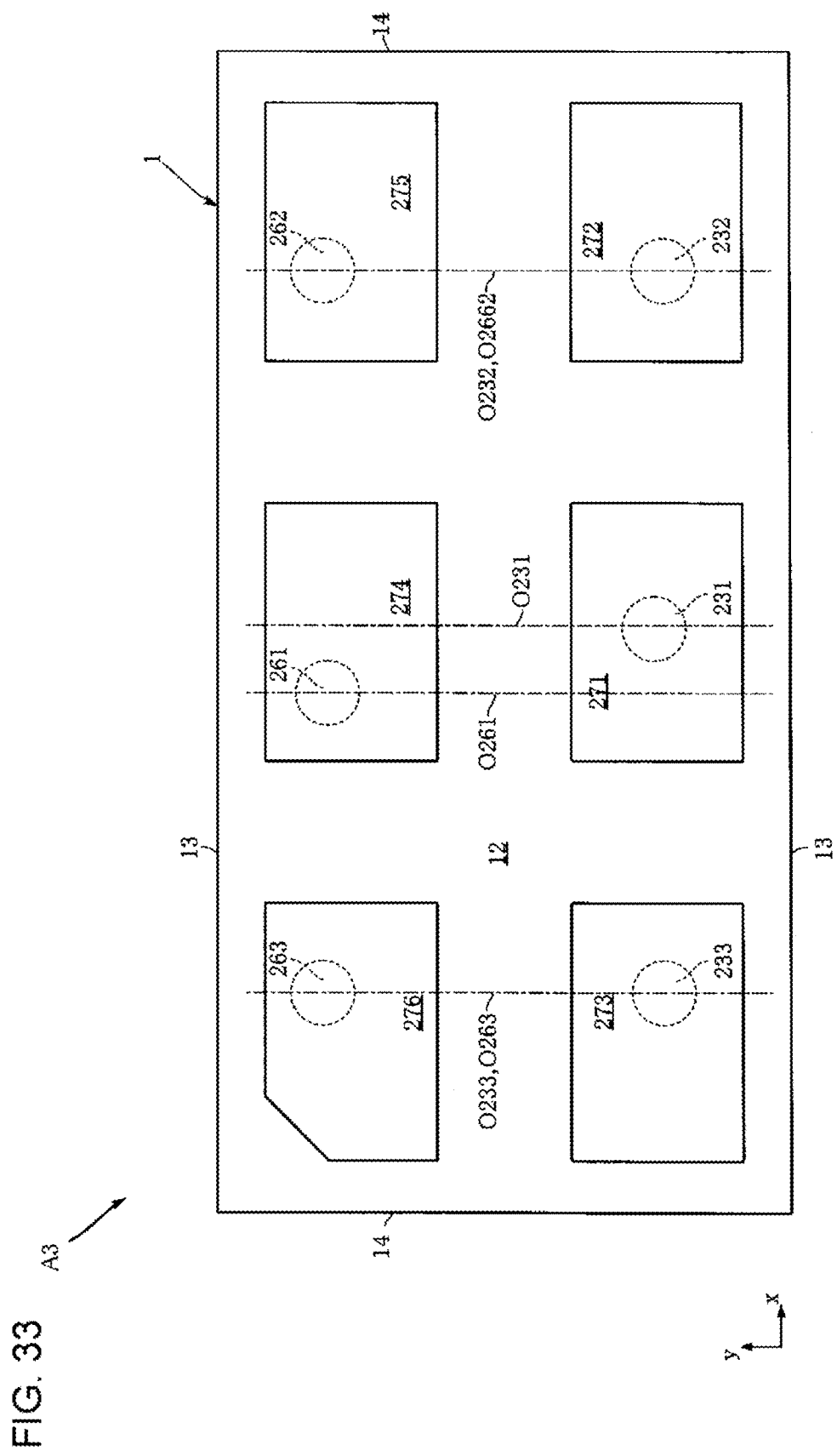
FIG. 33 is a bottom view illustrating the light emitting and receiving device according to the third embodiment of the present disclosure.
Figure 34:
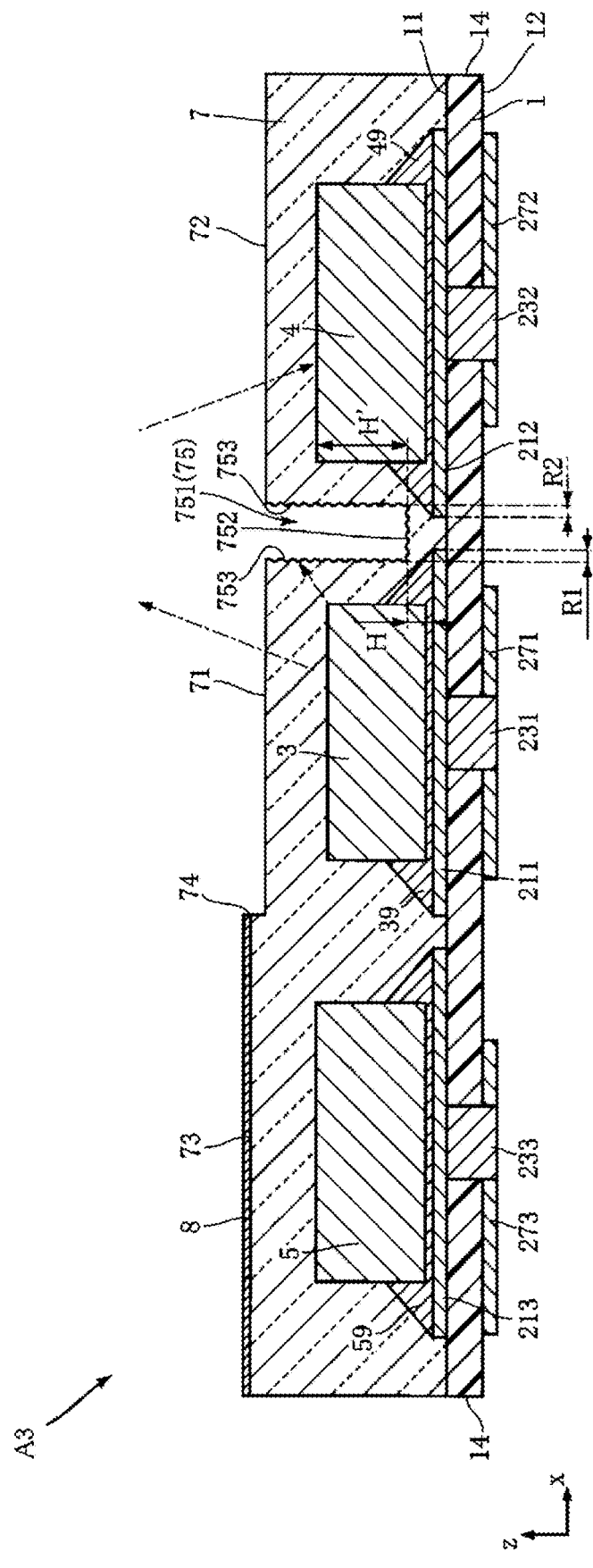
FIG. 34 is a cross-sectional view taken along a line XXXIV-XXXIV of FIG. 32.
Figure 35:
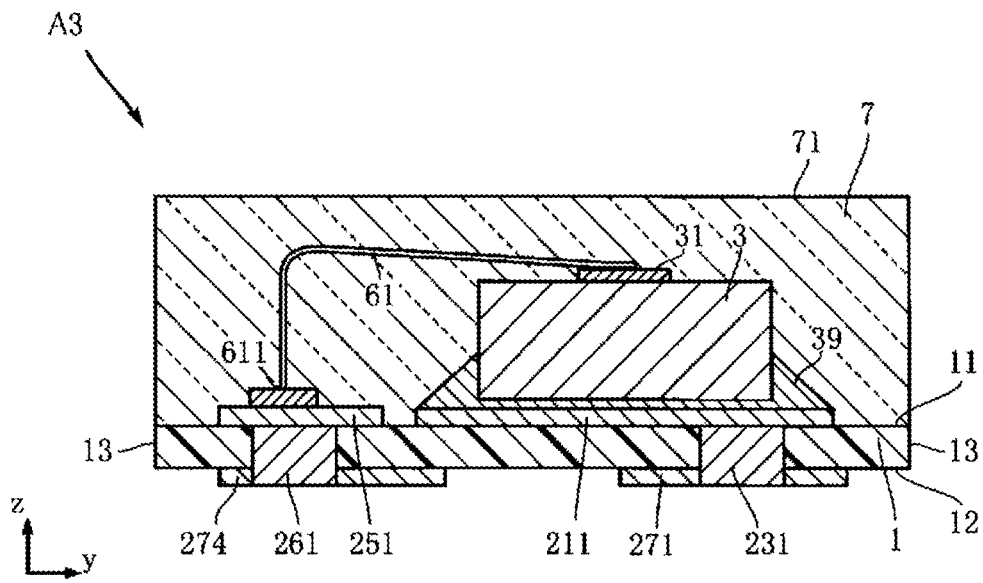
FIG. 35 is a cross-sectional view taken along a line XXXV-XXXV of FIG. 32.
Figure 36:
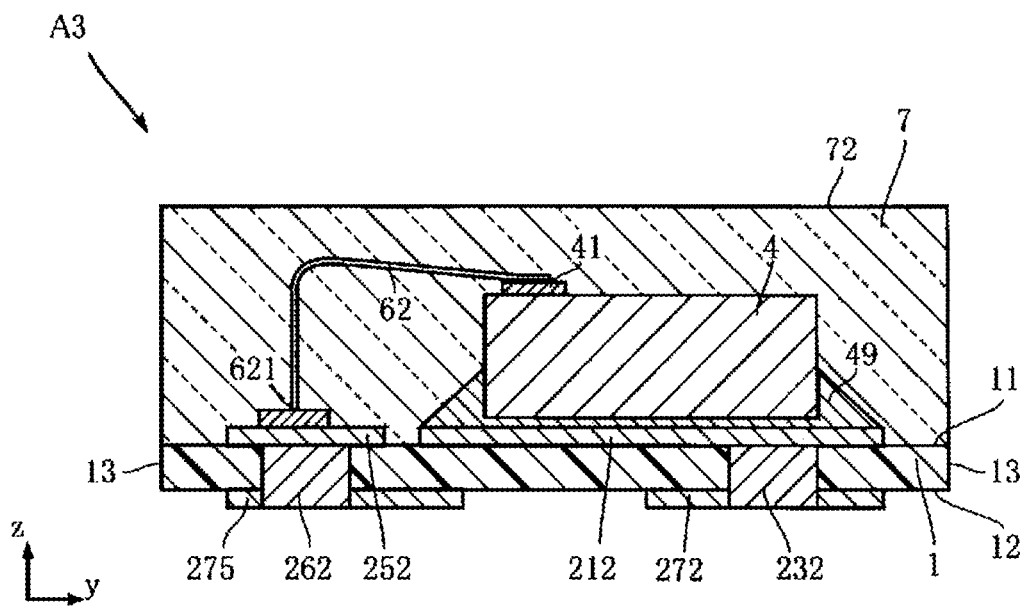
FIG. 36 is a cross-sectional view taken along a line XXXVI-XXXVI of FIG. 32.
Figure 37:
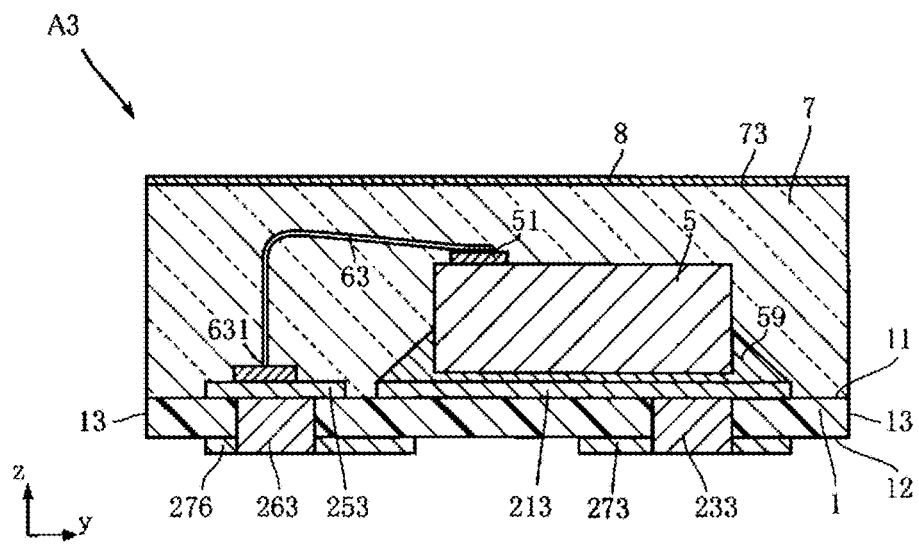
FIG. 37 is a cross-sectional view taken along a line XXXVII-XXXVII of FIG. 32.

FIG. 32 to FIG. 37 illustrate a light emitting and receiving device according to a third embodiment of the present disclosure. In a light emitting and receiving device A3 of the embodiment, a configuration of the conductive portion 2 is mainly different from that of the above-described embodiment. FIG. 32 is a main plan view illustrating the light emitting and receiving device A3. FIG. 33 is a bottom view illustrating the light emitting and receiving device A3. FIG. 34 is a cross-sectional view taken along a line XXXIV-XXXIV of FIG. 32. FIG. 35 is a cross-sectional view taken along a line XXXV-XXXV of FIG. 32. FIG. 36 is a cross-sectional view taken along a line XXXVI-XXXVI of FIG. 32. FIG. 37 is a cross-sectional view taken along a line XXXVII-XXXVII of FIG. 32.

As illustrated in FIG. 32, the conductive portion 2 of the embodiment includes a first die bonding portion 211, a second bonding portion 212, a third die bonding portion 213, a first wire bonding portion 251, a second wire bonding portion 252, and a third wire bonding portion 253. These are formed on the main surface 11 of the base material 1.

The first wire bonding portion 251 is arranged side by side at one side of the y direction with respect to the first die bonding portion 211. The second wire bonding portion 252 is arranged side by side at one side of the y direction with respect to the second bonding portion 212. The third wire bonding portion 253 is arranged side by side at one side of the y direction with respect to the third die bonding portion 213. All of the first wire bonding portion 251, the second wire bonding portion 252, and the third wire bonding portion 253 are separated from the side surface 13 and the end surface 14. The shapes of the first wire bonding portion 251, the second wire bonding portion 252, and the third wire bonding portion 253 are not particularly limited and are substantially rectangular shapes in the example illustrated in the drawing.

As illustrated in FIG. 33, the conductive portion 2 of the embodiment includes a first mounting electrode 271, a second mounting electrode 272, a third mounting electrode 273, a fourth mounting electrode 274, a fifth mounting electrode 275, and a sixth mounting electrode 276. These are formed on the rear surface 12 of the base material 1.

The first mounting electrode 271, the second mounting electrode 272, and the third mounting electrode 273 are arranged side by side in the x direction. The fourth mounting electrode 274, the fifth mounting electrode 275, and the sixth mounting electrode 276 are arranged side by side in the x direction. All of the first mounting electrode 271, the second mounting electrode 272, the third mounting electrode 273, the fourth mounting electrode 274, the fifth mounting electrode 275, and the sixth mounting electrode 276 are separated from the side surface 13 and the end surface 14. As illustrated in FIG. 32, the first mounting electrode 271, the second mounting electrode 272, the third mounting electrode 273, the fourth mounting electrode 274, the fifth mounting electrode 275, and the sixth mounting electrode 276 individually overlap the first die bonding portion 211, the second bonding portion 212, the third die bonding portion 213, the first wire bonding portion 251, the second wire bonding portion 252, and the third wire bonding portion 253 when viewed from the z direction.

In the embodiment, the conductive portion 2 includes a first penetration portion 231, a second penetration portion 232, a third penetration portion 233, a fourth penetration portion 261, a fifth penetration portion 262, and a sixth penetration portion 263. These penetrate the base material 1 in the z direction.

The first penetration portion 231 is connected to the first die bonding portion 211 and the first mounting electrode 271. The second penetration portion 232 is connected to the second bonding portion 212 and the second mounting electrode 272. The third penetration portion 233 is connected to the third die bonding portion 213 and the third mounting electrode 273. The fourth penetration portion 261 is connected to the first wire bonding portion 251 and the first mounting electrode 271. The fifth penetration portion 262 is connected to the second wire bonding portion 252 and the second mounting electrode 272. The sixth penetration portion 263 is connected to the third wire bonding portion 253 and the third mounting electrode 273. Further, in the example illustrated in the drawing, an axis O231 which is parallel to the y direction and passes through the center of the first penetration portion 231, an axis O261 which is parallel to the y direction and passes through the center of the fourth penetration portion 261, an axis O232 which is parallel to the y direction and passes through the center of the second penetration portion 232, an axis O275 which is parallel to the y direction and passes through the center of the fifth mounting electrode 275, an axis O233 which is parallel to the y direction and passes through the center of the third penetration portion 233, and an axis O276 which is parallel to the y direction and passes through the center of the sixth mounting electrode 276 are located at different positions in the x direction. Further, the axis O232 and the axis O275 are located at the same position in the x direction. Further, the axis O233 and the axis O276 are located at the same position in the x direction. However, the positional relationship of the axes is not limited to the relationship illustrated in the drawing.

The first wire 61 is bonded to the first electrode 31 of the first element 3 and the first wire bonding portion 251. The second wire 62 is bonded to the second electrode 41 of the second element 4 and the second wire bonding portion 252. The third wire 63 is bonded to the third electrode 51 of the third element 5 and the third wire bonding portion 253. An axis O31 which is parallel to the y direction and passes through the center of the first electrode 31 and an axis O611 which is parallel to the y direction and passes through the center of the bonding portion 611 are located at different positions in the x direction. However, the positional relationship of the axes is not limited to the relationship illustrated in the drawing.

The second portion 75 overlaps the first die bonding portion 211 and the second bonding portion 212 of the region R1 and the region R2 when viewed from the z direction, but the arrangement of the second portion 75 is not limited thereto. As illustrated in FIG. 34, the second portion 75 includes a bottom surface 752 and a pair of side surfaces 753. The bottom surface 752 is located in the vicinity of the main surface 11 of the base material 1 in the z direction in relation to the upper surfaces of the first element 3 and the second element 4 in the z direction. For example, the second portion 75 is located at a position lower than the upper surface of the second element 4 in the z direction by a height H'.

Also by the embodiment, the more accurate detection function can be exhibited. Further, as understood from the embodiment, a detailed circuit configuration including the first element 3, the second element 4, and the third element 5 is not limited as long as the first element 3, the second element 4, and the third element 5 are appropriately operated. Further, the second portion 75 does not intersect any one of the first wire 61, the second wire 62, and the third wire 63 when viewed from the z direction. Accordingly, the second portion 75 can be formed at the deeper position when the second portion 75 has a groove shape. This is desirable to prevent the second element 4 from receiving unintended light.

Fourth Embodiment

Figure 38:
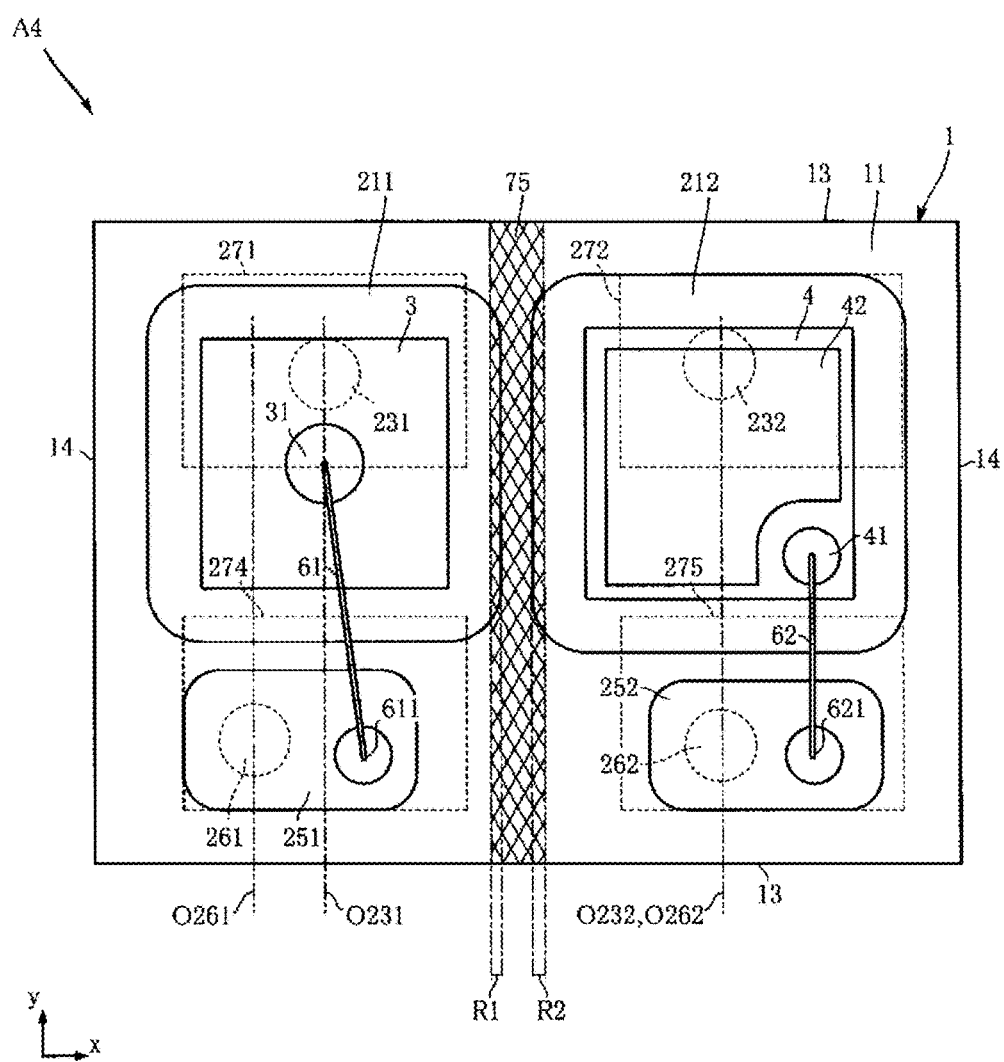
FIG. 38 is a main plan view illustrating a light emitting and receiving device according to a fourth embodiment of the present disclosure.

FIG. 38 is a main plan view illustrating alight emitting and receiving device according to a fourth embodiment of the present disclosure. A light emitting and receiving device A4 of the embodiment is different from that of the above-described embodiment in that the third element 5 and the light shielding layer 8 are not provided. A configuration of the first element 3 and the second element 4 or a component relationship of the first element 3, the second element 4, and the conductive portion 2 is the same as that of the light emitting and receiving device A3.

Further, in the example illustrated in the drawing, an axis O231 which is parallel to the y direction and passes through the center of the first penetration portion 231, an axis O261 which is parallel to the y direction and passes through the center of the fourth penetration portion 261, an axis O232 which is parallel to the y direction and passes through the center of the second penetration portion 232, and an axis O262 which is parallel to the y direction and passes through the center of the fifth penetration portion 262 are located at different positions in the x direction. Further, the axis O232 and the axis O262 are located at the same position in the x direction. However, the positional relationship of the axes is not limited to the relationship illustrated in the drawing.

Also by the embodiment, it is possible to prevent a problem in which light emitted from the first element 3 is reflected from the surface of the sealing resin 7 and is unintentionally received by the second element 4.

First Modified Example of Fourth Embodiment

Figure 39:
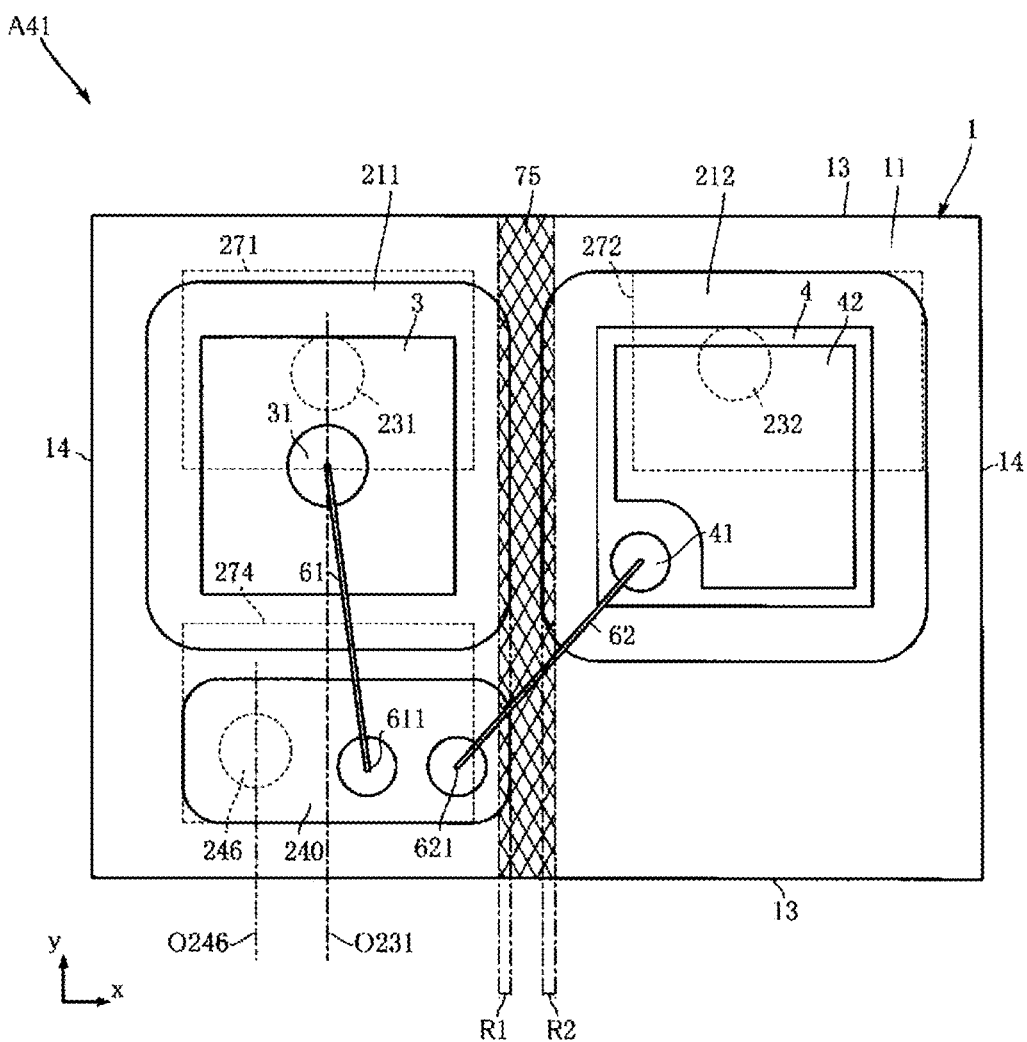
FIG. 39 is a main plan view illustrating a first modified example of the light emitting and receiving device according to the fourth embodiment of the present disclosure.

FIG. 39 illustrates a first modified example of the light emitting and receiving device A4. In a light emitting and receiving device A41 of the modified example, the conductive portion 2 includes a common wire bonding portion 240. The first wire 61 and the second wire 62 are bonded to the common wire bonding portion 240. Further, the second portion 75 overlaps the second wire 62 when viewed from the z direction.

Further, in the example illustrated in the drawing, an axis O231 which is parallel to the y direction and passes through the center of the first penetration portion 231 and an axis O246 which is parallel to the y direction and passes through the center of the common penetration portion 246 are located at different positions in the x direction. However, the positional relationship of the axes is not limited to the relationship illustrated in the drawing.

Second Modified Example of Fourth Embodiment

Figure 40:
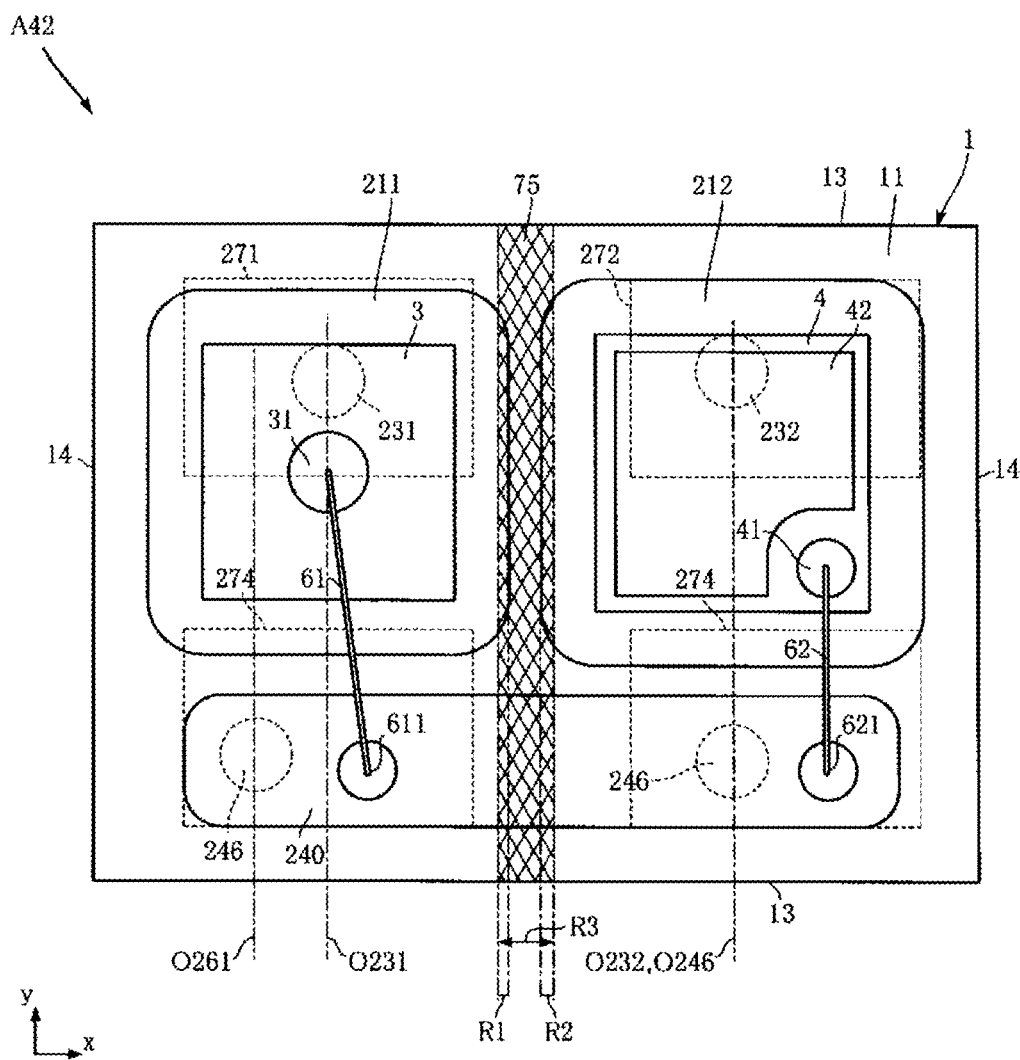
FIG. 40 is a main plan view illustrating a second modified example of the light emitting and receiving device according to the fourth embodiment of the present disclosure.

FIG. 40 illustrates a first modified example of the light emitting and receiving device A4.

In a light emitting and receiving device A42 of the modified example, the common wire bonding portion 240 intersects the second portion 75 when viewed from the z direction and is provided at both sides of the second portion 75 in the x direction. The bonding portion 611 and the bonding portion 621 are respectively disposed at both sides of the second portion 75 in the x direction. The second portion 75 does not intersect the first wire 61 and the second wire 62 when viewed from the z direction.

Further, in the example illustrated in the drawing, an axis O231 which is parallel to the y direction and passes through the center of the first penetration portion 231, an axis O246 which is parallel to the y direction and passes through the center of the common penetration portion 246, an axis O232 which is parallel to the y direction and passes through the center of the second penetration portion 232, and an axis O246 which passes through the center of the common penetration portion 246 are located at different positions in the x direction. Further, the axis O232 and the axis O246 are located at the same position in the x direction. However, the positional relationship of the axes is not limited to the relationship illustrated in the drawing.

The light emitting and receiving device according to the present disclosure is not limited to the above-described embodiment. A detailed configuration of each unit of the light emitting and receiving device according to the present disclosure can be designed variously.

The partial configurations of the components of the above-described embodiments and modified examples may be employed independently or in various combinations. As the partial configurations, for example, the existence of the light shielding layer 8 and the detailed configuration thereof, the existence of the first portion 74 and the detailed configuration of the first portion 74, the existence of the second portion 75 and the detailed configuration thereof, and the detailed configurations of the base material 1 and the conductive portion 2 are exemplified.

Drive Circuit

Next, the light emitting and receiving device according to the above-described embodiments or modified examples or the control circuit for driving the light emitting and receiving device will be described.

Figure 41:
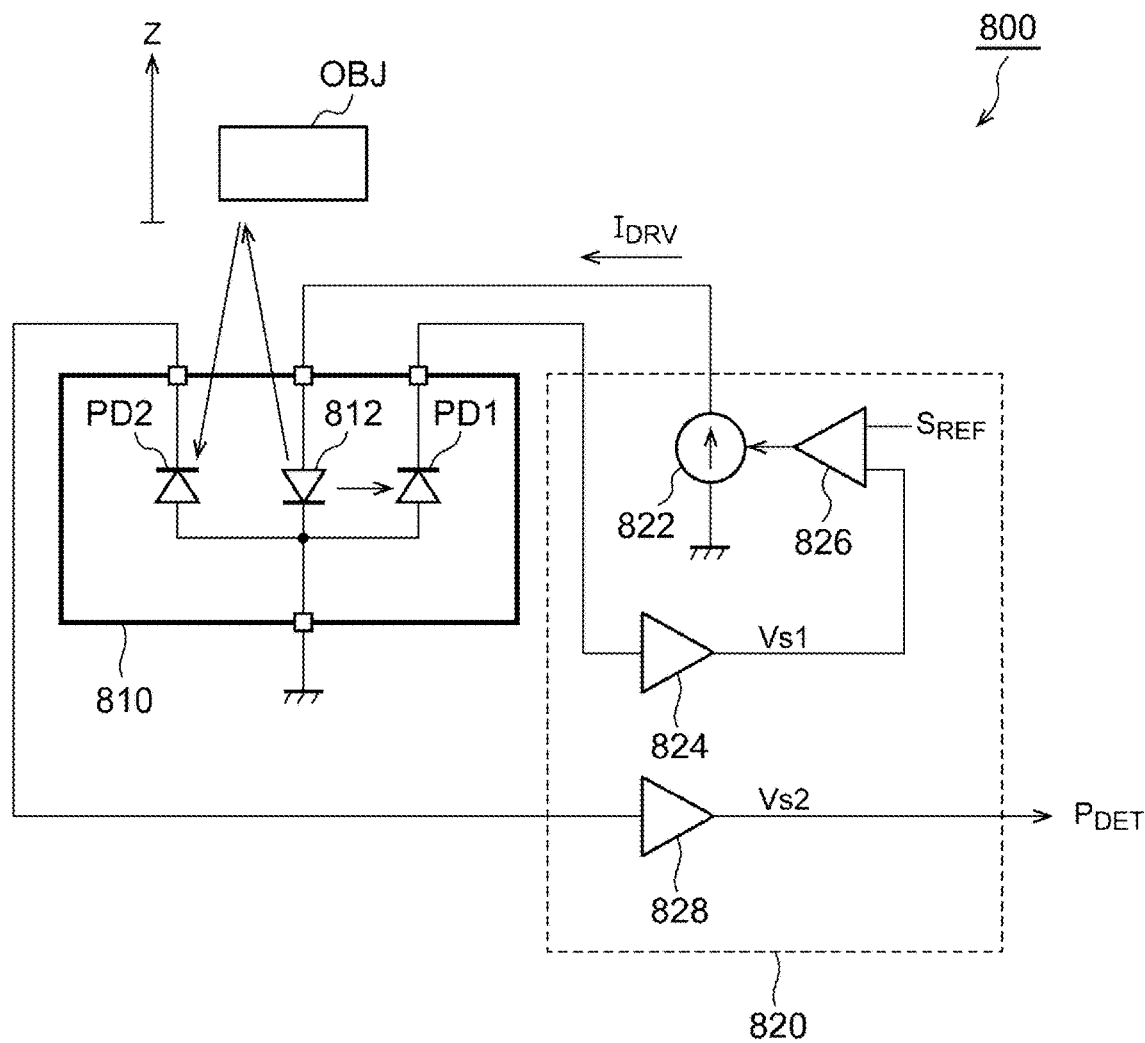
FIG. 41 is a block diagram of a position detection system.

FIG. 41 is a block diagram of a position detection system 800. The position detection system 800 generates a position detection signal $P_{DET}$ which indicates a position z of a position detection object OBJ.

The position detection system 800 includes alight emitting and receiving device 810 and a control circuit 820. The light emitting and receiving device 810 includes alight emitting element 812, a first light receiving element PD1, and a second light receiving element PD2. The light emitted from the light emitting element 812 is irradiated to the object OBJ. Only light emitted from the light emitting element 812 can be incident to the first light receiving element PD1 and the light reflected from the object OBJ is shielded so as not to be incident. The output signal (the detection current) of the first light receiving element PD1 does not depend on the position z of the object OBJ but depends on the output intensity of the light emitting element 812.

The control circuit 820 controls the light emitting and receiving device 810 to detect the position z of the object OBJ. The control circuit 820 includes a current driver 822, a sense amplifier 824, an error amplifier 826, and a sense amplifier 828.

The current driver 822 supplies a direct current (DC) drive current $I_{DRV}$ to the light emitting element 812 so that the light emitting element 812 emits light in response to the luminance corresponding to the drive current $I_{DRV}$.

The sense amplifier 824 generates a first detection signal Vs1 in response to the output signal of the first light receiving element PD1. The first detection signal Vs1 indicates the light emission luminance of the light emitting element 812.

A target value $S_{REF}$ of the light emission luminance of the light emitting element 812 is input to the error amplifier 826. The error amplifier 826 performs feedback control on the output $I_{DRV}$ of the current driver 822 so that the first detection signal Vs1 approaches the target value $S_{REF}$.

Only the reflected light of the object OBJ can be incident to the second light receiving element PD2 and the light receiving amount of the second light receiving element PD2 changes in response to the position z of the object OBJ. That is, the output signal of the second light receiving element PD2 indicates the position z of the object OBJ. The sense amplifier 828 generates the second detection signal Vs2 in response to the output signal of the second light receiving element PD2. In addition, the control circuit 820 can output the position detection signal $P_{DET}$ in response to the second detection signal Vs2.

FIG. 42A is a diagram describing an operation of the position detection system 800 of FIG. 41. The drive current $I_{DRV}$ is stabilized to a target amount $I_{REF}$ (for example, about 30 mA) corresponding to the target value $S_{REF}$ by the feedback control of the error amplifier 826 and the current driver 822 and the light emission luminance of the light emitting element 812 is also kept constant. When the position z of the object OBJ changes in this state, the amount of the reflected light of the object OBJ incident to the second light receiving element PD2 changes and hence the second detection signal Vs2 changes. FIG. 42B is a diagram illustrating a relationship between the position z and the second detection signal Vs2. In the range of $z_1$ to $z_2$ of the position z, the second detection signal Vs2 changes monotonously and hence the second detection signal Vs2 can be correlated with the position z one to one.

In the position detection system 800 of FIG. 41, an S/N ratio of the position detection is determined in response to the amount of the drive current $I_{DRV}$. Thus, it is desirable to increase the drive current $I_{DRV}$ in order to increase the S/N ratio, but power consumption increases when the drive current $I_{DRV}$ is too large. Further, since the heat dissipation amount increases, the cost of heat dissipation measures increases.

FIG. 42C is a diagram describing another operation of the position detection system 800 of FIG. 41. In this operation, the drive current $I_{DRV}$ is turned on and off in a time division manner and the position z of the object OBJ is detected during the detection period in an on state. Since it is possible to increase the current amount during an on period while minimizing the average amount of the drive current $I_{DRV}$, it is possible to increase the S/N ratio. However, since it is not possible to detect the position in the off section $T_{OFF}$ of the drive current $I_{DRV}$, temporal resolution decreases.

Hereinafter, a control circuit and a control method capable of obtaining a high S/N ratio while minimizing the drive current $I_{DRV}$ will be described.

Figure 43:
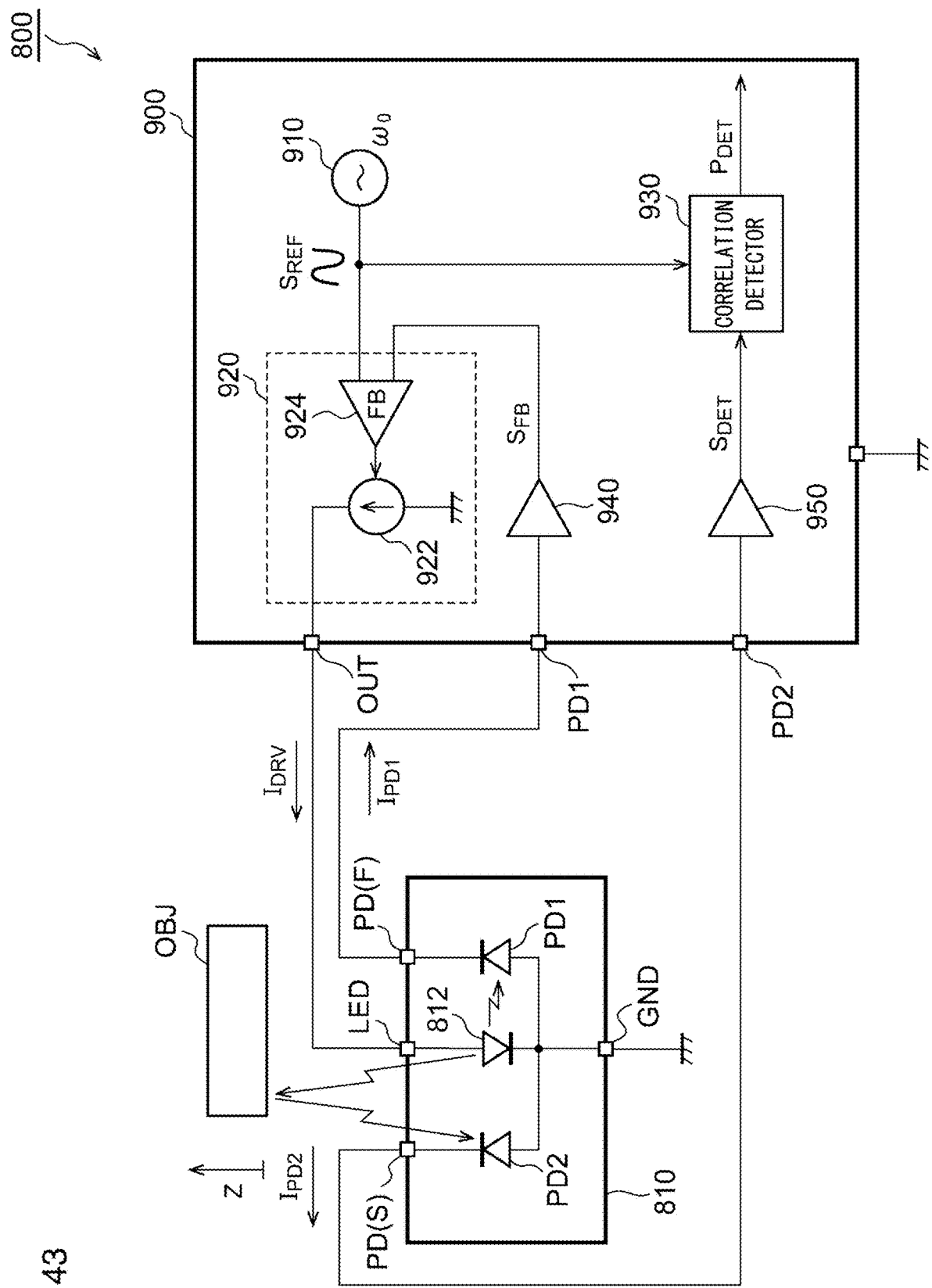
FIG. 43 is a circuit diagram of the position detection system including with a control circuit according to the embodiment.

FIG. 43 is a circuit diagram of a position detection system 800 including a control circuit 900 according to an embodiment. The position detection system 800 includes the light emitting and receiving device 810 and the control circuit 900. A configuration of the light emitting and receiving device 810 is the same as that of FIG. 41.

The control circuit 900 is a function IC which includes a reference signal generator 910, a drive circuit 920, a correlation detector 930, a first detection circuit 940, and a second detection circuit 950 and is integrated with one semiconductor substrate (a chip, a die).

The control circuit 900 includes an output (OUT) pin, a ground (GND) pin, a feedback (PD1) pin, and a sense (PD2) pin. The OUT pin is connected to an anode pin (LED) of the light emitting element 812 of the light emitting and receiving device 810, the GND pin is grounded, the PD1 pin is connected to a cathode pin PD(F) of the first light receiving element PD1 of the light emitting and receiving device 810, and a pin of the second light receiving element PD2 is connected to a cathode pin PD(S) of the second light receiving element PD2 of the light emitting and receiving device 810.

The reference signal generator 910 generates a reference signal $S_{REF}$ including a component of a predetermined reference frequency wo. It is desirable that the reference frequency $f_0$ ($=\omega_0/2\pi$) be ten times larger than a servo band. The first detection circuit 940 generates a first detection signal (a feedback signal) $S_{FB}$ in response to an output current $I_{PD1}$ of the first light receiving element PD1. Further, the second detection circuit 950 generates a second detection signal $S_{DET}$ in response to an output current $I_{PD2}$ of the second light receiving element PD2. Each of the first detection circuit 940 and the second detection circuit 950 may include an IV converter (a transimpedance amplifier) which converts a current signal into a voltage signal.

The drive circuit 920 generates a drive signal $I_{DR}V$ so that a feedback signal $S_{FB}$ corresponding to the output $I_{PD1}$ of the first light receiving element PD1 matches the reference signal $S_{REF}$ and supplies the drive signal to the light emitting element 812. The drive circuit 920 includes a current driver 922 and a feedback circuit 924. The feedback circuit 924 adjusts the current driver 922 so that an error of the feedback signal $S_{FB}$ and the reference signal $S_{REF}$ becomes zero. Accordingly, the light emission luminance of the light emitting element 812 changes in response to the reference signal $S_{REF}$. When an analog circuit is mounted on the feedback circuit 924, the feedback circuit can be configured as an error amplifier (an operational amplifier). Further, when a digital circuit is mounted on the feedback circuit, the feedback circuit can be configured as a subtractor which generates an error of the feedback signal $S_{FB}$ and the reference signal $S_{REF}$ and an PI (proportional/integral) controller or a PID (proportional/integral/differential) controller which processes an error.

The correlation detector 930 detects the second detection signal $S_{DET}$ generated by the second detection circuit 950 by correlating with a component of the reference frequency wo included in the reference signal $S_{REF}$ and generates the position detection signal $P_{DET}$.

The above-described configuration is the configuration of the control circuit 900. Next, the operation will be described.

Figure 44:
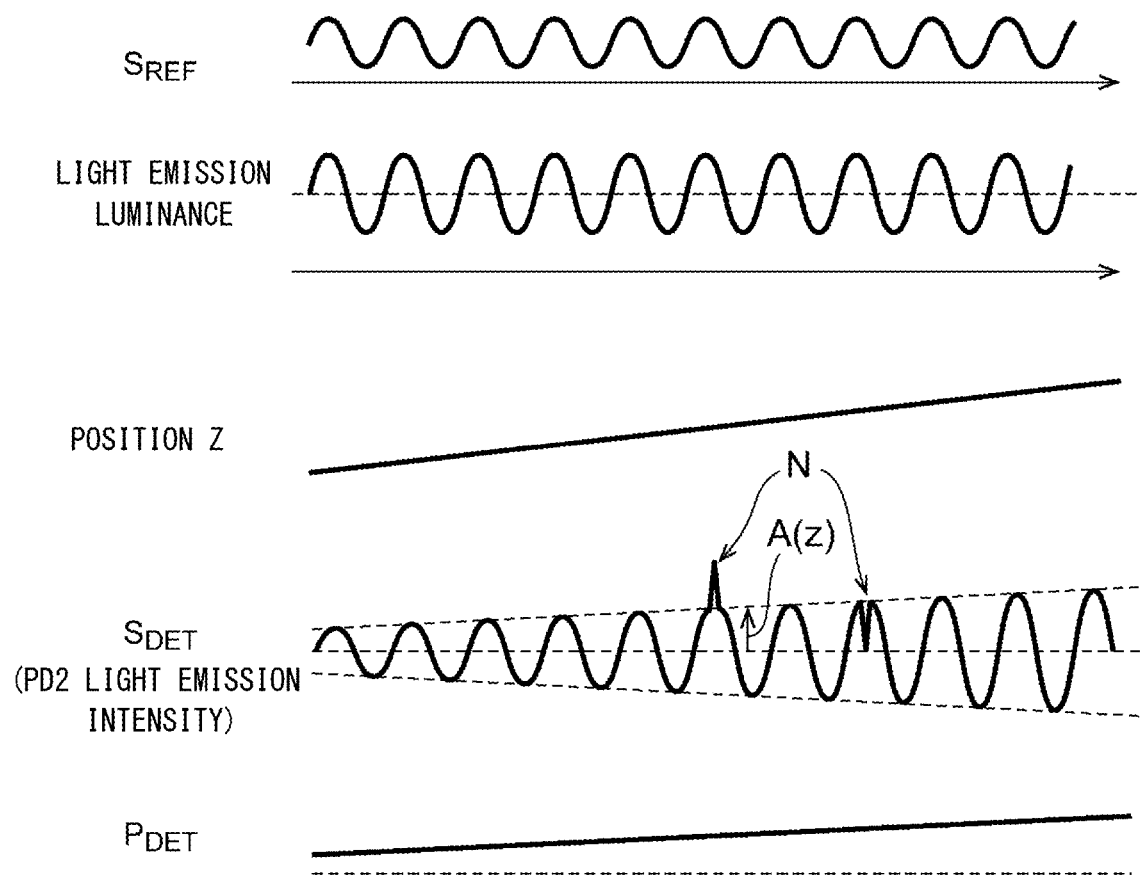
FIG. 44 is a diagram describing an operation of the position detection system of FIG. 43.

FIG. 44 is a diagram describing an operation of the position detection system 800 of FIG. 43. The reference signal $S_{REF}$ has a waveform in which a sine wave of a predetermined frequency is superimposed on a DC baseline. Due to the feedback control of the drive circuit 920, the light emission luminance of the light emitting element 812 has a waveform corresponding to the reference signal $S_{REF}$.

In order to stabilize a feedback loop, it is desirable to operate the light emitting element 812 in a region having high linearity of the light emission luminance with respect to the drive current $I_{DRV}$. In this viewpoint, the light emitting element 812 is turned off when the drive current $I_{DR}V$ falls below a certain threshold value. Therefore, it is desirable to generate the reference signal $S_{REF}$ so that the bottom of the drive current $I_{DR}V$ does not become zero, that is, the reference signal becomes higher than the light emission threshold. For example, when the light emission threshold of the light emitting element 812 is 0.5 mA, the bottom of the drive current $I_{DRV}$ may be 1 mA in consideration of a margin and the drive current $I_{DRV}$ may be changed in the range of 1 mA to 3 mA with 2 mA as a center. Here, this is about 1/10 times $I_{REF}$=30 mA of FIG. 42A.

The light intensity $I_2(t)$ incident to the second light receiving element PD2 can be expressed by the following equation.

$$I_2(t)=A(z)\times I_1(t)$$

$I_1(t)$ indicates the light emission intensity of the light emitting element 812 and is expressed by $I_1=I_0+\cos(\omega_0 t)$. $A(z)$ indicates a modulation signal depending on the position z and the incident light intensity $I_2(t)$ of the second light receiving element PD2 is recognized as an AM (amplitude modulation) wave using cos(coot) as a carrier. $f_0=\omega_0/2\pi$ may be defined in response to the servo band and may be set to desirably 10 times or more and more desirably 20 times the servo band. When the servo band is 200 Hz, $f_0=10$ kHz may be used.

The correlation detector 930 detects the second detection signal $S_{DET}$ by using a component of a predetermined reference frequency wo included in the reference signal $S_{DET}$ and generates a position detection signal $P_{DET}$ indicating an amplitude modulation component A(z).

The above-described operation is the operation of the control circuit 900. According to the control circuit 900, it is possible to reduce the average value of the drive current $I_{DR}V$ by using a sine wave in the drive current $I_{DRV}$.

In addition, as illustrated in FIG. 44, there is a case in which noise N is mixed with the second detection signal $S_{DET}$. In many cases, since the frequency of the noise N is different from $\omega_0$, the noise can be appropriately removed by the correlation detector 930. According to the control circuit 900, it is possible to increase an S/N ratio by using a correlation detection.

From a different viewpoint, since the amount of the drive current $I_{DR}V$ necessary to obtain the same S/N ratio can be decreased as compared with the related art, power consumption can be decreased.

Figure 45:
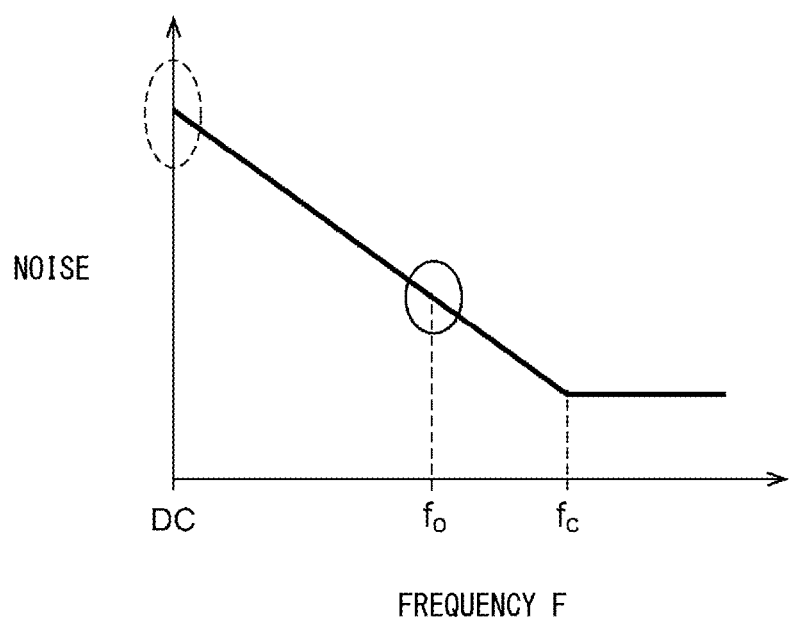
FIG. 45 is a diagram illustrating a frequency characteristic of flicker noise.

Further, the control circuit 900 has an advantage that the resistance of flicker noise is high. FIG. 45 is a diagram illustrating a frequency characteristic of flicker noise. The flicker noise is also referred to as 1/f noise and the power is inversely proportional to the frequency. In the method illustrated in FIG. 42A and FIG. 42B, since the operation is performed in a region indicated by a dashed line of FIG. 45, an influence of flicker noise easily occurs. In contrast, in the embodiment, since an operation is performed in a frequency region surrounded by a solid line corresponding to the frequency $f_0=\omega_0/2\pi$, flicker noise can be reduced. When the reduction of flicker noise is considered, it is desirable that the operation frequency $f_0=\omega_0/2\pi$ be closer to 1/f corner frequency fc.

Figure 46:
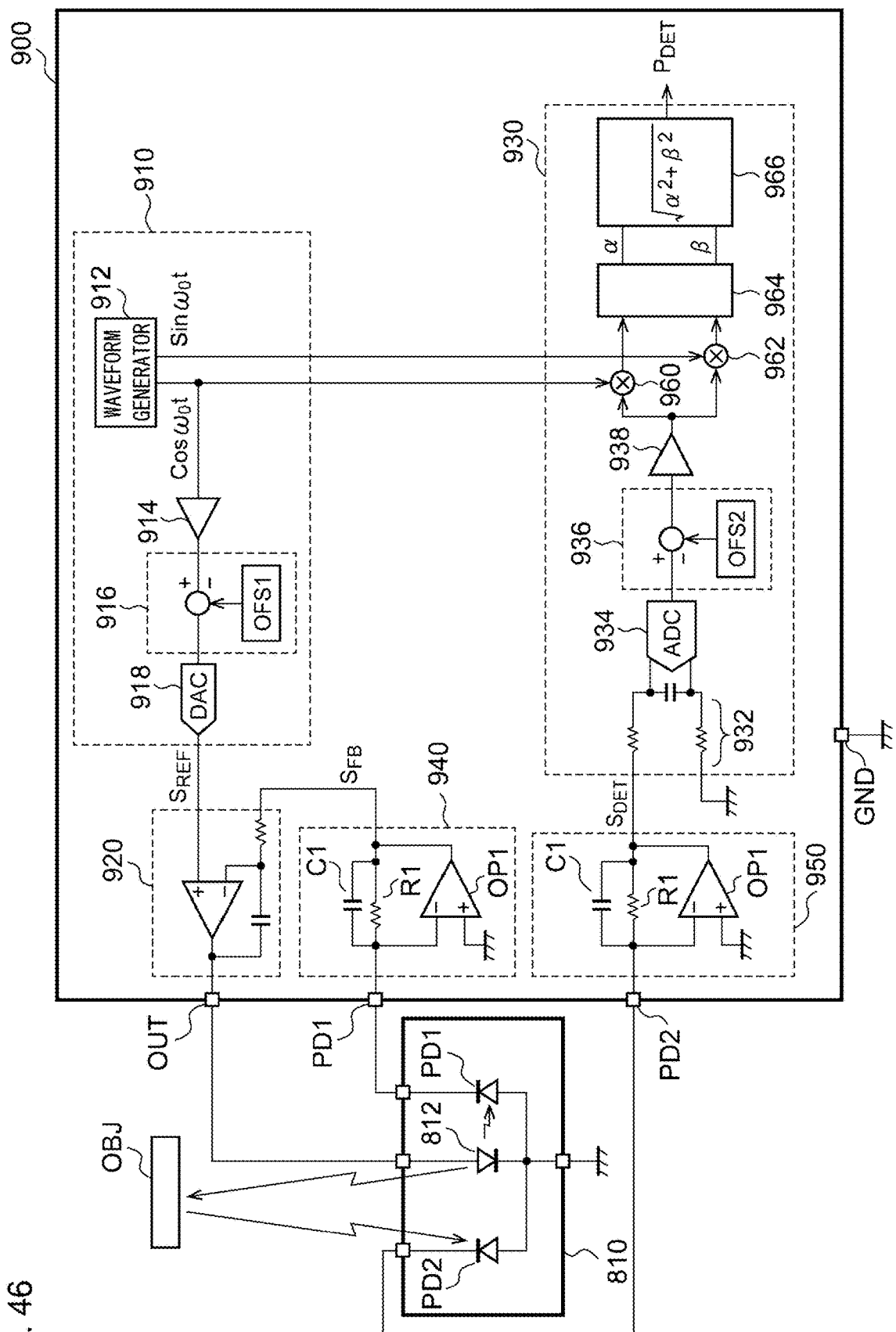
FIG. 46 is a circuit diagram illustrating an embodiment of a control circuit.

FIG. 46 is a circuit diagram illustrating an embodiment of the control circuit 900. The control circuit 900 is configured as a hybrid of a front end analog circuit and a back end digital circuit.

Each of the first detection circuit 940 and the second detection circuit 950 is configured as a transimpedance amplifier and includes an operational amplifier OP1, a resistor R1, and a capacitor C1.

The reference signal generator 910 includes a waveform generator 912, a gain circuit 914, an offset circuit 916, and a D/A converter 918. The waveform generator 912 generates a sine wave sin $\omega_0$t and a cosine wave cos Coot including a predetermined frequency $\omega_0$ and uses one (in this example, cos $\omega_0$t) to generate the reference signal $S_{REF}$. The gain circuit 914 sets an amplitude of the cosine wave cos $\omega_0$t. The offset circuit 916 adds an offset OFS1 to the cosine wave $\omega_0$t and the D/A converter 918 converts the output of the offset circuit 916 into the analog reference signal $S_{REF}$.

The drive circuit 920 includes a current output type operational amplifier OP2. The operational amplifier OP2 is a circuit which is obtained by integrating the current driver 922 and the feedback circuit 924 of FIG. 43 and the output current $I_{DR}V$ is adjusted so that an error of the feedback signal $S_{FB}$ and the reference signal $S_{REF}$ becomes zero.

The correlation detector 930 includes a low pass filter 932, an A/D converter 934, an offset circuit 936, a gain circuit 938, a multiplier 960, a multiplier 962, a filter 964, and a calculator 966. The low pass filter 932 is an anti-aliasing filter and removes an unnecessary component of a frequency band (½ times or more a sampling frequency) from the second detection signal $S_{DET}$. The A/D converter 934 converts the output of the low pass filter 932 into a digital value of the detection signal $D_{DET}$. The offset circuit 936 subtracts an offset OFS2 from the detection signal $D_{DET}$. The gain circuit 938 multiplies the output of the offset circuit 936 by a gain. The multipliers 960 and 962 multiply the output of the gain circuit 938 by the cosine wave cos $\omega_0$t and the sine wave sin $\omega_0$t. The filter 964 extracts DC components α and β of the outputs of the multipliers 960 and 962. The calculator 966 calculates $\sqrt{(\alpha^2+\beta^2)}$ and outputs a result as the position detection signal $P_{DET}$. $\sqrt{(\alpha^2+\beta^2)}$ indicates the amplitude component A(z).

According to the person skilled in the art, it is understood that the configuration of the control circuit 900 is not limited one of FIG. 46.

Modified Example 1

For example, the control circuit 900 may be mounted on a full analog circuit.

Modified Example 2

For the drive circuit 920, the current driver 922 may be configured as a digital current DAC and the current driver 922 may be configured as a digital feedback controller.

A preferred embodiment of the pin arrangement of the control circuit 900 and the light emitting and receiving device 810 and the layout of the position detection system 800 will be described.

Figure 47:
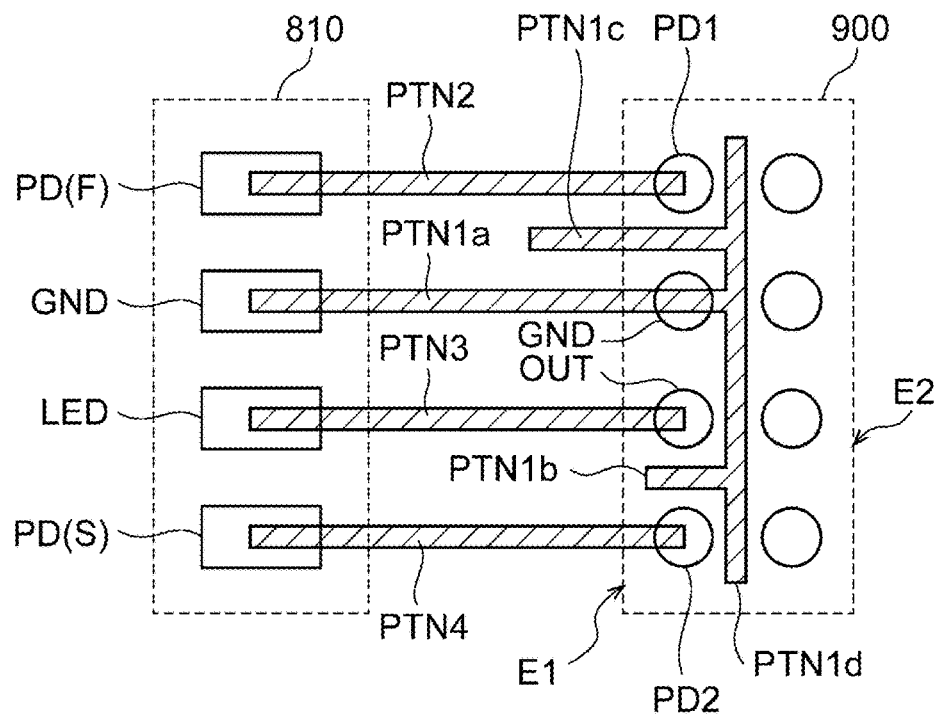
FIG. 47 is a diagram illustrating a pin arrangement of the control circuit and the light emitting and receiving device according to an embodiment.

FIG. 47 is a diagram illustrating a pin arrangement of the light emitting and receiving device 810 and the control circuit 900 according to an embodiment.

The pin arrangement of the light emitting and receiving device 810 will be described. The first light receiving element PD1 directly receives light emitted from the light emitting element 812, but the second light receiving element PD2 receives the reflected light of the object OBJ. For that reason, it can be said that the signal strength of the second detection signal $I_{PD2}$ generated by the second light receiving element PD2 is weak and the noise resistance of the PD(S) pin is low. Thus, it is desirable to reduce noise entering the PD(S) pin. In particular, it is effective to minimize the coupling between the first detection current $I_{PD1}$ and the second detection current $I_{PD2}$.

For the pin arrangement of the light emitting and receiving device 810, a GND pin is inserted between PD(F) and PD(S). Further, an LED pin is inserted between the PD(F) pin and the PD(S) pin and the PD(F) pin is most separated from the PD(S) pin.

The control circuit 900 is an eight pin package and the control circuit 900 and the light emitting and receiving device 810 are disposed so that the long sides are parallel to each other. Then, PD1, GND, OUT, and PD2 to be connected to PD(F), GND, LED, and PD(S) pins of the light emitting and receiving device 810 are arranged along one side E1 facing the light emitting and receiving device 810 during amounting operation. Accordingly, it is possible to shorten a wiring distance between the corresponding pins.

A communication pin with a host processor or a power supply pin VCC can be allocated to the other side E2 of the control circuit 900. For example, in the case of an I²C (Inter IC) interface, the communication pin includes a clock (SCL) pin and a data (SDA) pin.

The control circuit 900 and the light emitting and receiving device 810 are mounted on a printed board. In the drawings, PTN1 to PTN4 illustrate wiring patterns on the printed board. The ground pattern PTN1 is a ground pattern and includes a first portion PTN1*a* which connects a GND pin of the control circuit 900 to a GND pin of the light emitting and receiving device 810.

The pattern PTN2 connects the PD(F) pin of the light emitting and receiving device 810 to the PD1 pin of the control circuit 900. The pattern PTN3 connects the LED pin of the light emitting and receiving device 810 to the OUT pin of the control circuit 900. The pattern PTN4 connects the PD(S) pin of the light emitting and receiving device 810 to the PD2 pin of the control circuit 900.

The ground pattern PTN1 includes a second portion PTN1*b* which separates the OUT pin and the PD2 pin. Further, the ground pattern PTN1 includes a third portion PTN1*c* which separates the GND pin and the PD1 pin. Further, the ground pattern PTN1 includes a fourth portion PTN1*d* which separates a pin group (PD1, GND, OUT, PD2) following a long side E1 and a pin group following a long side E2. Accordingly, since it is possible to prevent an undesirable cross-talk, it is possible to improve the S/N ratio.

Figure 48:
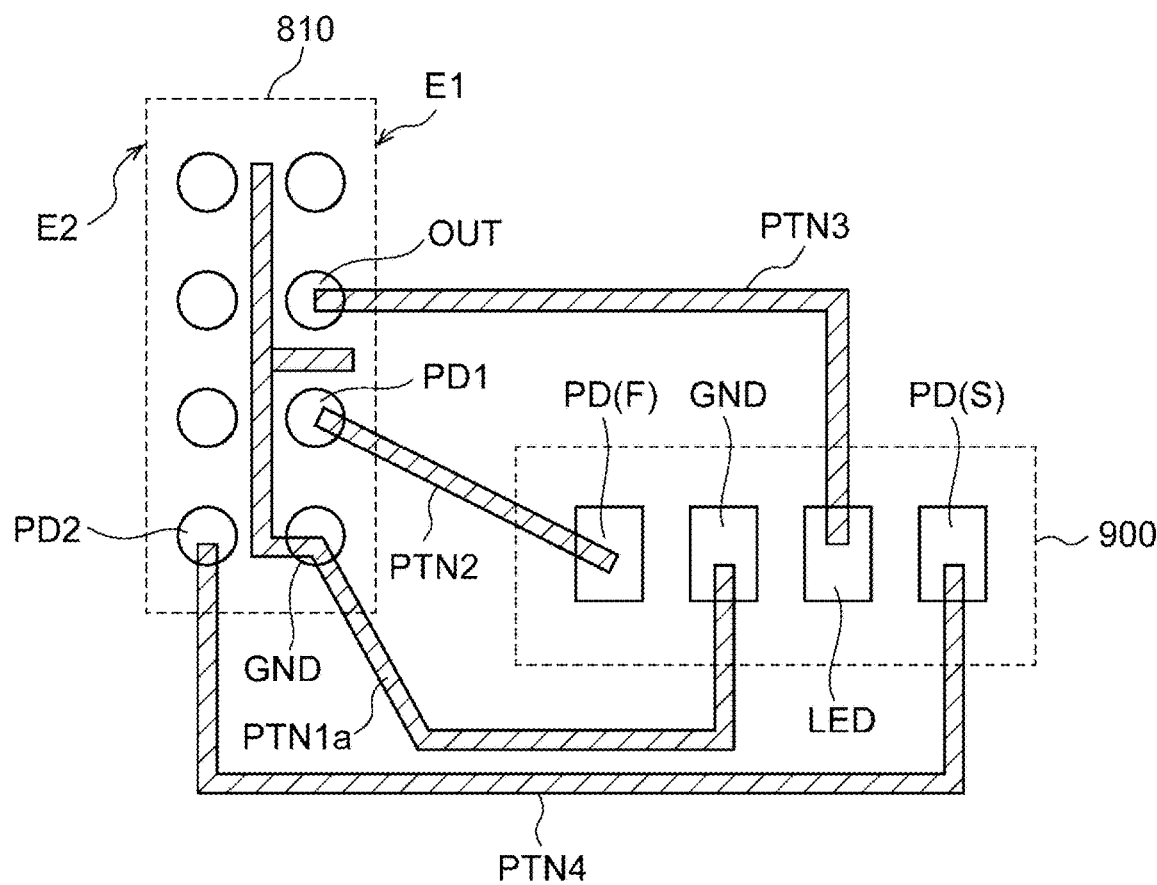
FIG. 48 is a diagram illustrating a pin arrangement of the control circuit and the light emitting and receiving device according to an embodiment.

FIG. 48 is a diagram illustrating a pin arrangement of the light emitting and receiving device 810 and the control circuit 900 according to an embodiment. The pin arrangement of the light emitting and receiving device 810 is the same as that of FIG. 47. In the control circuit 900, the PD1 pin and the PD2 pin are provided on different long sides E1 and E2. In this example, the OUT, PD1, and GND pins are provided along the first long side E1 and the other pins including the PD2 pin are provided along the second long side E2. Similarly to FIG. 47, the ground pattern PTN1 includes a portion PTN1*d* which separates a pin group along the first side E1 and a pin group along the second side E2. Accordingly, it is possible to prevent noise from entering the PD2 pin.

Further, since the pattern PTN4 through which a weak current signal $I_{PD2}$ propagates and the pattern PTN2 (PTN3) through which the current signal $I_{PD1}$ (or $I_{DRV}$) causing noise propagates are separated from each other by the first portion PTN1*a* of the ground pattern PTN1, it is possible to improve the S/N ratio.

Figure 49:
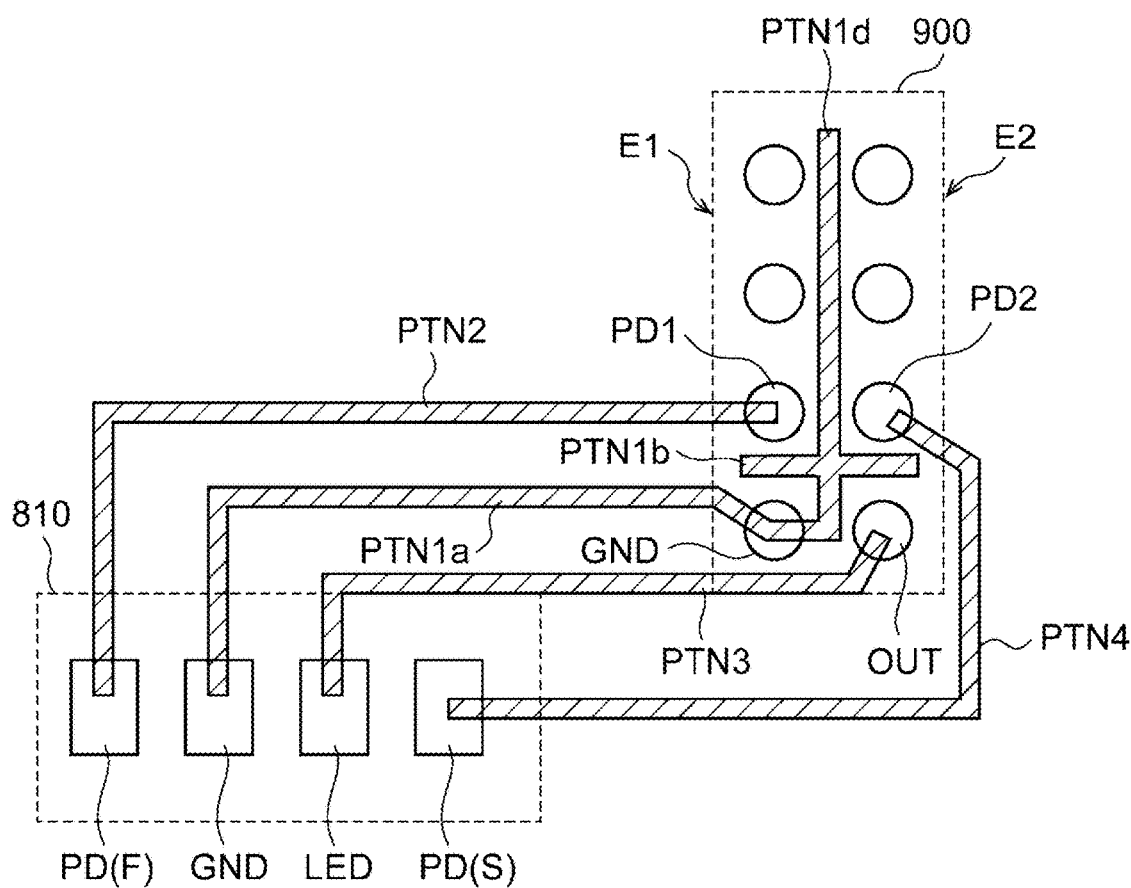
FIG. 49 is a diagram illustrating a pin arrangement of the control circuit and the light emitting and receiving device according to an embodiment.

FIG. 49 is a diagram illustrating a pin arrangement of the light emitting and receiving device 810 and the control circuit 900 according to an embodiment. The pin arrangement of the light emitting and receiving device 810 is the same as that of FIG. 47. Also in the embodiment, the PD1 pin and the PD2 pin are provided on different long sides E1 and E2. In this example, the PD1 and GND pins are provided along the first long side E1 and the PD2 pin and the OUT pin are provided along the second long side E2. Similarly to FIG. 48, the ground pattern PTN1 includes a portion PTN1*d* which separates the pin group along the first side E1 and the pin group along the second side E2. Accordingly, it is possible to prevent noise from entering the PD2 pin.

Further, the ground pattern PTN1 includes a portion PTN1*b* which separates the PD2 pin and the OUT pin. Accordingly, since it is possible to shield noise from the OUT pin through which the drive signal $I_{DR}V$ flows to the PD2 pin, it is possible to improve the S/N ratio.

Application

Figure 50:
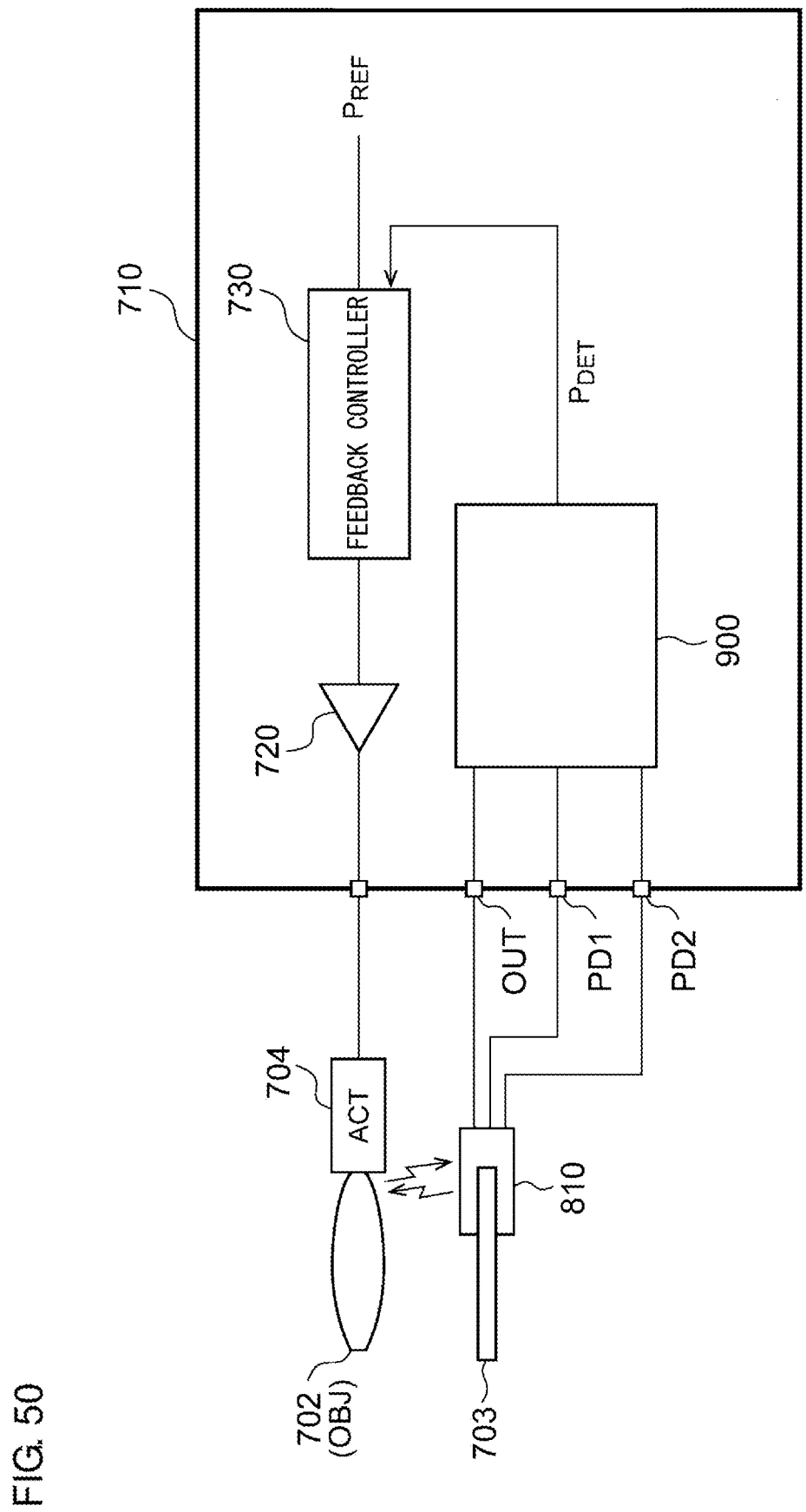
FIG. 50 is a block diagram of a position determination system.

An application of the position detection system 800 will be described. The position detection system 800 can be used in a position determination system. FIG. 50 is a block diagram of a position determination system 700. For example, the position determination system 700 is mounted on an electronic device attached with a camera and can be used to position a lens 702. The lens 702 is provided on an incident optical path to the image sensor 703.

The position determination system 700 includes the lens 702 which is an object OBJ, an actuator 704 which positions the lens 702, and an actuator driver 710 which controls the actuator 704.

The lens 702 corresponding to the positioning target may be an AF lens. In this case, the actuator driver 710 positions the lens 702 in the z axis direction. The position detection system 800 including the light emitting and receiving device 810 and the control circuit 900 detects the position of the lens 702 in the z axis direction.

The lens 702 may be a shake correction lens. In this case, the actuator driver 710 positions the lens 702 in the x axis direction (or the y axis direction). The position detection system 800 including the light emitting and receiving device 810 and the control circuit 900 detects the position of the lens 702 in the x axis direction (or the y axis direction).

The actuator driver 710 includes a drive circuit 720, a feedback controller 730, and the above-described control circuit 900. The control circuit 900 generates a position detection signal $P_{DET}$ indicating the position of the lens 702. The actuator driver 710 receives a signal $P_{REF}$ indicating the target position of the lens 702 from an external processor. The feedback controller 730 generates a drive control signal so that an error of the position detection signal $P_{DET}$ and the position target signal $P_{REF}$ becomes zero. The drive circuit 720 supplies a drive current corresponding to the drive control signal to the actuator 704.

In a conventional AF system or OIS (Optical Image Stabilizer) system, since magnetic means was used to detect the position of the lens 702, a weak magnetic signal was used and hence there was a problem that the S/N ratio was low and the influence of non-uniformity easily occurred. As an alternative, it is possible to rapidly and accurately detect the position of the lens 702 and to increase a control speed for AF or OIS by using the position detection system 800 according to the embodiment.

Further, the application of the position detection system 800 is not limited to the lens positioning operation.

APPENDIX 1

A light emitting and receiving device including:

a base material;

a conductive portion formed on the base material;

a first element mounted on the base material and emits light;

a second element mounted on the base material and structured to receive light emitted from the first element; and a sealing resin structured to cover the first element and the second element, light emitted from the first element being transmitted through the sealing resin, in which the first element and the second element are disposed to be separated from each other in a first direction perpendicular to a thickness direction of the base material, and the light emitting and receiving device includes a third element disposed at the side opposite to the second element with the first element interposed therebetween in the first direction and structured to receive light from the first element, and a light shielding layer formed in a coated portion overlapping the third element when viewed from the thickness direction in the sealing resin and formed of a material with transmittance for light lower than that of the sealing resin.

APPENDIX 2

The light emitting and receiving device according to Appendix 1,
in which the light shielding layer overlaps the entire third element when viewed from the thickness direction.

APPENDIX 3

The light emitting and receiving device according to Appendix 1 or 2,
in which the coated portion is a flat surface.

APPENDIX 4

The light emitting and receiving device according to any one of Appendixes 1 to 3,
in which the conductive portion includes a third die bonding portion on which the third element is mounted, and
in which the light shielding layer overlaps the third die bonding portion when viewed from the thickness direction.

APPENDIX 5

The light emitting and receiving device according to any one of Appendixes 1 to 4,
in which the sealing resin includes a light emitting portion structured to emit light from the first element and a first portion located at a boundary on the side of the light emitting portion in the coated portion.

APPENDIX 6

The light emitting and receiving device according to Appendix 5,
in which the light shielding layer includes an edge matching the first portion.

APPENDIX 7

The light emitting and receiving device according to Appendix 6,
in which the light shielding layer includes a curved surface connected to the edge and has a convex shape.

APPENDIX 8

The light emitting and receiving device according to any one of Appendixes 5 to 7,
in which the first portion includes a first corner portion formed by a boundary of a surface in which an angle formed by each other exceeds 180°.

APPENDIX 9

The light emitting and receiving device according to Appendix 8,
in which the first portion includes the first corner portions.

APPENDIX 10

The light emitting and receiving device according to Appendix 1,
in which the sealing resin includes a light emitting portion structured to emit light from the first element, a light incident portion structured to cause light to be incident to the second element, and a second portion located between the light emitting portion and the light incident portion, reflectivity of light from the inside of the second portion being lower than that of the light emitting portion.

APPENDIX 11

The light emitting and receiving device according to Appendix 10,
in which the conductive portion includes a first die bonding portion on which the first element is mounted and a second bonding portion on which the second element is mounted, and
in which the second portion overlaps any one of the first die bonding portion and the second bonding portion when viewed from the thickness direction.

APPENDIX 12

The light emitting and receiving device according to Appendix 11,
in which the second portion overlaps both of the first die bonding portion and the second bonding portion when viewed from the thickness direction.

APPENDIX 13

The light emitting and receiving device according to any one of Appendixes 10 to 12, further including:
a second wire connected to the second element,
in which the conductive portion includes a wire bonding portion to which the second wire is bonded, and
in which the second portion overlaps the second wire when viewed from the thickness direction.

APPENDIX 14

The light emitting and receiving device according to Appendix 13,
in which the second portion overlaps the wire bonding portion when viewed from the thickness direction.

APPENDIX 15

The light emitting and receiving device according to any one of Appendixes 10 to 14,
in which the second portion has a groove shape which is recessed in the thickness direction from the light emitting portion and the light incident portion.

APPENDIX 16

The light emitting and receiving device according to any one of Appendixes 10 to 15,
in which the second portion is a surface which is rougher than the light emitting portion and the light incident portion.

APPENDIX 17

The light emitting and receiving device according to any one of Appendixes 10 to 16,
in which the second portion reaches both ends of the sealing resin in a second direction perpendicular to the thickness direction and the first direction.

While the preferred embodiments of the present invention have been described using specific terms, such description is for illustrative purposes only, and it is to be understood that changes and variations may be made without departing from the spirit or scope of the appended claims.

What is claimed is:

1. A light emitting and receiving device comprising:
   a base material;
   a conductive portion formed on the base material;
   a first element mounted on the base material and emits light;
   a second element mounted on the base material and structured to receive light emitted from the first element; and
   a sealing resin structured to cover the first element and the second element, light emitted from the first element being transmitted through the sealing resin,
   wherein the first element and the second element are disposed to be separated from each other in a first direction perpendicular to a thickness direction of the base material, and
   the light emitting and receiving device includes a third element disposed at the side opposite to the second element with the first element interposed therebetween in the first direction and structured to receive light from the first element, and a light shielding layer formed in a coated portion overlapping the third element when viewed from the thickness direction in the sealing resin and formed of a material with transmittance for light lower than that of the sealing resin.

2. The light emitting and receiving device according to claim 1, wherein the light shielding layer overlaps the entire third element when viewed from the thickness direction.

3. The light emitting and receiving device according to claim 1, wherein the coated portion is a flat surface.

4. The light emitting and receiving device according to claim 1, wherein the conductive portion includes a third die bonding portion on which the third element is mounted, and wherein the light shielding layer overlaps the third die bonding portion when viewed from the thickness direction.

5. The light emitting and receiving device according to claim 1, wherein the sealing resin includes a light emitting portion structured to emit light from the first element and a first portion located at a boundary on the side of the light emitting portion in the coated portion.

6. The light emitting and receiving device according to claim 1, wherein the light shielding layer includes an edge matching the first portion.

7. The light emitting and receiving device according to claim 6, wherein the light shielding layer includes a curved surface connected to the edge and has a convex shape.

8. The light emitting and receiving device according to claim 5, wherein the first portion includes a first corner portion formed by a boundary of a surface wherein an angle formed by each other exceeds 180°.

9. The light emitting and receiving device according to claim 8, wherein the first portion includes the first corner portions.

10. The light emitting and receiving device according to claim 1, wherein the sealing resin includes a light emitting portion structured to emit light from the first element, a light incident portion structured to cause light to be incident to the second element, and a second portion located between the light emitting portion and the light incident portion, reflectivity of light from the inside of the second portion being lower than that of the light emitting portion.

11. The light emitting and receiving device according to claim 10, wherein the conductive portion includes a first die bonding portion on which the first element is mounted and a second bonding portion on which the second element is mounted, and wherein the second portion overlaps any one of the first die bonding portion and the second bonding portion when viewed from the thickness direction.

12. The light emitting and receiving device according to claim 11, wherein the second portion overlaps both of the first die bonding portion and the second bonding portion when viewed from the thickness direction.

13. The light emitting and receiving device according to claim 10, further comprising:
   a second wire connected to the second element,
      wherein the conductive portion includes a wire bonding portion to which the second wire is bonded, and
      wherein the second portion overlaps the second wire when viewed from the thickness direction.

14. The light emitting and receiving device according to claim 13, wherein the second portion overlaps the wire bonding portion when viewed from the thickness direction.

15. The light emitting and receiving device according to claim 10, wherein the second portion has a groove shape which is recessed in the thickness direction from the light emitting portion and the light incident portion.

16. The light emitting and receiving device according to claim 10, wherein the second portion is a surface which is rougher than the light emitting portion and the light incident portion.

17. The light emitting and receiving device according to claim 10, wherein the second portion reaches both ends of the sealing resin in a second direction perpendicular to the thickness direction and the first direction.

* * * * *